US012590991B2

(12) United States Patent　　　　　(10) Patent No.:　US 12,590,991 B2
Zeinah et al.　　　　　　　　　　　　 (45) Date of Patent:　Mar. 31, 2026

(54) OPTO-ELECTRICAL PROBE CARD PLATFORM FOR WAFER-LEVEL TESTING OF OPTICAL MEMS STRUCTURES

(71) Applicant: Si-Ware Systems, Cairo (EG)

(72) Inventors: Tarek Mohamed Zeinah, Cairo (EG); Bassem Mortada, Cairo (EG); Momen Anwar, Cairo (EG); Mohamed Ramadan, El Gharbia (EG); Mohamed Hamouda, Cairo (EG); Yasser M. Sabry, Cairo (EG); Diaa Khalil, Cairo (EG); Ahmed Shebl, Cairo (EG); Bassam Saadany, Cairo (EG); Ahmed Emad, Qalyubia (EG); Mohamed Elsayed, Obour City (EG); Moez ElMassry, Giza (EG)

( * ) Notice: Subject to any disclaimer, the term of this patent is extended or adjusted under 35 U.S.C. 154(b) by 283 days.

(21) Appl. No.: 18/204,853

(22) Filed: Jun. 1, 2023

(65) Prior Publication Data

US 2023/0393173 A1　　　Dec. 7, 2023

Related U.S. Application Data

(60) Provisional application No. 63/348,341, filed on Jun. 2, 2022.

(51) Int. Cl.
　　*G01R 1/073*　　　(2006.01)
　　*G01R 1/02*　　　(2006.01)
　　　　　　(Continued)
(52) U.S. Cl.
　　CPC ........ *G01R 1/07342* (2013.01); *G06T 7/0004* (2013.01); *G06T 7/73* (2017.01); *G06T 2207/30148* (2013.01); *G08B 21/182* (2013.01)

(58) Field of Classification Search
CPC . G01R 1/02; G01R 1/04; G01R 1/067; G01R 1/073; G01R 31/26; G01R 31/28; G01R 31/302; G01R 31/311; G01R 19/00
See application file for complete search history.

(56) References Cited

U.S. PATENT DOCUMENTS 5,412,329 A　*　5/1995　Iino ..................... G01R 1/0735
　　　　　　　　　　　　　　　　　　　　324/750.18
5,631,571 A　　　5/1997　Spaziani et al.
　　　　　　　(Continued)

OTHER PUBLICATIONS

Miura Toru et al: "Wafer-level inspection platform on high-vol. photonic integrated circuits for drastic reduction of testing time", SPIE Proceedings; [Proceedings of SPIE ISSN 0277-786X], SPIE, US, vol. 11056, (Jun. 21, 2019), pp. 110562R-110562R.
(Continued)

*Primary Examiner* — Neel D Shah
(74) *Attorney, Agent, or Firm* — Loza & Loza, LLP; Holly L. Rudnick

(57)　　　　　　ABSTRACT

Aspects of the disclosure relate to an apparatus including an opto-electrical probe card platform for wafer-level testing of optical micro-electro-mechanical-systems (MEMS) structures. The probe card platform includes an electrical probe card including alignment needles for aligning with an optical MEMS structure during testing thereof. The probe card platform further includes an optical head configured to direct input light to towards the optical MEMS structure through the electrical probe card and an optical positioner attached to the electrical probe card and configured to align the optical head. The apparatus may further include a camera and a processor configured to process at least one image obtained by the camera and to generate alignment assistance data to assist the optical positioner in aligning the optical head.

35 Claims, 41 Drawing Sheets

(51) Int. Cl.

| | |
|---|---|
| *G01R 1/04* | (2006.01) |
| *G01R 1/067* | (2006.01) |
| *G01R 19/00* | (2006.01) |
| *G01R 31/26* | (2020.01) |
| *G01R 31/28* | (2006.01) |
| *G06T 7/00* | (2017.01) |
| *G06T 7/73* | (2017.01) |
| G08B 21/18 | (2006.01) |

(56) References Cited

U.S. PATENT DOCUMENTS

| | | | |
|---|---|---|---|
| 10,175,295 | B2 | 1/2019 | Ukraintsev et al. |
| 10,782,342 | B2 | 9/2020 | Saadany et al. |
| 2007/0096763 | A1* | 5/2007 | Ehrmann ........... B23K 26/0861 |
| | | | 324/754.03 |
| 2008/0044128 | A1* | 2/2008 | Kish, Jr. ........... G02B 6/12033 |
| | | | 385/14 |
| 2020/0124663 | A1* | 4/2020 | Nieves ................. G01R 31/311 |
| 2021/0199691 | A1 | 7/2021 | Piels et al. |
| 2021/0356519 | A1 | 11/2021 | Soldano et al. |

OTHER PUBLICATIONS

PCT/US2023/024320, Invitation to Pay Additional Fees and, Where Applicable, Protest Fee, Sep. 15, 2023.

* cited by examiner

FC connector
504

Optical fiber
502

DETAIL C
SCALE 10 : 1

Gold coated
fiber tip
506

No gold coating on
this side - light exit

502

X.XX mm

Fiber 602

Fiber chuck 606

FC connector 604

Fiber entry

608

602

606

End cap 612

610

606

612

602

SECTION C-C
SCALE 120

902

Wide Key Slot
908

904

Narrow Key
906

904

904

Optical Fiber 1902

Cross Mark Fiducial on MEMS device layer 1908

Electrical Needle 1910

Alignment Needle 1904

1906

Optical fiber 1906

1902

1900

Alignment probes 1904

Fiber - Light exit 2408

2406

2402

2400

Stopper

Alignment cross mark 2406

2616

Control and Testing SW

2608

Positioner

2606

2604

Probe Card 2602

Electrical Needle 2622

Fiber 2610

MEMS Substrate

2612

2618

2620

2614

2600

| 1.489 | 2.437 | 1.867 |
| 1.410 | 0.516 | 2.009 |
| 1.863 | 2.471 | 2.577 |

OPTO-ELECTRICAL PROBE CARD PLATFORM FOR WAFER-LEVEL TESTING OF OPTICAL MEMS STRUCTURES

PRIORITY CLAIM

This application claims priority to and the benefit of Provisional Application No. 63/348,341, filed in the U.S. Patent and Trademark Office on Jun. 2, 2022, the entire content of which is incorporated herein by reference as if fully set forth below in its entirety and for all applicable purposes.

TECHNICAL FIELD

The technology discussed below relates generally to probe cards used to perform on-wafer testing of dies, and in particular to probe cards for on-wafer testing of optical micro-electro-mechanical systems (MEMS) structures.

BACKGROUND

Optical micro-electro-mechanical-systems (MEMS) devices fabricated using deep reactive ion etching and lithography processes are characterized by having self-aligned optical components, enabling the realization of new functions and features of photonic devices as it allows the integration of different components using a simple lithographic process.

Probe cards are devices used to perform screening and testing for dies on the wafer level. Prior to such wafer testing techniques, screening and testing was done on the die level, after the wafer is diced into separate dies, and then these dies were assembled to be tested one by one. This adds extra cost and time on the production line of any semiconductor device, given that each wafer contains hundreds or thousands of dies. Therefore, on-wafer screening helps to reduce testing time as well as the assembly cost and throughput. For example, electrical probe cards are widely used by semiconductor manufacturers to characterize thousands of chips or dies at the wafer level. Commercially available electrical probe cards typically include vertical metallic needles that are designed to make contact with the dies at specific locations to supply input electrical signals to the devices under test on the dies and then probe out the output signals.

For optical MEMS wafers, screening should be done for both the electrical signals and the optical signals. As such, opto-electrical probe cards have been developed to characterize and test the functionality and the performance of these devices on the wafer level. For example, opto-electrical probe cards have been used to test photodiodes on the wafer level, in which the light beam is injected vertically via a fiber coil and at the same time the electronic probe senses the output electrical signal from the photodiode under test. The same technique has also been used to characterize an array of light emitting diodes (LEDs) using an array of lenses and an array of optical waveguides. On-wafer micro-mirrors have also been characterized by injecting and receiving the optical light vertically.

SUMMARY

The following presents a summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a form as a prelude to the more detailed description that is presented later.

Various aspects of the disclosure provide an apparatus including an electrical probe card having a plurality of alignment needles configured to align the electrical probe card with an optical micro-electro-mechanical systems (MEMS) structure on a wafer during testing of the optical MEMS structure. The electrical probe card further includes a plurality of electrical needles configured to test the optical MEMS structure. The apparatus further includes an optical head configured to direct input light towards the optical MEMS structure through the electrical probe card, an optical positioner attached to the electrical probe card and configured to align the optical head with an optical input of the optical MEMS structure, a camera configured to obtain at least one image indicating a current alignment of the optical head with the plurality of alignment needles or the optical input of the optical MEMS structure, and a processor configured to process the at least one image and generate alignment assistance data to assist in alignment of the optical head using the optical positioner.

These and other aspects will become more fully understood upon a review of the detailed description, which follows. Other aspects, features, and examples will become apparent to those of ordinary skill in the art upon reviewing the following description of specific exemplary aspects in conjunction with the accompanying figures. While features may be discussed relative to certain examples and figures below, all examples can include one or more of the features discussed herein. In other words, while one or more examples may be discussed as having certain features, one or more of such features may also be used in accordance with the various examples discussed herein. Similarly, while examples may be discussed below as device, system, or method examples, it should be understood that such examples can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

As used herein, the term micro-electro-mechanical-systems (MEMS) refers to an actuator, a sensor, or the integration of sensors, actuators and electronics on a common silicon substrate through microfabrication technology to build a functional system. Microelectronics are typically fabricated using an integrated circuit (IC) process, while the micromechanical components are fabricated using compatible micromachining processes that selectively etch away parts of the silicon wafer or add new structural layers to form the mechanical and electromechanical components. One example of a MEMS element is a micro-optical component having a dielectric or metallized surface working in a reflection or refraction mode. Other examples of MEMS elements include actuators, detector grooves and fiber grooves.

Figure 1:
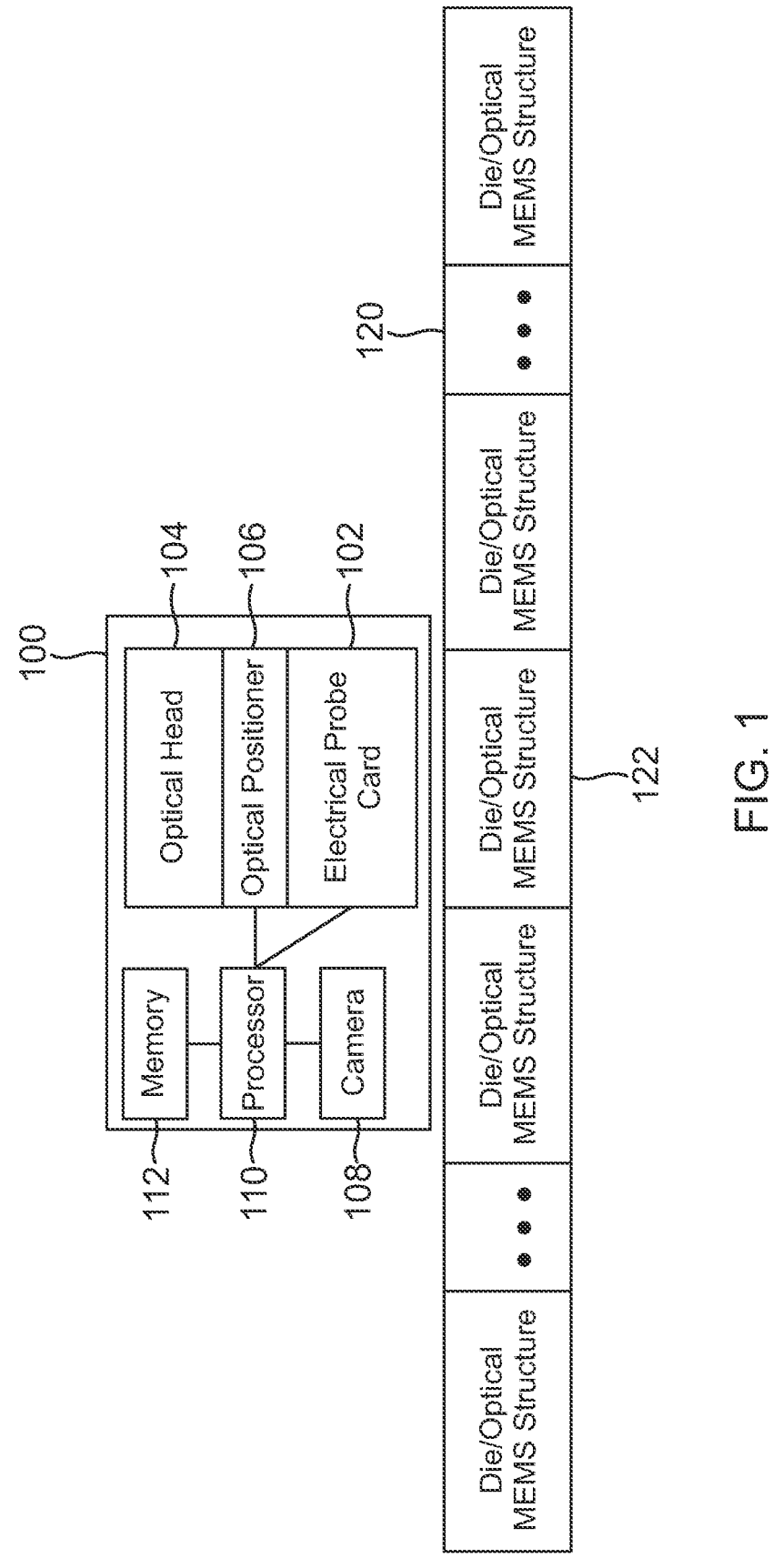
FIG. 1 is a diagram illustrating an example of an apparatus 100 configured for wafer-level testing of optical micro-electro-mechanical systems (MEMS) structures according to some aspects.

FIG. 1 is a diagram illustrating an example of an apparatus 100 configured for wafer-level testing of optical micro-electro-mechanical systems (MEMS) structures according to some aspects. The apparatus 100 may include, for example, an electrical probe card 102, an optical head, an optical positioner 106, a camera 108, a processor 110, and a memory 112. The electrical probe card 102 may include a plurality of alignment needles configured to align the electrical probe card with an optical MEMS structure 122 (e.g., a die containing an optical MEMS structure) on a wafer 120 during wafer-level testing of a plurality of dies/MEMS structures 122 on the wafer 120. As shown in FIG. 1, the wafer 120 includes a plurality of die 122, each having a respective optical MEMS structure fabricated thereon.

The optical head 104 may be configured to direct input light towards the optical MEMS structure 122 through the electrical probe card 102. For example, the electrical probe card 102 may include an opening (e.g., a hole) through which the input light may be directed towards the optical MEMS structure 122. In some examples, the optical head 104 may include an optical fiber. In other examples, the optical head 104 may include free-space optics. The optical positioner 106 (e.g., a micro positioner) may be attached to the electrical probe card and configured to align the optical head 104 with at least one of the plurality of alignment needles on the electrical probe card 102 or an optical input of the optical MEMS structure 122. As used herein, the term optical input refers to a physical input port or structure in the MEMS device or fiducials or reference structures on the MEMS die. In some examples, the optical positioner 106 may have a universal design to be compatible with a wide range of optical MEMS structures 122.

The camera 108 is configured to obtain at least one image indicating a current alignment of the optical head 104 with the plurality of alignment needles or the input of the optical MEMS structure 122. The camera 108 may be, for example, a small, high-resolution camera. The processor 110 is configured to process the at least one image obtained by the camera 108 and to generate alignment assistance data to assist in alignment of the optical head 104 using the optical positioner 106 (e.g., manually or automatically). For example, the processor 110 may be configured to execute alignment software that may be stored, for example, in memory 112 to facilitate alignment of the optical head 104 with different types of optical MEMS structures.

Examples of processors 110 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. The memory 112 may include, for example, a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a processor 110. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software, when executed by the processor 110, causes the processor 110 to perform the various functions described below for the apparatus 100. The memory 112 may also be used for storing data that is utilized by the processor 110 when executing software.

Figure 41:
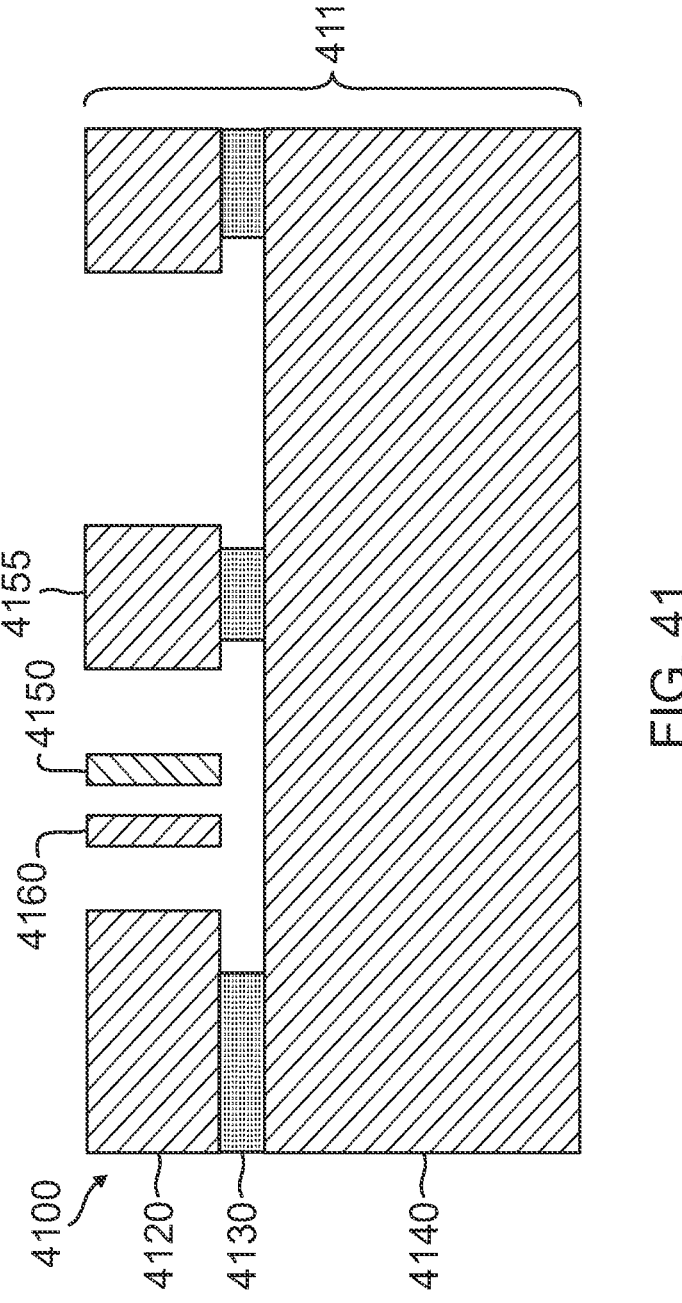
FIG. 41 is a diagram illustrating an example of an optical MEMS structure that may be fabricated on a wafer according to some aspects.

An example of an optical MEMS structure that may be fabricated on a wafer is shown in FIG. 41. The optical MEMS structure 4100 shown in FIG. 1 may be, for example, an interferometer fabricated in a semiconductor substrate 4110 of the wafer. The semiconductor substrate 4110 may be, for example, a silicon-on-insulator (SOI) wafer that includes a device layer 4120, a handle layer 4140, and a buried oxide (BOX) layer 130 sandwiched between the device layer 4120 and the handle layer 4140. Various components of the MEMS interferometer, such as mirrors 4150 and 4155, a MEMS actuator 4160, and other optical components may be defined using a single lithographic step and etched in the device layer 4120 using a highly anisotropic process until the etch stop (BOX) layer 4130 is reached. Any moveable parts, such as a moveable mirror 150 and the MEMS actuator 4160 may be released by selectively removing the BOX layer 4130 underneath the moveable parts. In some examples, the MEMS actuator 4160 may be an electrostatic actuator formed of a comb drive and spring. For example, by applying a voltage to the comb drive, a potential difference results across the actuator 4160, which induces a capacitance therein, causing a driving force to be generated as well as a restoring force from the spring, thereby causing a displacement of a moveable mirror (e.g., mirror 4150).

In some examples, the MEMS interferometer may be fabricated using a Deep Reactive Ion Etching (DRIE) process in order to produce the micro-optical components and other MEMS elements that are able to process free-space optical beams propagating parallel to the SOI substrate. In an example, the electro-mechanical designs may be printed on masks and the masks may be used to pattern the design over the silicon or SOI wafer by photolithography. The patterns may then be etched (e.g., by DRIE) using batch processes, and the resulting chips (e.g., MEMS chip/die) may be diced and packaged (e.g., attached to a PCB).

Figure 2:
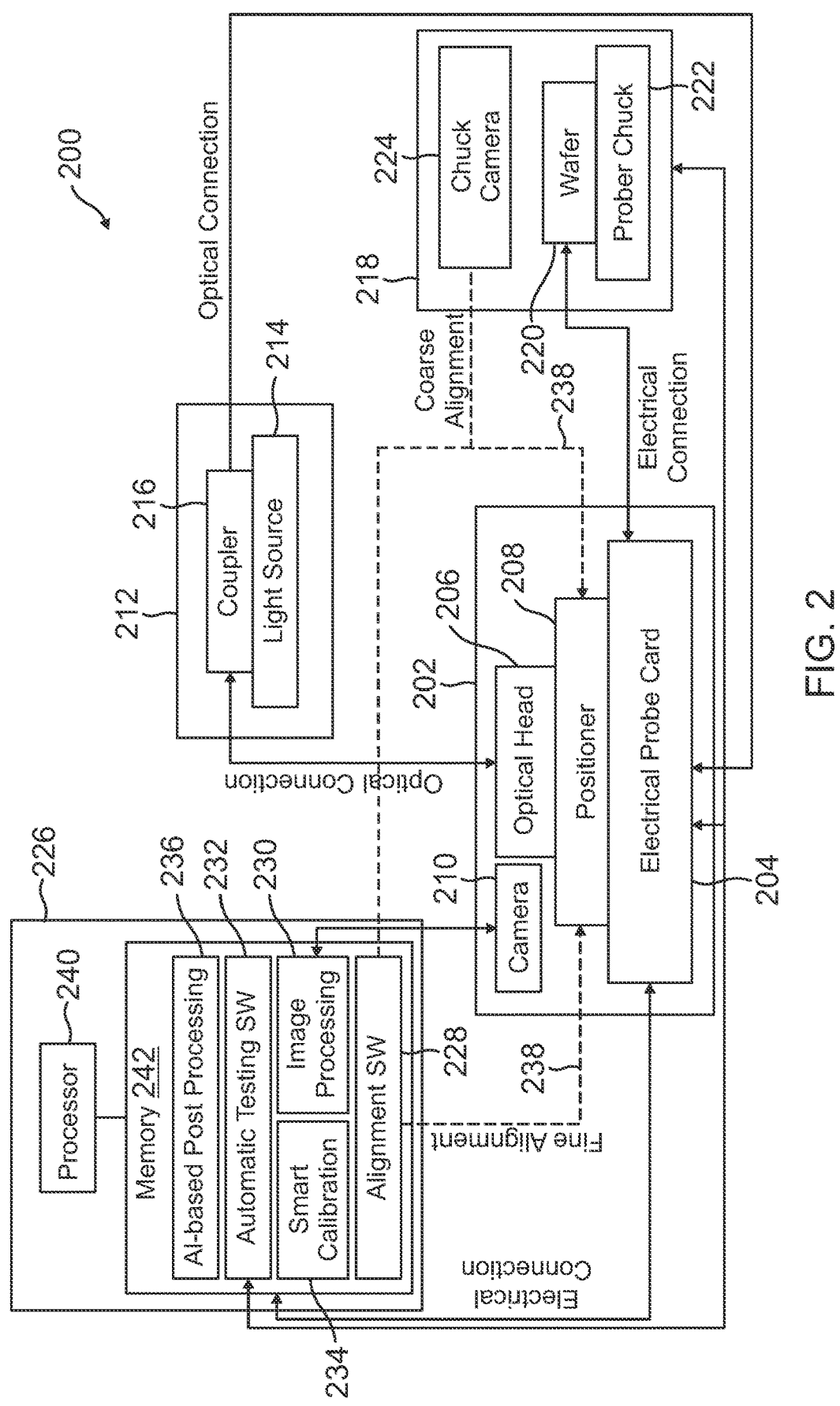
FIG. 2 illustrates another example of an apparatus configured for wafer-level testing of optical MEMS structures according to some aspects of the disclosure.

FIG. 2 illustrates another example of an apparatus configured for wafer-level testing of optical MEMS structures according to some aspects of the disclosure. The apparatus 200 includes a probe card platform 202, an illumination module 212, a prober device 218, and a computing device 226 (e.g., a personal computer (PC) or other suitable computing device). The prober device 218 includes a prober (wafer) chuck 222 configured to fix a wafer 220 during testing (probing) thereof. In some examples, the wafer chuck 222 may be configured to load/unload the wafer 220 and to hold the wafer 220 in place by applying a vacuum to the backside of the wafer 220.

The probe card platform 202 includes an electrical probe card 204, an optical head 206 (e.g., an optical fiber), an optical positioner 208, and a camera 210. The electrical probe card 204 includes a plurality of electrical needles (probes) for facilitating an electrical connection with an optical MEMS structure on a die on the wafer 220 during testing thereof. In addition, the electrical probe card 204 may further include a plurality of alignment needles (probes) used to align the electrical probe card 204 with corresponding alignment marks/fiducials on the optical MEMS structure under test. The electrical probe card 204 may further include control and detection electronics, including, for example, a photodetector configured to receive output light from the optical MEMS structure under test.

In some examples, the optical head 206 may include a 45-degree cleaved multimode optical fiber. In other examples, the optical head 206 may include a circular, elliptical or rectangular optical fiber. In still other examples, the optical head 206 may include free-space micro-optics. The optical positioner 208 may be configured to align the optical head 206 with at least one of the plurality of alignment needles or an optical input of an optical MEMS structure (e.g., die) on the wafer 220. In some examples, the optical positioner 208 may be configured with x, y, z, and theta-z (θ) degrees of freedom. The theta-z degree of freedom corresponds to rotation of the optical fiber around the optical axis of the optical fiber. The optical positioner 208 may be configured to be manually adjusted for manual alignment of the optical head 206 with the optical MEMS structure or may be automatically adjusted for automatic alignment of the optical head 206 with the optical MEMS structure. The optical positioner 208 may be automatically adjusted with, for example, micromotors, piezo actuators, etc. In some examples, an orientation of the optical positioner 208 can be designed to be aligned with an optical axis of the optical MEMS device/structure under test for easier alignment of the optical head (e.g., optical fiber) 206. The camera 210 may include, for example, a small, high-resolution camera used for alignment of the optical head 206.

The illumination module 212 may include, for example, a light source 214 and an optical coupler 216. The light source 214 may include a broadband light source or narrow-band light source. For example, the light source 214 may include one or more wideband thermal radiation sources or a quantum source with an array of light emitting devices that cover a wavelength of interest. In an example, input light from the light source 214 may be coupled via the optical coupler 216 to the optical head 206. The input light may then be coupled from the optical head 206 to the optical MEMS structure under test. In some examples, output light from the optical MEMS structure under test may further be directed to a photodetector on the electrical probe card 204 via the optical head (e.g., an optical fiber) and the optical coupler 216.

In some examples, an optical axis of the optical MEMS chip may be parallel to the substrate of the wafer 220 and the surface of the electrical probe card 204 such that the input light propagates in-plane with respect to the substrate. As used herein, the term "in-plane" refers to a propagation direction of light that is parallel to the wafer substrate 220. Similarly, "out-of-plane" refers to a propagation direction of light that is perpendicular to the wafer substrate 220.

The computing device 226 may correspond to a personal computer, server, handheld device (e.g., cell phone or tablet), cloud-based device, or any other suitable computing device. The computing device 226 may include a processor 240 and a memory 242. The processor 240 may be configured to execute software (instructions) stored within the memory 242. For example, the memory 242 may include alignment software 228, image processing software 230, automatic testing software 232, smart calibration software 234 and artificial intelligence (AI)-based processing software 236. The image processing software 230 when executed by the processor 240 may be configured process one or more images obtained by the camera 210 to enable fine alignment of the optical head 206 with the optical input of the optical MEMS structure on the wafer 220. In some examples, the prober device 218 may also include an optional camera (e.g., a chuck camera) 224 configured to obtain one or more images that may be processed by the image processing software 230 to enable coarse alignment of the optical head 206 with the plurality of alignment needles on the electrical probe card 204. In some examples, the apparatus 200 may include both the chuck camera 224 and the camera 210 for both coarse and fine alignment. In other examples, the apparatus 200 may include only one camera (e.g., either the chuck camera 224 or the camera 210).

The alignment software 228, when executed by the processor 240 may be configured for electrical probe card 204 to wafer 220 alignment at the start of a new probing session. In some examples, the electrical probe card 204 to wafer 220 alignment may be performed based on images obtained by the prober (chuck) camera 224 (e.g., a prober backside camera). The alignment software 228 may further be configured to generate alignment assistance data 238 based on at least the processed image data from camera(s) 210 and/or 224 (e.g., as processed by the image processing software 230). The alignment assistance data 238 may indicate a change in one or more of x, y, z, and θ directions needed to align the optical head 206 with the plurality of alignment needles or the optical input of the optical MEMS structure. The alignment assistance data may be output to the optical positioner 208 or to a display (not shown) to enable automatic or manual coarse and/or fine adjustment in aligning the optical head 206. In some examples, the alignment software 228 may further be configured to process a measured signal from the electrical probe card 204 (e.g., produced by a detector/photodetector on the electrical probe card 204) and to generate the alignment assistance data based on the measured signal and the processed image data. For example, the measured signal may be based on output light produced by interaction of the input light with the optical MEMS structure. The alignment software 228 may compare the measured signal against reference measurement values and determine whether the optical head 206 is accurately aligned based on the comparison and processed image data.

The automatic testing software 232 when executed by the processor 240 may be configured to control the electrical probe card 204 and the prober device 218 and to perform the electrical, mechanical, and optical testing steps of the optical MEMS structure/die under test. The smart calibration software 234 may be configured to calibrate each optical MEMS structure in a fast and accurate manner by performing one or more spectral calibration processes during testing. For example, the smart calibration software 234 may be configured to receive the measured signal (e.g., based on output light produced by interaction of the input light with the optical MEMS structure) and to process the measured signal to calibrate the optical MEMS structure.

The AI-based processing software 236 when executed by the processor 240 may be configured to discern a pass/fail status of the optical MEMS structure and other optical MEMS structures on the wafer 220 based on a machine learning model. For example, the AI-based post processing software 236 may be configured to automatically generate wafer maps of passing dies (optical MEMS structures) per wafer according to pass/fail specifications, excluding the failures. In addition, the AI-based post processing software 236 may be configured to correct fake measurement failures according to AI-based algorithms. In addition, machine learning models can be built based on previously produced dies/chips that have been integrated into production units and achieved the desired performance. The machine learning models may be applied by the AI-based post processing software 236 to decide on pass/fail. The AI-based post processing software 236 may further be configured to detect outlier dies or regions on the wafers. In addition, various probing errors can be corrected making use of nearest neighbor correction algorithms Other AI-based post processing algorithms may further be applied to correct the wafer maps making use of a golden wafer measurement being done during the probing session. AI-based post processing can also include extraction of the thermal drift behavior of the optical MEMS chip analyzing two probing measurements done at two different temperatures.

In some examples, the AI-based processing software 236 may further be used for alignment of an optical fiber of the optical head 206 using the multimode optical fiber itself. For example, the photodetector on the electrical probe card 204 may be replaced with a charge coupled device (CCD) camera and suitable optics to record a back-reflected pattern of the optical fiber. An AI model may then be built to construct a mapping matrix between the captured pattern and the MEMS features that relate to that pattern. In some examples, an operator may identify the optimal position of the optical fiber relative to the MEMS feature. In other examples, the AI model may be extended to recognize the optimal position without human intervention if patterns from many dies (MEMS structures) at the optical fiber's optimal position are collected and fed to the AI model.

Figure 3:
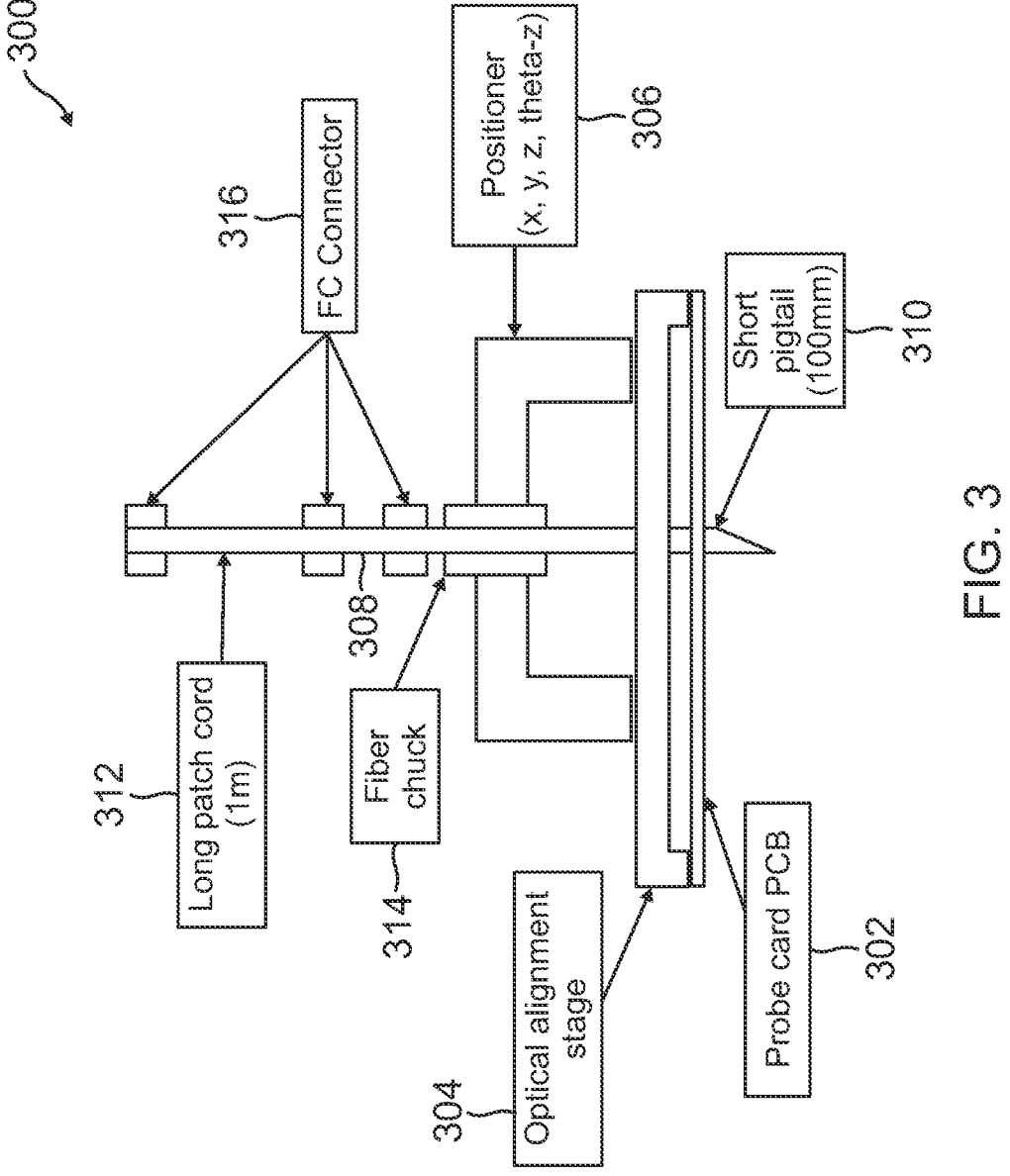
FIG. 3 is a diagram illustrating an example of a probe card platform configured for wafer-level testing of optical MEMS structures according to some aspects.

FIG. 3 is a diagram illustrating an example of a probe card platform configured for wafer-level testing of optical MEMS structures according to some aspects. The probe card platform 300 includes an electrical probe card (e.g., probe card printed circuit board (PCB)) 302, an optical alignment stage 304, an optical positioner 306, and an optical fiber 308. The probe card PCB 302 includes the alignment needles/probes and the electrical needles/probes, as described above. The optical alignment stage 304 is attached to the electrical probe card 302 and is configured to support the optomechanical components of the optical positioner 306 above the electrical probe card 302 and to connect the optical positioner 306 to the probe card PCB 302. The optical positioner 306 is configured to hold the optical fiber 308 and enable coarse/fine adjustment of the fiber position with respect to the measured optical MEMS structure. The probe card platform 300 further includes a fiber chuck 314 acting as a mechanical interface for the optical fiber 308. The fiber chuck 314 is configured to fix the optical fiber 308 rigidly in place, connect the optical fiber 308 to the optical positioner 306, and to protect the optical fiber 308 from damage.

In the example shown in FIG. 3, the optical fiber 308 includes two fibers, a short pigtail fiber 310 (e.g., 100 nm fiber) and a detachable long patch cord 312 (e.g., 1 m fiber). The short pigtail fiber 310 is mounted on the optical positioner 306 through the fiber chuck 314 and is configured to direct input light to an optical MEMS structure (not shown, for convenience). The fiber chuck 314 is configured to mount the short pigtail fiber 310 on the optical positioner 306. The short pigtail fiber 310 and fiber chuck 314 subassembly can be replaced easily in case of fiber damage. The detachable long patch cord 312 is configured to direct the input light from an external light source to the short pigtail fiber 310 (e.g., through an optical coupler). By splitting the optical fiber 308 into two parts, the risk of fiber breakage during shipping is reduced. Moreover, fiber/card 308/302 alignment can be performed in one site, while testing using the fiber/card can be performed in another site. The probe card platform 300 further includes fiber-optic (FC) connectors 316 coupled to the fiber chuck 314 and configured to connect the short pigtail fiber 310 with the detachable long patch cord 312 to provide further connections between the long patch cord 2512 and other devices (e.g., optical coupler, etc.).

Figures 4A, 4B:
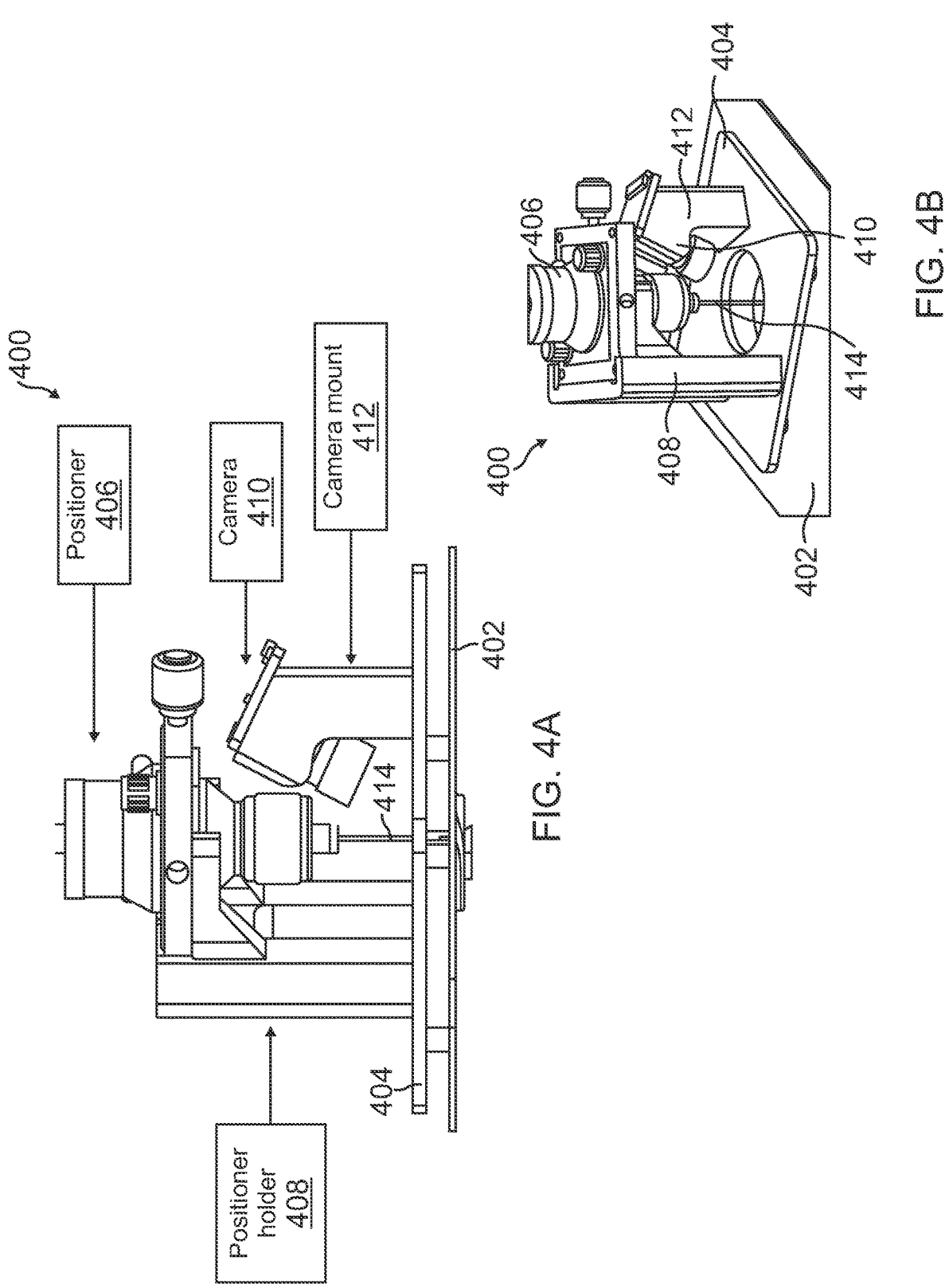
FIGS. 4A and 4B are diagrams illustrating schematic and isometric views of a probe card platform configured for wafer-level testing of optical MEMS structures according to some aspects.

FIGS. 4A and 4B are diagrams illustrating schematic and isometric views of a probe card platform configured for wafer-level testing of optical MEMS structures according to some aspects. The probe card platform 400 includes an electrical probe card (e.g., probe card printed circuit board (PCB)) 402, an optical alignment stage 404, an optical positioner 406, a positioner holder 408, a camera 410, a camera mount 412, and an optical fiber 414. The probe card PCB 402 includes the alignment needles/probes and the electrical needles/probes, as described above. The optical alignment stage 404 is attached to the electrical probe card 402. The optical alignment stage 404 includes the positioner holder 408 configured to support the optical positioner 406 above the electrical probe card 402 and to connect the optical positioner 406 to the probe card PCB 402. The optical positioner 406 is configured to hold the optical fiber 414 and enable coarse/fine adjustment of the fiber position with respect to the measured optical MEMS structure. The camera 410 is shown mounted on the camera mount 412, which is mounted on the optical alignment stage 404. The camera 410 is oriented towards the tip of the optical fiber 414 to obtain one or more images of the optical fiber tip position within the MEMS chip input port (e.g., an optical input of the optical MEMS structure) to enable fine alignment of the optical head (optical fiber) 414 with the optical input of the optical MEMS structure.

Figures 5A, 5B:
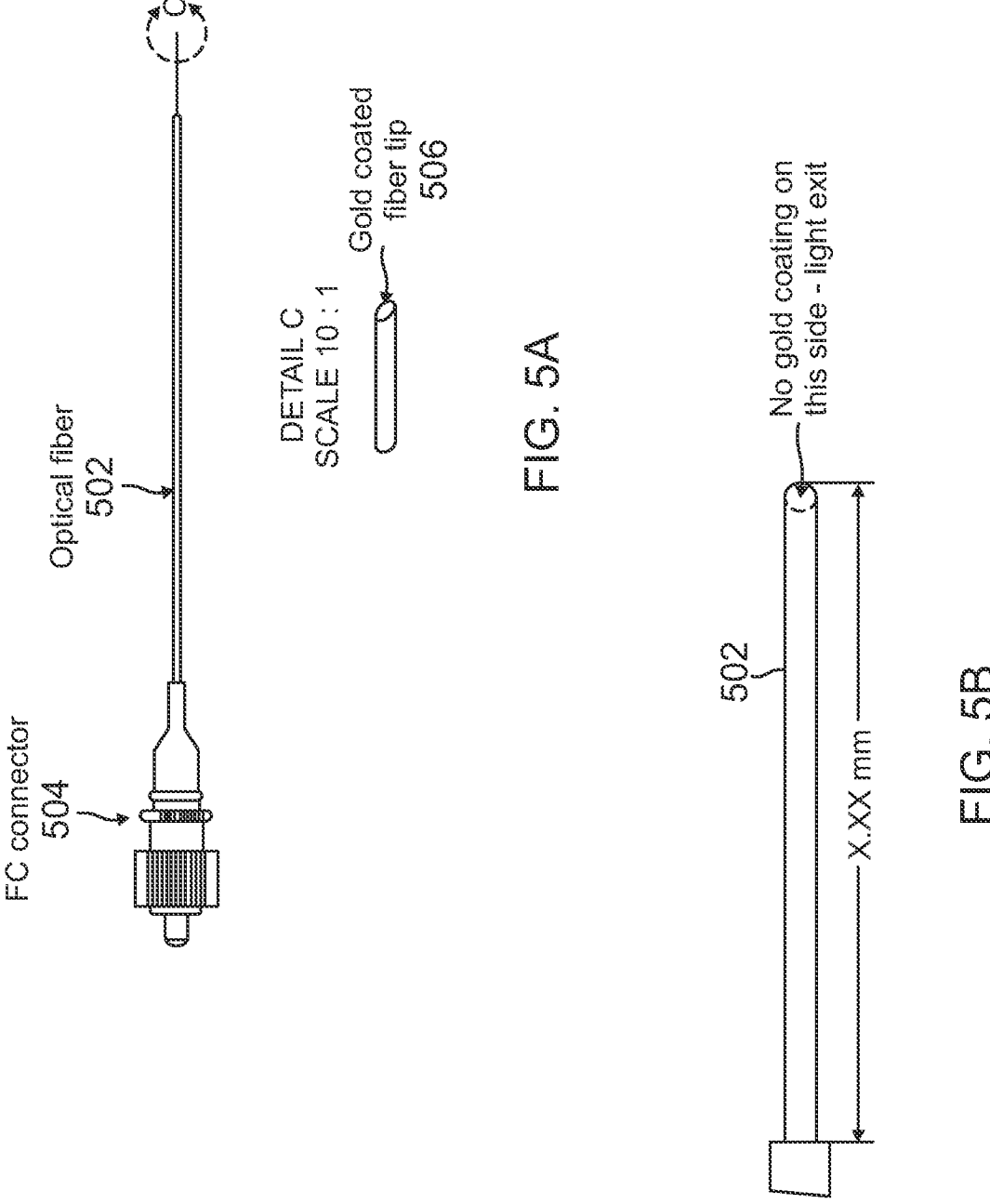
FIGS. 5A and 5B are diagrams illustrating an exemplary optical fiber according to some aspects.

FIGS. 5A and 5B are diagrams illustrating an exemplary optical fiber according to some aspects. The optical fiber 502 shown in FIGS. 5A and 5B may correspond, for example, to the short pigtail fiber shown in FIG. 3. The optical fiber 502 is inserted into an FC connector 504 which is configured to connect the optical fiber 502 with a light source through the patch cord (not shown). A fiber tip 506 of the optical fiber is cleaved at an angle of 45 degrees and gold coated on one side (e.g., the cleaved side). There is no gold coating on the side of the fiber tip 506 that the light exits from. Different fiber lengths (e.g., x.xx mm) may be used to suit different conditions or parameters.

Figures 6A, 6B, 6C:
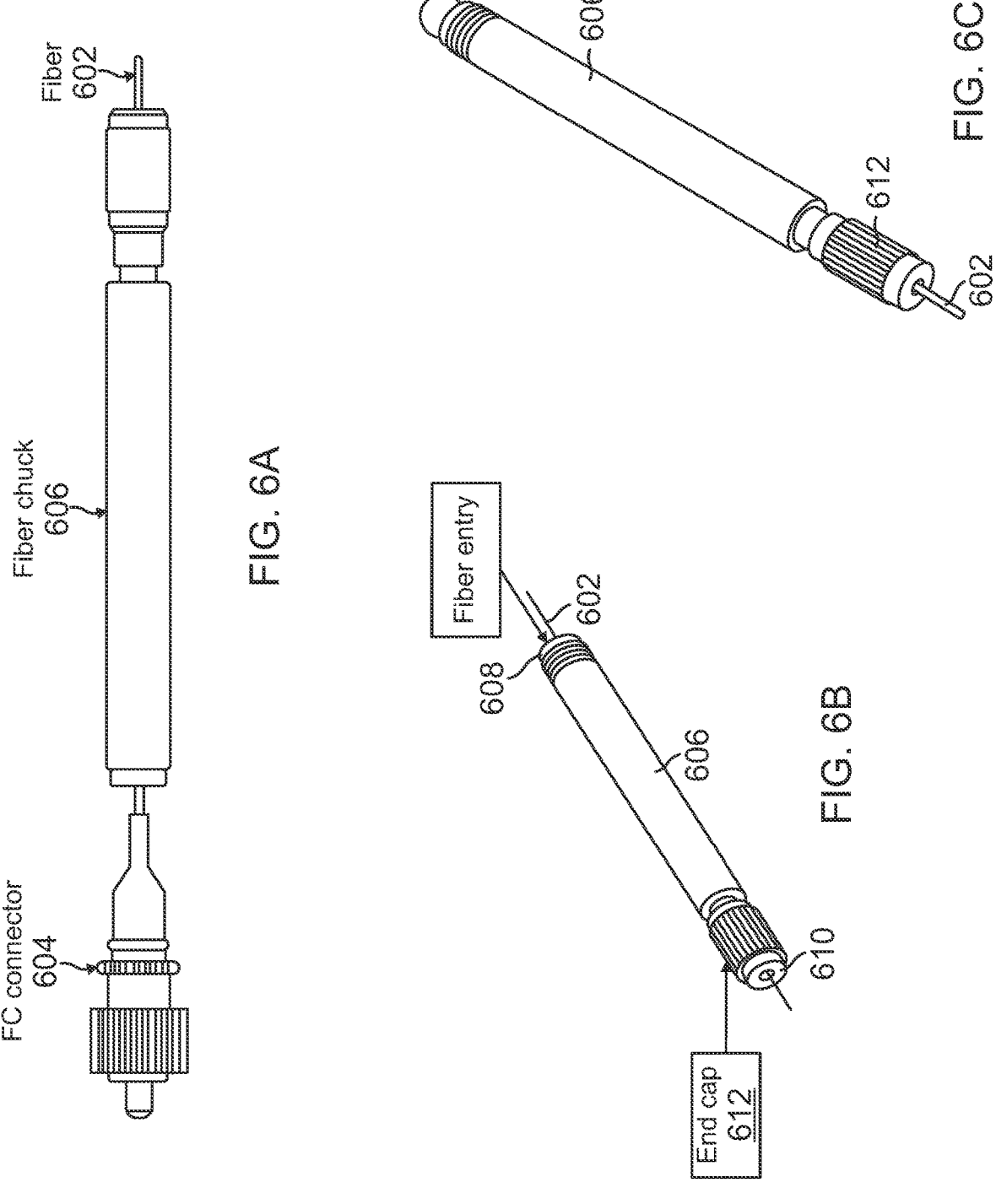
FIGS. 6A-6C are diagrams illustrating examples of fiber chuck designs according to some aspects.

FIGS. 6A-6C and 7A-7C are diagrams illustrating examples of fiber chuck designs according to some aspects. Fiber chucks are a flexible means to hold optical fibers precisely without damage. As can be seen in FIG. 6A, an optical fiber 602 may be inserted into a fiber chuck 606 such that a fiber tip of the optical fiber 602 extends out from the fiber chuck and the opposite end of the optical fiber 602 is inserted into an FC connector 604. In the example shown in FIGS. 6B and 6C, the fiber chuck 606 includes an opening (hole) on a first end 608 thereof and an end cap 612 on a second end 610 thereof. The hole extends from the first end 608 through the second end 610. The optical fiber 602 may be inserted into the fiber chuck 606 from the first end 608 through the second end 610. The end cap 612 may then be rotated to lock the fiber 602 in place (e.g., the short pigtail fiber may be secured via rotation of the end cap 612). In some examples, a precision diameter of the fiber chuck 606 enables a smooth slip fit into the fiber translators. In some examples, the fiber chuck 606 uses a tapered jaw design to securely hold optical fibers in place without damage. For example, the fiber chuck 606 can use a Delrin® two-jaw design that is clamped by the twist of the end cap 612.

Figures 7A, 7B, 7C:
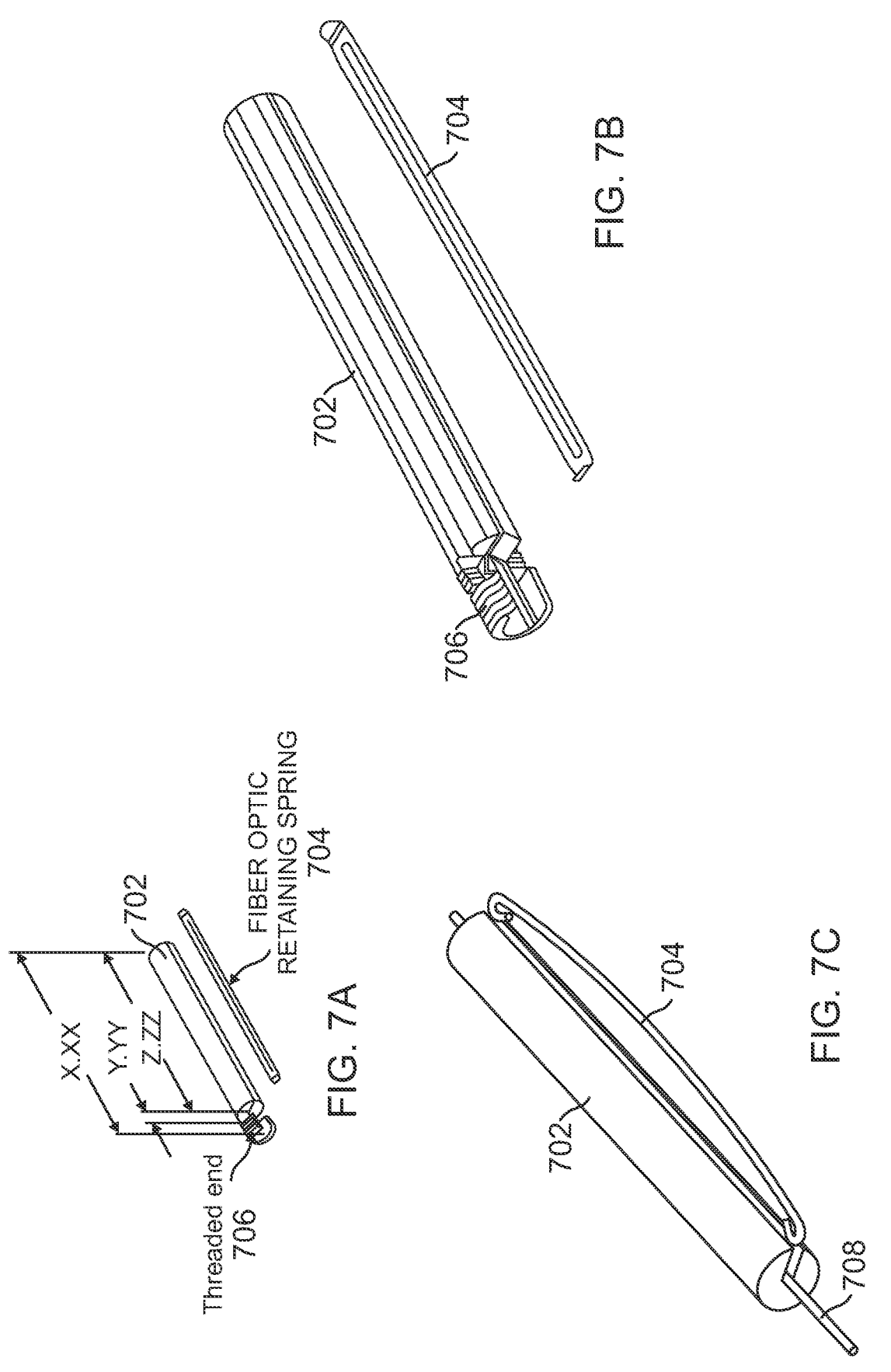
FIGS. 7A-7C are diagrams illustrating examples of fiber chuck designs according to some aspects.

In the example shown in FIGS. 7A-7C, the fiber chuck 702 includes an opening (slot) along a side thereof configured to receive the optical fiber 708. Thus, the optical fiber 708 can be inserted into the fiber chuck 702 through the slot in the fiber chuck 702. The fiber chuck 702 further includes a spring 704 configured to secure the short pigtail fiber. Thus, the optical fiber 708 may be held in place with the spring 704. For example, the spring 704 may be a leaf spring, as shown in FIGS. 7A and 7C, or a bow spring, as shown in FIG. 7C, depending on the fiber size and chuck type.

Figures 8A, 8B:
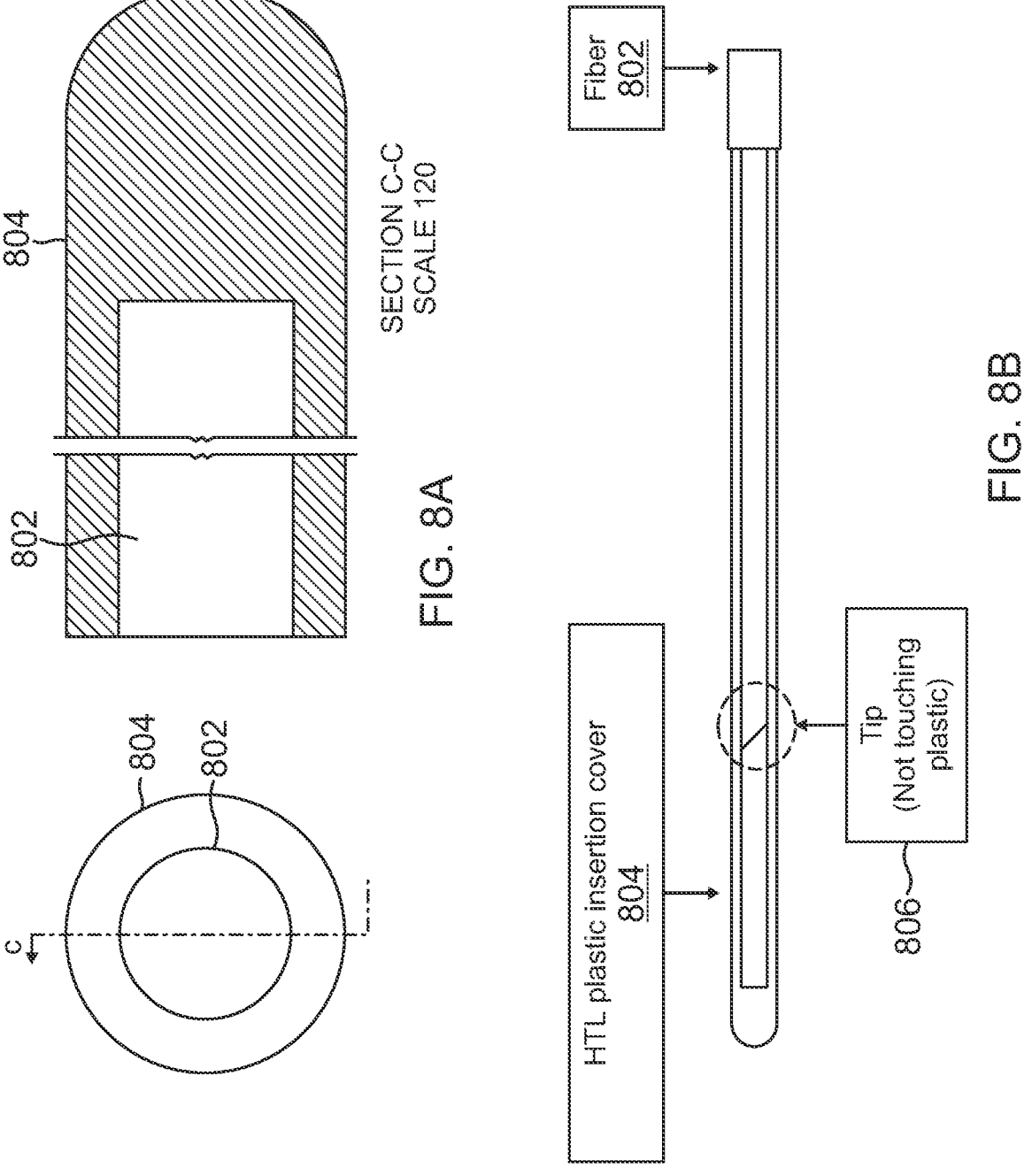
FIGS. 8A and 8B are diagrams illustrating an example of a plastic cover for protecting optical fibers according to some aspects.

FIGS. 8A and 8B are diagrams illustrating an example of a plastic cover for protecting optical fibers according to some aspects. As shown in FIGS. 8A and 8B, a plastic cover 804 may be used to protect a fiber tip 806 of an optical fiber 802 while inserting the optical fiber 802 inside the fiber chuck. In examples in which the optical 802 fiber is inserted through an end of the fiber chuck, as shown in FIGS. 6B and 6C, there could be a risk of scratching the gold coating at the fiber tip 806. Since the fiber tip 806 is sensitive to any slight damage, which can deteriorate the performance of the fiber, the plastic fiber cover 804 can be used to protect the fiber during the insertion process. As such, the plastic cover 804 may be assembled with the short pigtail fiber and configured to protect the short pigtail fiber during insertion in the fiber chuck.

In some examples, the manufacturing of the plastic cover 804 using conventional methods may be challenging due to the small dimensions of the outer and inner diameter of the cover 804 and also the tight tolerances that are required to ensure the cover 804 fits with the fiber 802 and is able to pass through the chuck opening. In some examples, the plastic cover 804 may be manufacture using 3D printing techniques that can achieve the following parameters: 10 um XY resolution printer, at 20 um layer height, Dimensional tolerance +/−25 μm.

Figures 9A, 9B, 9C:
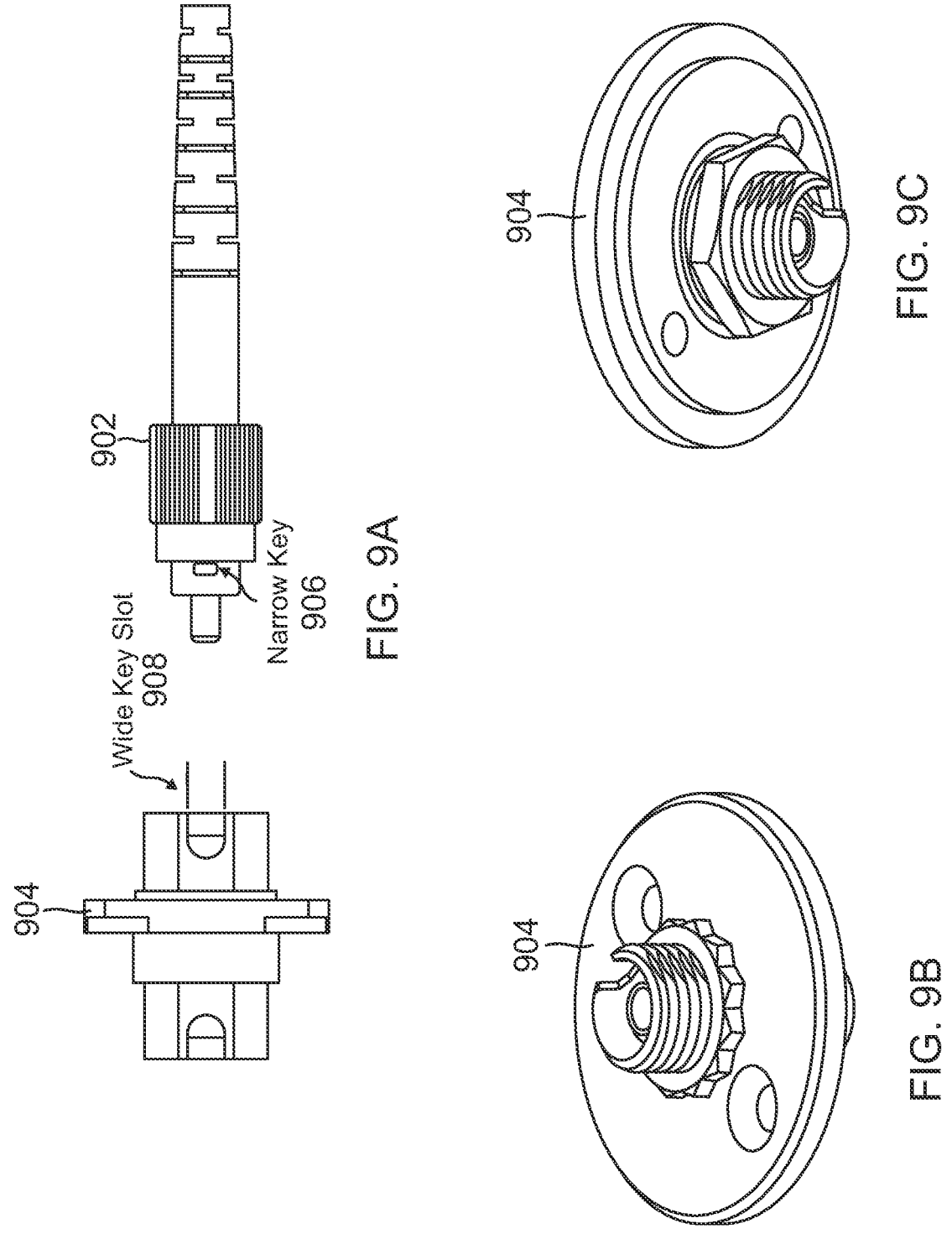
FIGS. 9A-9C are diagrams illustrating an example of a mating sleeve for a two-part optical fiber according to some aspects.

FIGS. 9A-9C are diagrams illustrating an example of a mating sleeve for a two-part optical fiber according to some aspects. In the example shown in FIG. 9A, an FC connector 902 includes a narrow key 906 that can mate with a wide key slot 908 of a mating sleeve 904. The mating sleeve 904 shown in FIGS. 9A-9C may be assembled with the fiber chuck and configured to couple the short pigtail fiber mounted on the electrical probe card with the detachable long patch cord connected to the light source. In some examples, the mating sleeve 904 may be designed for the D-hole of a standard rack-mount panel.

Figures 10A, 10B, 10C, 10D, 10E, 10F:
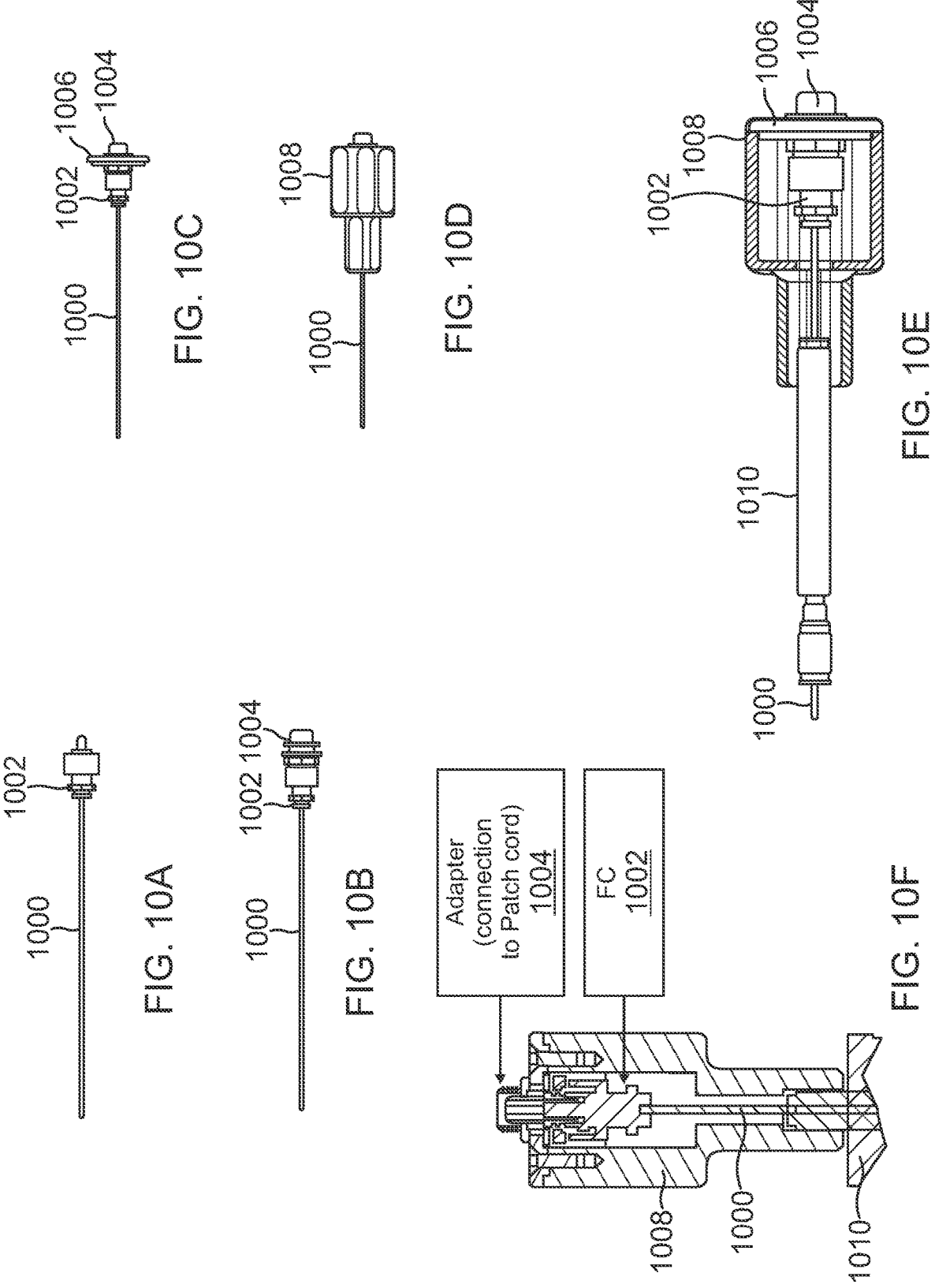
FIGS. 10A-10F are diagrams illustrating example assembly steps of an optical fiber package according to some aspects.

FIGS. 10A-10F are diagrams illustrating example assembly steps of an optical fiber package according to some aspects. As shown in FIG. 10A, an optical fiber 1000 (e.g., a short pigtail fiber) is inserted into an FC connector 1002. In FIG. 10B, an adapter (e.g., mating sleeve) 1004 providing a connection to the patch cord is assembled with the FC connector 1002, and in FIG. 10C, a mount panel 1006 is assembled with the adapter 1004. In FIG. 10D, a chuck-to-adapter sleeve 1008 is assembled with the panel 1006. Finally, as shown in FIG. 10E, the chuck-to-adapter sleeve 1008 is assembled with a fiber chuck 1010. FIG. 10F is a cross-sectional view illustrating the optical fiber package including an FC connector 1002 coupled to the optical fiber 1000 and assembled with the adapter (mating sleeve) 1004, chuck-to-adapter sleeve 1008, and fiber chuck 1010. The assembly steps illustrated in FIGS. 10A-10E facilitate supporting the weight of the FC connector 1002, adapter 1004, and mount panel 1006 to prevent damage to the optical fiber 1000.

Figures 11A, 11B, 11C:
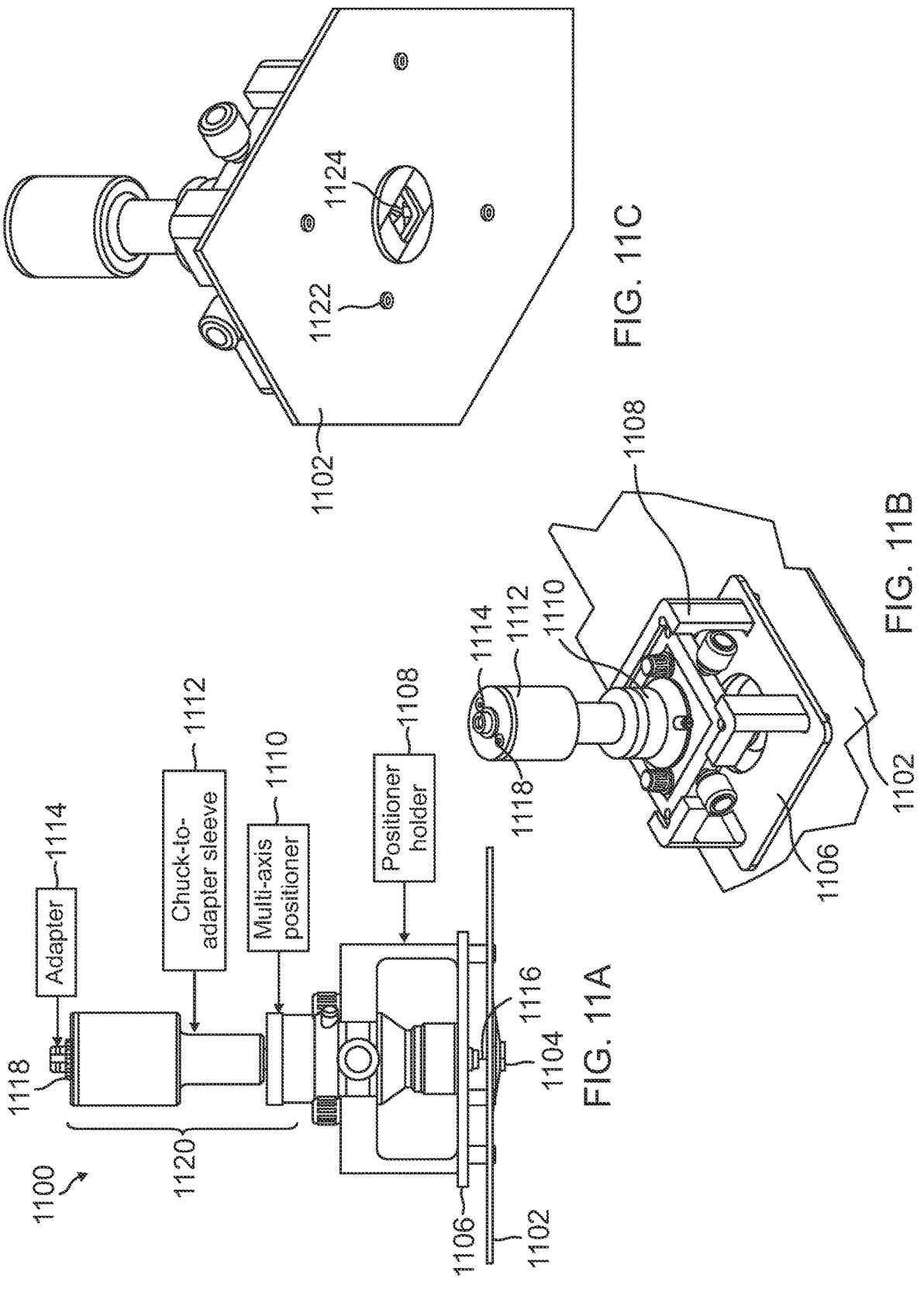
FIGS. 11A-11C are diagrams illustrating an exemplary probe card platform including the optical fiber package shown in FIGS. 10E and 10F according to some aspects.

FIGS. 11A-11C are diagrams illustrating an exemplary probe card platform including the optical fiber package shown in FIGS. 10E and 10F according to some aspects. The probe card platform 1100 includes an electrical probe card (probe card PCB) 1102 having alignment needles and electrical needles thereon for aligning with and testing an optical MEMS structure 1104. The probe card platform 1100 further includes an optical alignment stage 1106 including a positioner holder 1108 configured to support a multi-axis positioner 1110 (e.g., x, y, z, and θ directions). The optical fiber package 1120 includes an adapter 1114 (e.g., mating sleeve) configured to couple a short pigtail fiber 1116 with a patch cord (not shown). The optical fiber package 1120 further includes a chuck-to-adapter sleeve 1112 assembled with a fiber chuck (not shown) extending into the optical positioner 1110 and a mount panel 1118 assembled with the adapter 1114. The optical alignment stage 1106 may be fixedly attached to the electrical probe card 1102 via screws 1122. For example, four mounting holes may be drilled into the electrical probe card 1102 for attachment to the optical alignment stage 1106 with the screws 1122. An opening 1124 in the electrical probe card 1102 facilitates alignment and insertion of the optical fiber 1116 into the optical input of the optical MEMS structure 1104.

Figures 12A, 12B:
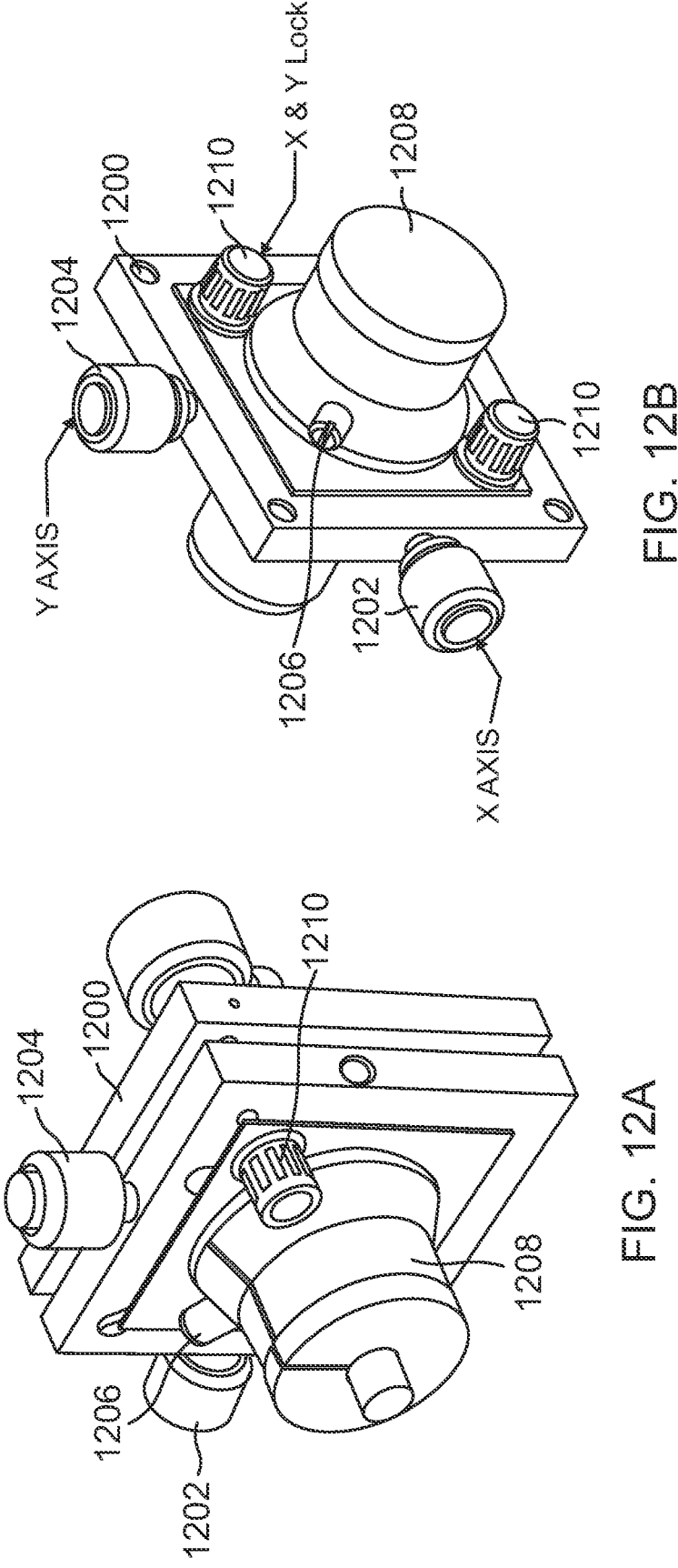
FIGS. 12A and 12B are diagrams illustrating an example of an optical positioner according to some aspects.

FIGS. 12A and 12B are diagrams illustrating an example of an optical positioner according to some aspects. The optical positioner 1200 may include adjustment screws 1202, 1204 and 1206 and adjustment locks 1210 for precise positioning of an optical fiber in the x, y, and z directions. In addition, the optical positioner 1200 may include an adjustment dial 1208 for rotation of the optical fiber (θ) around the optical axis (polarization), which aids in positioning the optical fiber in the optimum position with respect to the die (optical MEMS structure) under test. The travel range per axis is 0.12 inch (3.1 mm) and the minimum controllable motion is 1 μm. The four degrees of freedom (four axes) in the optical positioner 1200 enable the electrical probe card to work with different optical MEMS structure designs. The optical positioner 1200 shown in FIGS. 12A and 12B provides four degrees of freedom (e.g., is movable along four axes). However, in other examples, the optical positioner 1200 may provide additional degrees of freedom (e.g., up to six degrees of freedom).

Figures 13A, 13B, 13C:
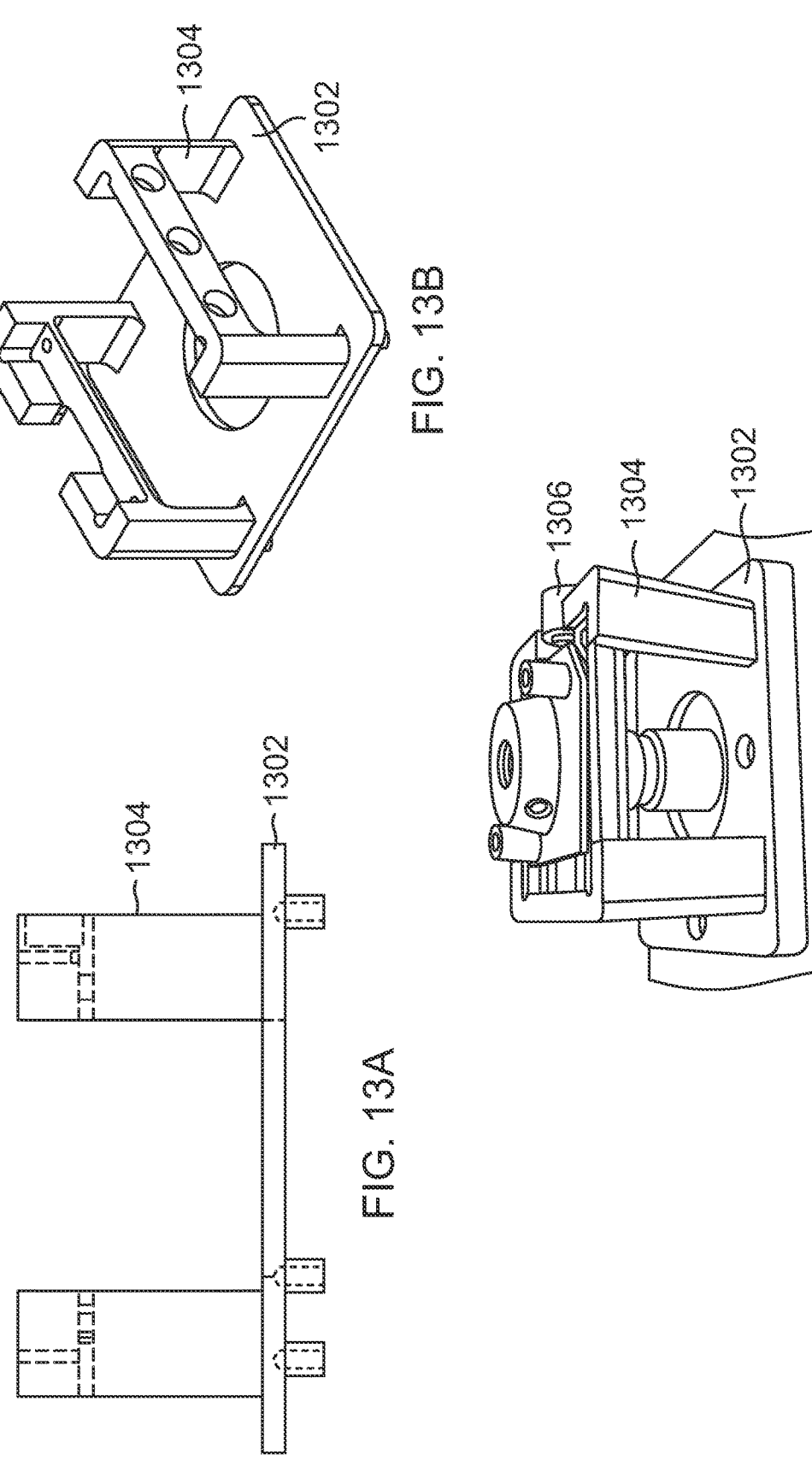
FIGS. 13A-13C are diagrams illustrating an exemplary optical alignment stage assembled with an optical positioner and electrical probe card according to some aspects.

FIGS. 13A-13C are diagrams illustrating an exemplary optical alignment stage assembled with an optical positioner and electrical probe card according to some aspects. The optical alignment stage 1302 includes a positioner holder 1304 configured to hold and support an optical positioner 1306. The optical alignment stage 1302 can be fixedly attached to an electrical probe card 1308 using, for example, screws, as shown in FIG. 11C.

Figure 14A:
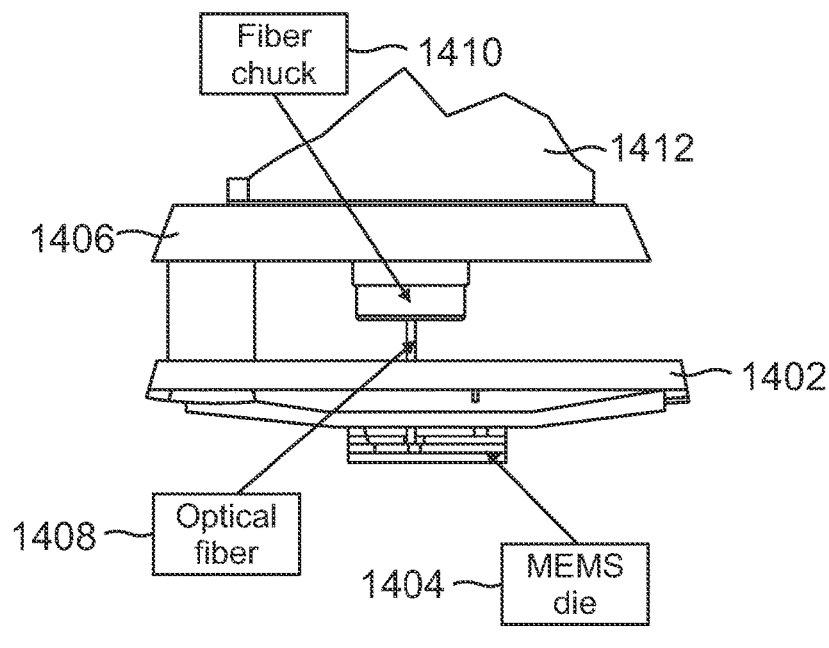
FIG. 14A is a diagram illustrating a side view of the fiber insertion within the optical MEMS structure according to some aspects.

FIG. 14A is a diagram illustrating a side view of the fiber insertion within the optical MEMS structure according to some aspects. As shown in FIG. 14, an electrical probe card 1402 can be positioned over an optical MEMS structure (MEMS die) 1404 for testing thereof. The electrical probe card 1402 includes alignment needles (not shown) for alignment with corresponding alignment marks/fiducials on the optical MEMS structure 1404 under test. The electrical probe card 1402 further includes electrical needles (not shown) for testing of the optical MEMS structure. An alignment stage/positioner holder 1406 is attached to the electrical probe card 1402 to support an optical positioner 1412 configured to align an optical fiber 1408 with the plurality of alignment needles and/or an optical input of the optical MEMS structure 1404. The optical fiber 1408 may include, for example, a short pigtail fiber that is connected to a long patch cord (not shown). The optical fiber 1408 is inserted into a fiber chuck 1410 and fed into the optical positioner 1412 for insertion of the optical fiber through the electrical probe card 1402 and into the optical MEMS structure 1404 at an optical input thereof.

Figure 14B:
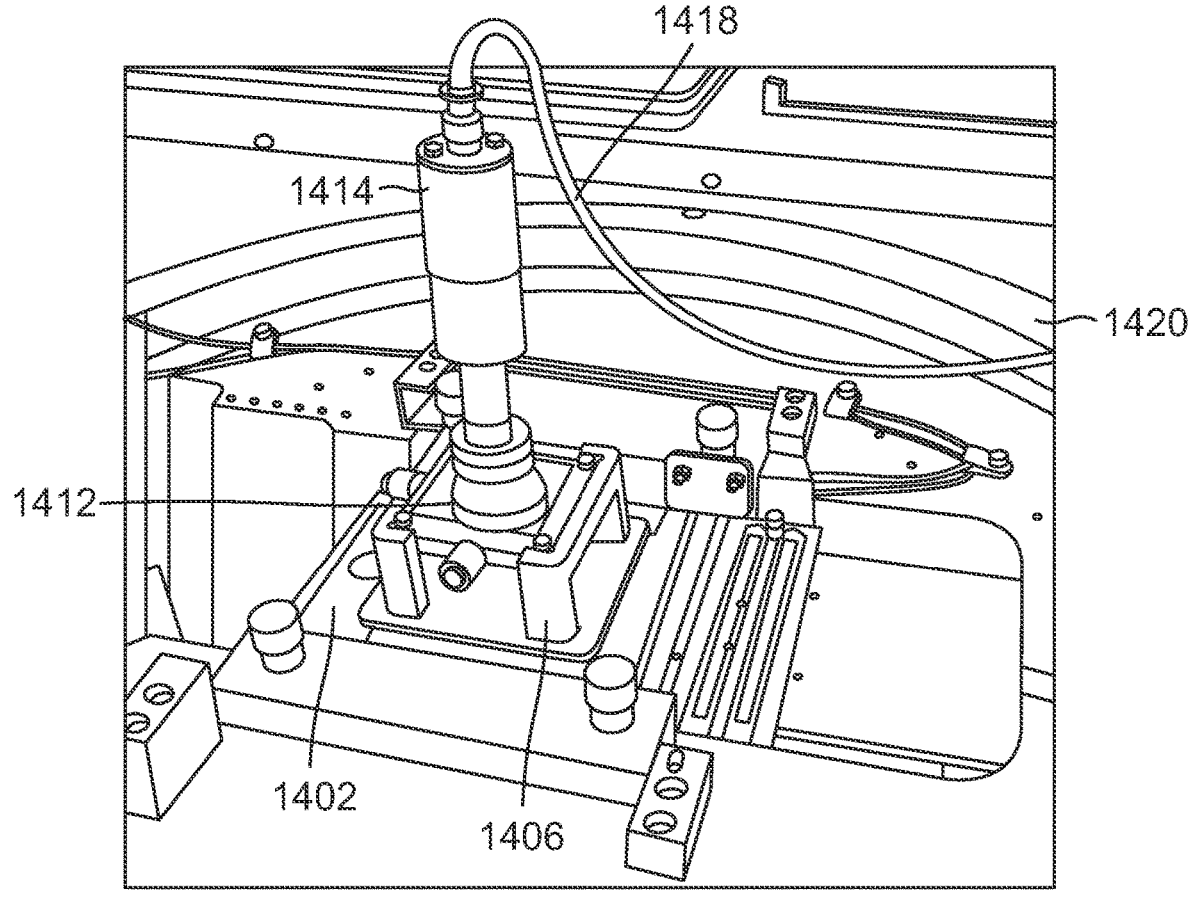
FIG. 14B is a diagram illustrating an example of a probe card platform attached to a prober device according to some aspects.

FIG. 14B is a diagram illustrating an example of a probe card platform attached to a prober device according to some aspects. The probe card platform includes the electrical probe card 1402, optical alignment stage 1406, optical positioner 1412, and chuck-to-adapter sleeve 1414. A long patch cord 1418 is shown attached to the chuck-to-adapter sleeve (e.g., via an adapter assembled therewith). The probe card platform is attached to a prober device 1420 configured for automatic MEMS wafer insertion and removal for wafer testing.

Figure 15:
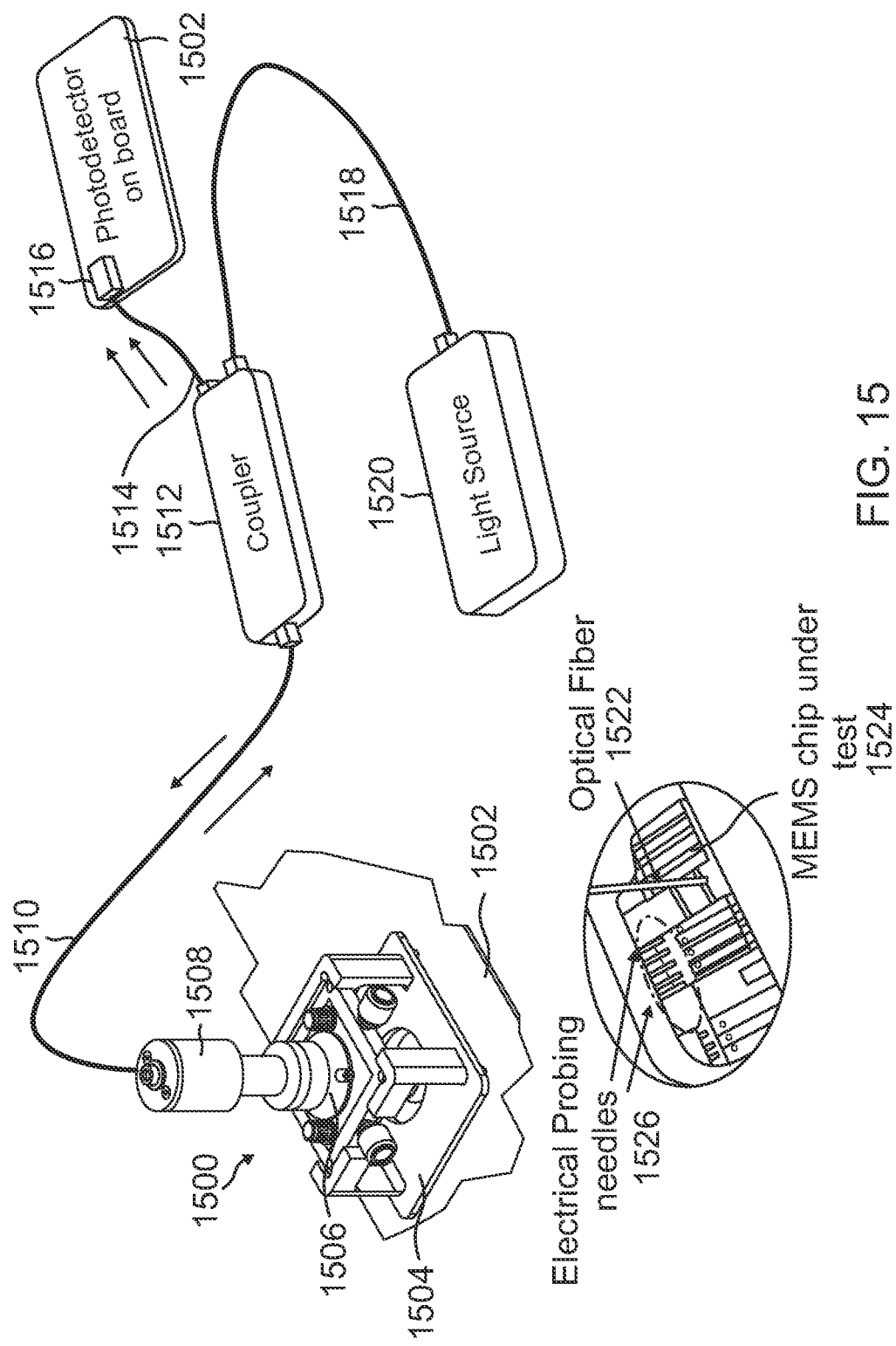
FIG. 15 is a diagram illustrating an example of an apparatus configured for wafer-level testing of optical MEMS structures according to some aspects.

FIG. 15 is a diagram illustrating an example of an apparatus configured for wafer-level testing of optical MEMS structures according to some aspects. The apparatus includes a probe card platform 1500. The probe card platform 1500 includes an electrical probe card 1502, an optical alignment stage 1504 attached to the electrical probe card, an optical positioner 1506 and a chuck-to-adapter sleeve 1508 configured to insert an optical fiber 1522 through the electrical probe card 1502 to an optical input of an optical MEMS structure (MEMS chip) under test 1524. The electrical probe card 1502 further includes electrical probing needles 1526 configured to test the MEMS chip 1524. The optical fiber 1522 may be, for example, a short pigtail fiber that is coupled to a long patch cord 1510 via an adapter 1528 assembled with the chuck-to-adapter sleeve. The long patch cord 1510 is attached to an optical coupler 1512 (e.g., a 50:50 coupler). The optical coupler 1512 is coupled to a light source 1520 via patch cord 1518 and to a photodetector 1516 on the electrical probe card 1502 via patch cord 1514. The optical coupler 1512 is configured to couple white light from a light source 1520 to the MEMS chip 1524 and to couple reflected light back from the MEMS chip 1524 to the photodetector 1516. In some examples, the photodetector 1516 may include, for example, a detector array or a single pixel detector.

Figure 16:
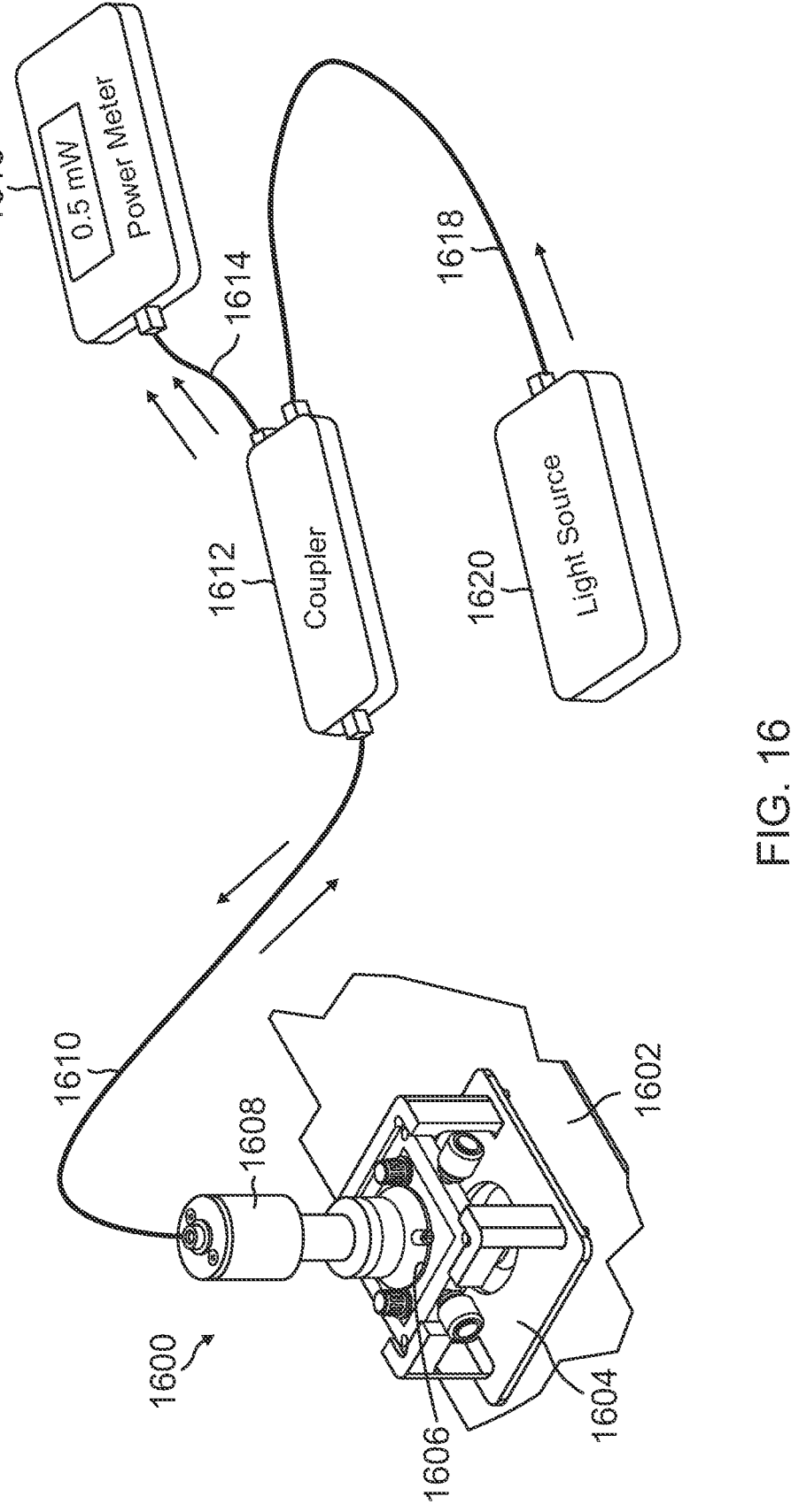
FIG. 16 is a diagram illustrating an example of an apparatus for measuring back reflection of the optical fiber according to some aspects.

FIG. 16 is a diagram illustrating an example of an apparatus for measuring back reflection of the optical fiber according to some aspects. The apparatus includes a probe card platform 1600 including an electrical probe card 1602, an optical alignment stage 1604, an optical positioner 1606, and a chuck-to-adapter sleeve 1608, as described above. A long patch cord 1610 is attached between the chuck-to-adapter sleeve 1608 and an optical coupler 1612 via an adapter 1622 assembled with the chuck-to-adapter sleeve 1608. The optical coupler 1612 is coupled to a light source 1620 via patch cord 1618 and to a power meter 1616 via patch cord 1614. The optical coupler 1612 is configured to optically couple light from the light source 1620 to a cleaved short pigtail fiber (not shown) attached to the long patch cord 1610 via the adapter 1622. The optical coupler 1612 is further configured to optically couple back reflected light from the cleaved short pigtail fiber to the power meter 1616. The power meter 1616 may be configured to measure the cleaved fiber back reflection to produce a measured power indicative of the cleaved surface quality. In other examples, a spectrometer may replace the power meter 1616 to measure the cleaved fiber back reflection across wavelengths.

Figure 17:
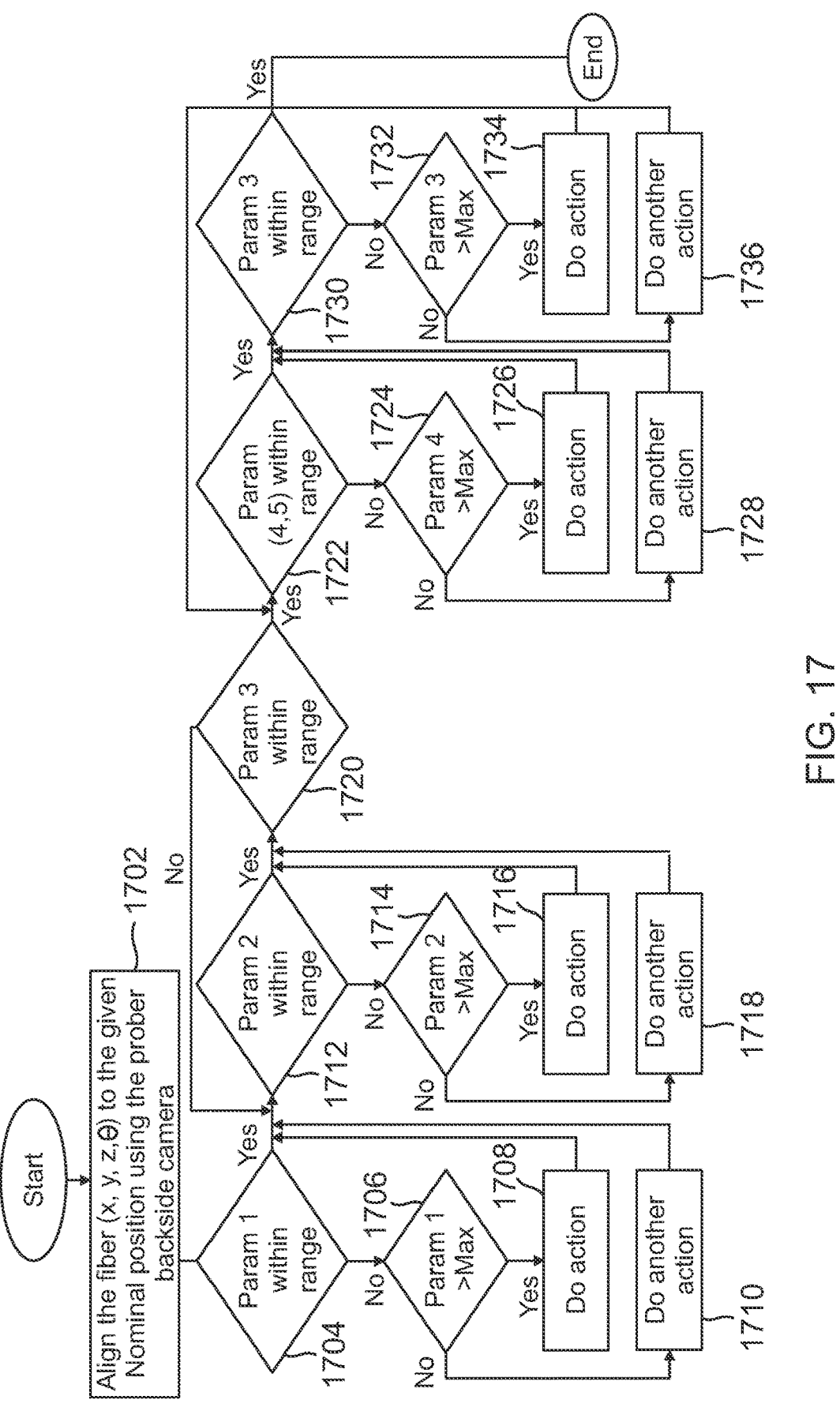
FIG. 17 is a flow chart illustrating an exemplary alignment flow for alignment of the optical fiber according to some aspects.

FIG. 17 is a flow chart illustrating an exemplary alignment flow for alignment of the optical fiber according to some aspects. The process includes both coarse alignment using a backside prober (chuck) camera and fine alignment using a camera mounted on the optical alignment stage. At block 1702, the optical fiber may be aligned to a given nominal position (x, y, z, θ) using the back side prober camera (e.g., based on image processing of one or more images captured by the back side prober camera) for coarse alignment of the optical fiber. The optical fiber position may then be fine-tuned to align the optical fiber with a MEMS reference die in a systematic manner based on one or more parameters. The parameter values may be based on image processing of one or more images captured by the optical alignment stage camera and may further be based on measured signals from the electrical probe card.

For example, at block 1704, a determination is made (e.g., by alignment software) whether a value of a first parameter is within a specification range. If not (N branch of block 1704), at block 1706, a determination is made whether the value of the first parameter is greater than a maximum value. If so (Y branch of block 1706), an action is taken at block 1708 to adjust the position of the optical fiber to bring the value of the first parameter within the specification range. If the first parameter value is not greater than a maximum value (N branch of block 1706), another (different) action may be taken at block 1710 to adjust the position of the optical fiber to bring the value of the first parameter within the specification range.

At block 1712, a determination is made whether a value of a second parameter is within a specification range. If not (N branch of block 1712), at block 1714, a determination is made whether the value of the second parameter is greater than a maximum value. If so (Y branch of block 1714), an action is taken at block 1716 to adjust the position of the optical fiber to bring the value of the second parameter within the specification range. If the second parameter value is not greater than a maximum value (N branch of block 1714), another (different) action may be taken at block 1718 to adjust the position of the optical fiber to bring the value of the second parameter within the specification range.

At block 1720, a determination is made whether a value of a third parameter is within a specification range. If not, the process returns to block 1712 for further adjustment of the second parameter value to bring the third parameter value to within the specification range. If so, the process moves onto block 1722, where a determination is made whether the values of one or more other parameters (e.g., parameters four and five) are within the corresponding specification ranges. If not (N branch of block 1722), a determination is made whether the value of at least one of the one or more parameters (e.g., parameter four) is greater than a maximum value. If so (Y branch of block 1724), an action is taken at block 1726 to adjust the position of the optical fiber to bring the values of the fourth and fifth parameters within the corresponding specification ranges. If the fourth parameter value is not greater than a maximum value (N branch of block 1724), another (different) action may be taken at block 1728 to adjust the position of the optical fiber to bring the values of the fourth and fifth parameters within the corresponding specification ranges.

At block 1730, a determination is made again whether a value of a third parameter is within a specification range. If so (Y branch of block 1730), the process ends. If not (N branch of block 1730), a determination is made whether the value of the third parameter is greater than a maximum value. If so (Y branch of block 1714), an action is taken at block 1716 to adjust the position of the optical fiber to bring the value of the third parameter within the specification range. If the third parameter value is not greater than a maximum value (N branch of block 1714), another (different) action may be taken at block 1718 to adjust the position of the optical fiber to bring the value of the third parameter within the specification range. The process then returns to block 1722. In the process shown in FIG. 17, different testing parameters (e.g., first, second, third parameters) are monitored in real-time until being inside a specification range.

Figure 18:
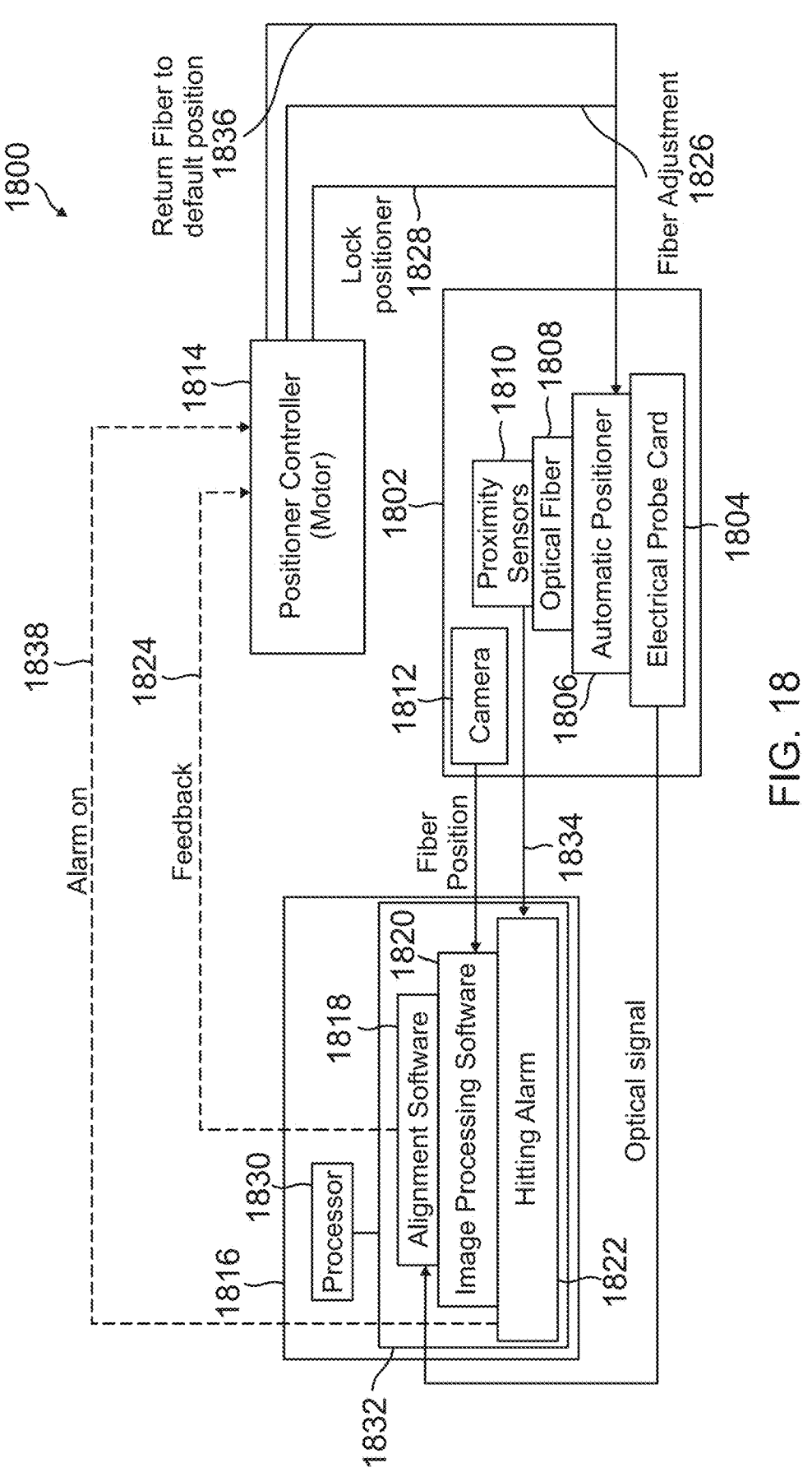
FIG. 18 is a diagram illustrating an example of automatic alignment of an optical fiber according to some aspects.

FIG. 18 is a diagram illustrating an example of automatic alignment of an optical fiber according to some aspects. A probe card platform 1802 includes an electrical probe card 1804, an automatic positioner 1806, an optical fiber 1808, one or more proximity sensors 1810, and a camera 1812. In addition, a computing device 1816 including a processor 1830 and a memory 1832 may be coupled to the probe card platform 1802. The memory 1832 may store software that may be executed by the processor 1830 for alignment of the optical fiber 1808 with alignment needles on the electrical probe card 1804 and/or an optical input of an optical MEMS structure under test. For example, the memory 1832 may further include alignment software 1818 that may be configured to execute an alignment algorithm, such as the alignment process shown in FIG. 17. The memory 1832 may further include image processing software 1820 configured to process one or more images captured during the alignment process and to generate image data that may be used by the alignment software 1818 to optimize the fiber position. For example, based on the image data and, in some examples, measured signals from the electrical probe card 1804, the alignment software 1818 may determine the parameters needed to have the optical fiber 1808 in the correct position (x, y, z, θ). In some examples, the image processing software 1820 may be configured to process one or more images from a backside prober camera (not shown) and the alignment software 1818 may be configured to determine a coarse alignment (default alignment) of the optical fiber 1808 based on the image data obtained from the backside camera images. In other examples, the image processing software 1820 may be configured to process one or more images from the probe card platform camera 1812 and the alignment software 1818 may be configured to determine a fine alignment of the optical fiber 1808 based on the image data obtained from the camera 1812.

The alignment software 1818, when executed by the processor 1830, may further generate and send feedback information 1824 indicating a target (updated) position (x, y, z, θ) of the optical fiber 1808 to a positioner controller 1814 (e.g., a motor or motorized stage). The positioner controller 1814 may then control the automatic positioner 1806 to move the optical fiber to the correct target position. For example, the positioner controller 1814 may control the automatic positioner 1806 by providing a fiber adjustment 1826 to the automatic positioner 1806 indicating an adjustment of the position of the optical fiber (in one or more axes) to be applied by the automatic positioner 1806 to produce the target position. For example, the positioner controller 1814 may be configured to cause the automatic positioner 1806 to move the optical fiber 1808 to the default position for coarse alignment and then to further adjust the position of the optical fiber 1808 (e.g., based on at least images from the camera 1812) for fine alignment. Once the optical fiber 1808 is aligned with the optical input of the optical MEMS structure (e.g., the parameters are all within the specification range), the positioner controller 1814 may generate a lock signal 1828 to lock the automatic positioner 1806 in place. Thus, using the feedback 1824 of the alignment software 1818 and with the aid of the positioner controller 1814, the optical fiber 1808 may be moved into alignment with respect to the optical MEMS structure.

In addition, the proximity sensors 1810 may be attached to the optical fiber 1808 to ensure that the optical fiber 1808 does not hit the walls of the optical MEMS structure during the alignment process, thus preventing damage of the optical fiber 1808 during alignment. For example, the proximity sensors 1810 may be attached to the fiber tip and configured to detect a proximity of the optical fiber 1808 to the walls of the optical MEMS structure and to return (transmit) an alarm 1834 to the computing device 1816 (e.g., processor 1830) in response to the proximity of the optical fiber 1808 to the walls of the optical MEMS structure being less than a distance (e.g., a predetermined or preconfigured distance). The memory 1832 may further include hitting alarm software 1822 that may be executed by the processor 1830 to process the alarm 1834 and to operate together with the alignment software 1818 to instruct the positioner controller 1814 via alarm on signal 1838 to return the optical fiber 1808 to the default fiber position in response to receiving the alarm 1834. For example, the positioner controller 1814 may generate and send a default fiber adjustment 1836 to the automatic positioner 1806 that causes the automatic positioner 1806 to return the optical fiber 1808 to the default fiber position.

Figures 19A, 19B:
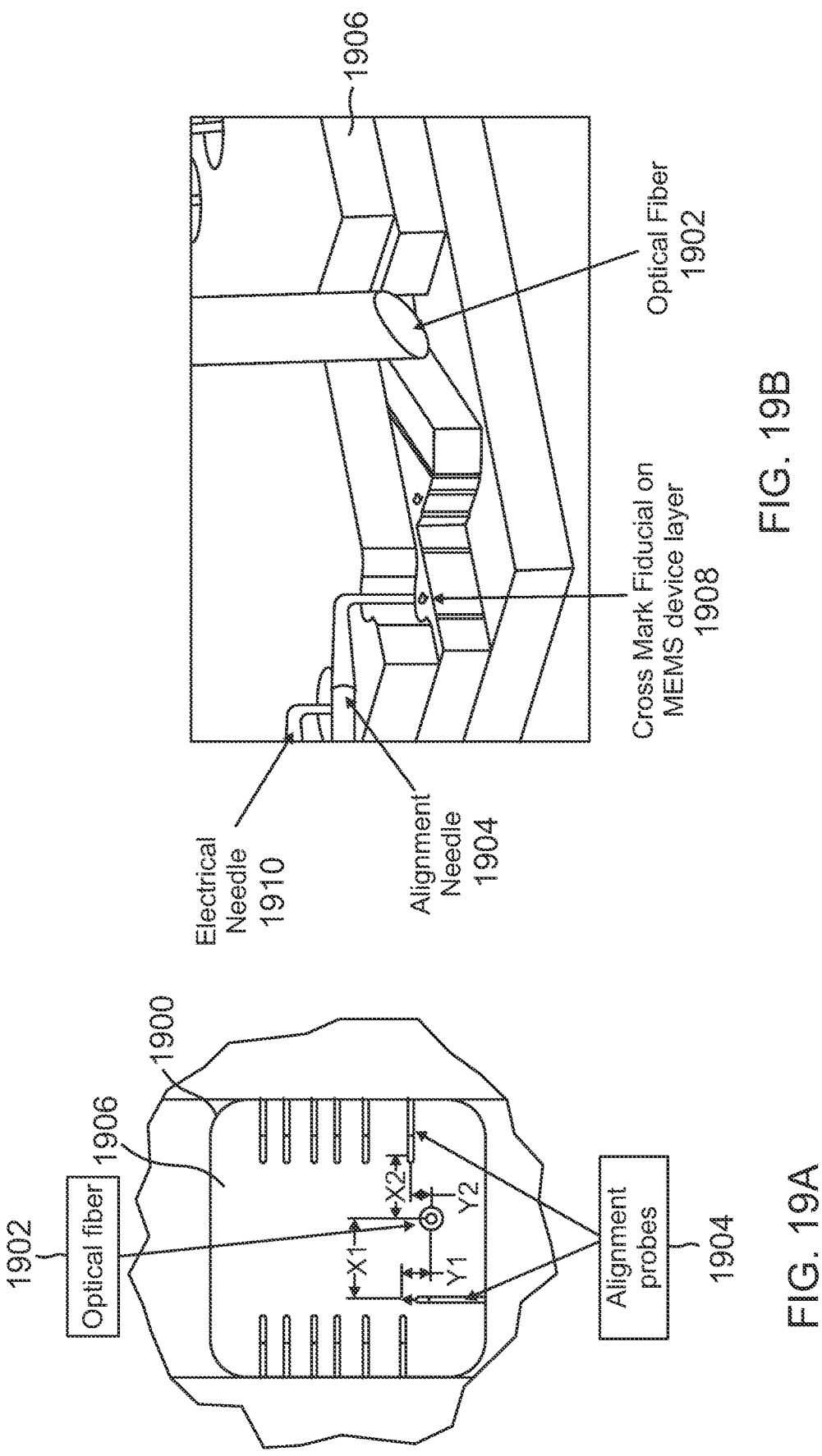
FIGS. 19A and 19B are diagrams illustrating an example of coarse alignment of an optical fiber according to some aspects.

FIGS. 19A and 19B are diagrams illustrating an example of coarse alignment of an optical fiber according to some aspects. In the example shown in FIGS. 19A and 19B, coarse alignment of an optical fiber 1902 may be performed during an alignment procedure of the electrical probe card 1900 to align the electrical needles 1910 of the electrical probe card 1900. The electrical probe card 1900 may include a plurality of alignment needles/probes 1904 that may be aligned with alignment fiducials 1908 etched/fabricated in the optical MEMS chip/device 1906 (e.g., in the device layer or handle layer) to facilitate alignment of the electrical needles 1910 to corresponding electrodes on the optical MEMS structure. For example, the MEMS fiducials 1908 can be in the form of cross marks etched in the device layer of an SOI wafer optical MEMS chip by a deep reactive ion etching (DRIE) process.

Respective distances (e.g., x1, x2, y1, y2) between the optical fiber 1902 and the MEMS fiducials 1908 are used to align the optical fiber 1902 with respect to the tips of the alignment needles 1904 and consequently with respect to the optical MEMS structure, using the back side camera of the prober device. For example, images of the alignment probes 1904 and the fiber tip 1902 may be captured, and with image processing and knowledge of the backside prober camera coordinate system, the optical positioner (not shown) may move the fiber to an initial (default) target position. This can be performed manually or automatically where the optical positioner is targeting to move the fiber inside a certain area (circle for circular fiber) drawn on the camera image as a target area for the fiber to be aligned within. In an example, a processor (shown in FIG. 1, FIG. 2, and/or FIG. 18) may be configured to calculate the respective distances between the optical fiber 1902 and the plurality of alignment needles 1904 that are aligned with respective alignment marks 1908 on the optical MEMS structure 1906 and to generate the alignment assistance data for use by the optical positioner in coarsely aligning the optical fiber 1902.

Figure 20:
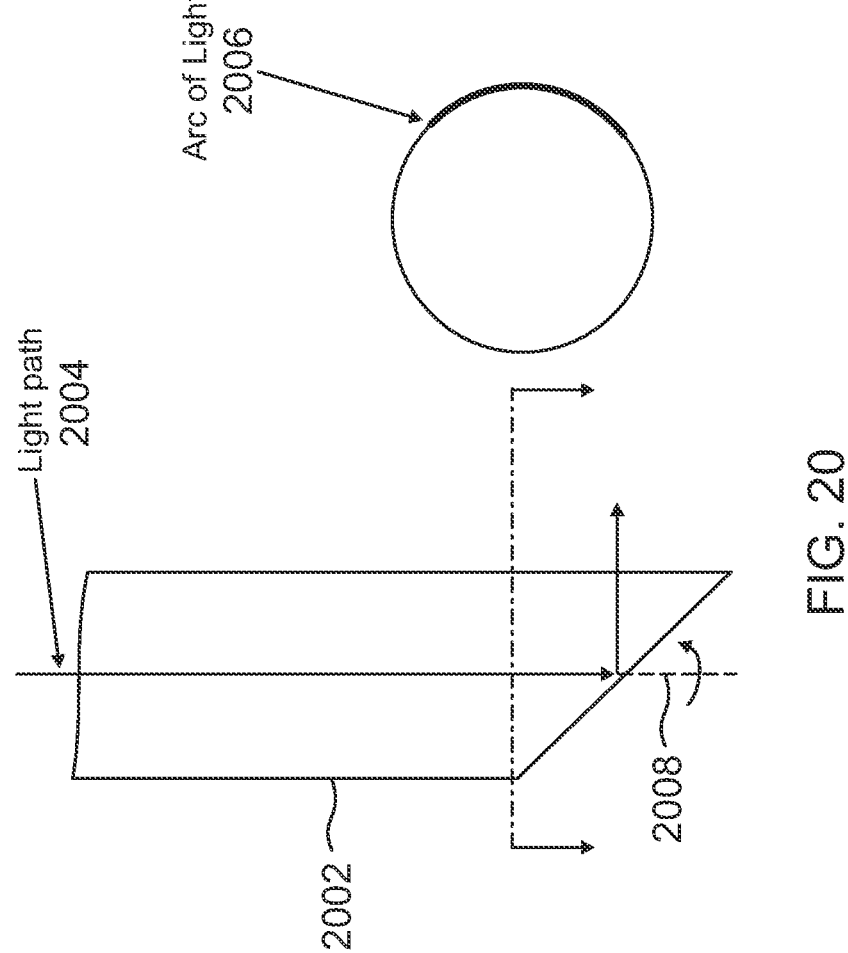
FIG. 20 is a diagram illustrating an example of optical fiber rotation angle adjustment according to some aspects.

FIG. 20 is a diagram illustrating an example of optical fiber rotation angle adjustment according to some aspects. In the example shown in FIG. 20, an optical fiber 2002 is cleaved at an angle of 45 degrees. A light path 2004 through the optical fiber produces an arc of light 2006 at the output thereof that may be detected, for example, by a camera. An optical positioner may be used to rotate the optical fiber 2002 about an optical axis 2008 thereof to a target angle using the detected arc of light 2006. For example, image processing may be used to detect the shining arc center, followed by determining an angle of orientation of the optical fiber 2002 with respect to alignment probes on the electrical probe card.

Figures 21A, 21B, 21C:
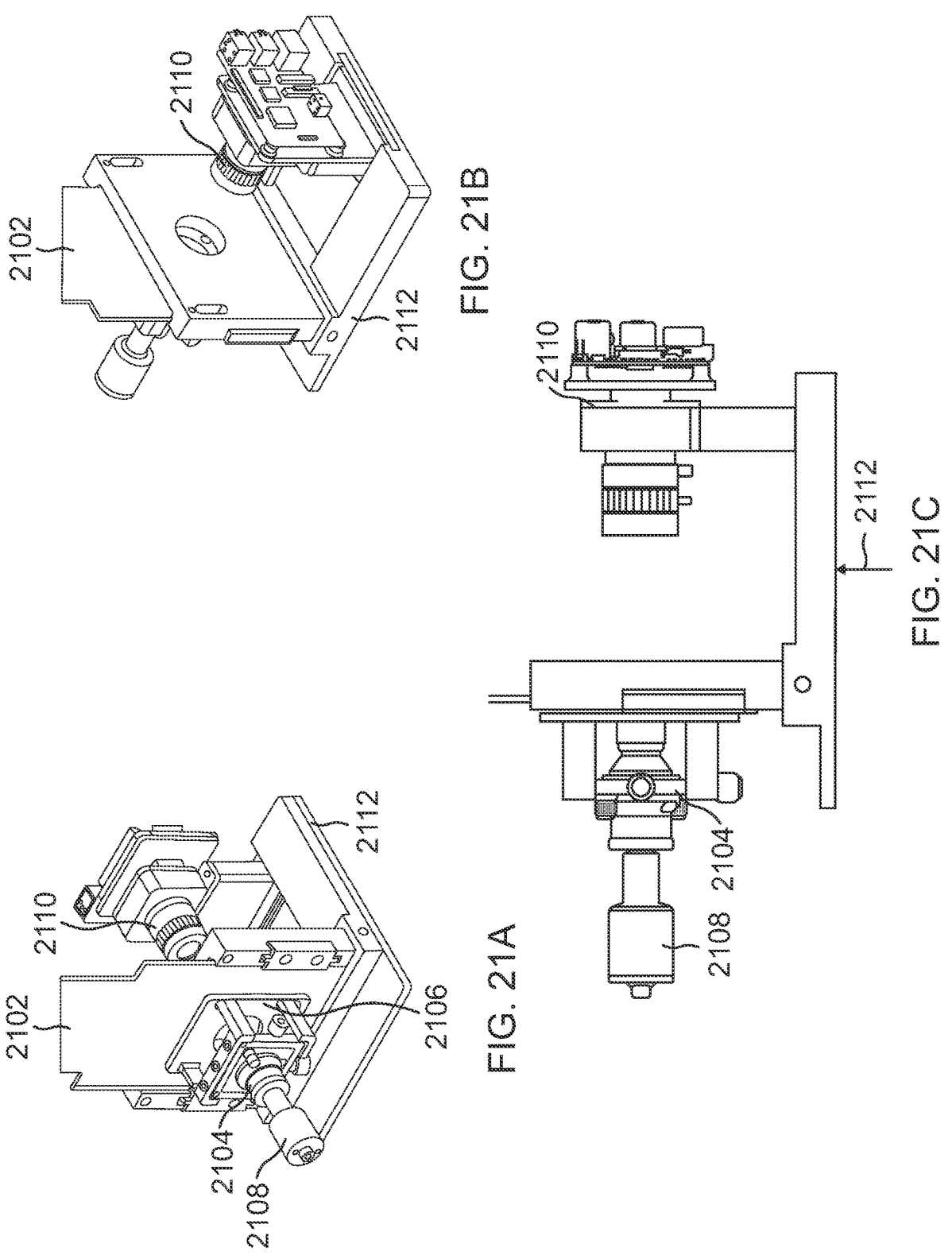
FIGS. 21A-21C are diagrams illustrating another example of coarse alignment of an optical fiber according to some aspects.

FIGS. 21A-21C are diagrams illustrating another example of coarse alignment of an optical fiber according to some aspects. In the example shown in FIGS. 21A-21C, an optical alignment stage 2106 supporting an optical positioner 2104 may be assembled with an electrical probe card 2102. An optical fiber (e.g., fiber chuck coupled to a chuck-to-adapter sleeve 2108) may be inserted into the optical positioner 2104. The resulting probe card platform may be arranged on a base structure 2112 having a camera (or microscope) 2110 mounted thereon such that a backside of the electrical probe card is opposite the camera/microscope 2110. The camera/microscope 2110 may be configured to obtain a backside image of the electrical probe card. In one example, the image or microscope view may assist an operator in manually aligning the optical fiber using the optical positioner 2104. For example, the camera/microscope 2110 may be connected to a separate computing device or a monitor to display the image or microscope view to the operator for use in manual alignment to a default/target position. In this example, measured signal(s) obtained by the electrical probe card 2102 (e.g., measured signals produced by the photodetector, such as an interferogram) may then be used by a processor (e.g., shown in FIGS. 1, 2, and/or 18) to generate the alignment assistance data for fine alignment of the optical fiber. In other examples, the processor may generate the alignment assistance data based on the backside image to assist the optical positioner 2104 (manually or automatically) in alignment/positioning of the optical fiber with respect to alignment needles on the electrical probe card 2102 to place the optical fiber at the default/target position. Fine alignment may then be performed based on measured signals, as described above. The alignment mechanism shown in FIGS. 21A-21C may be performed prior to insertion of the probe card platform to the prober device.

Figure 22:
FIG. 22 is a diagram illustrating an example of fine alignment of an optical fiber according to some aspects.

FIG. 22 is a diagram illustrating an example of fine alignment of an optical fiber according to some aspects. In the example shown in FIG. 22, an optical MEMS structure 2200 may include dummy lines 2202 corresponding to an oxidation/HF release process of a dummy SOI structure leaving grid marks on the handle substrate. The dummy lines 2202 may be used during alignment of the optical fiber with respect to the optical input of the optical MEMS structure 2200. For example, a camera may be used to capture one or more images of the position of the optical fiber with respect to the dummy lines 2202, and the alignment software may then use processed image data from the images to place the optical fiber at a target position with respect to the dummy lines 2202 and surrounding features for fine alignment of the optical fiber.

Figures 23A, 23B, 23C, 23D:
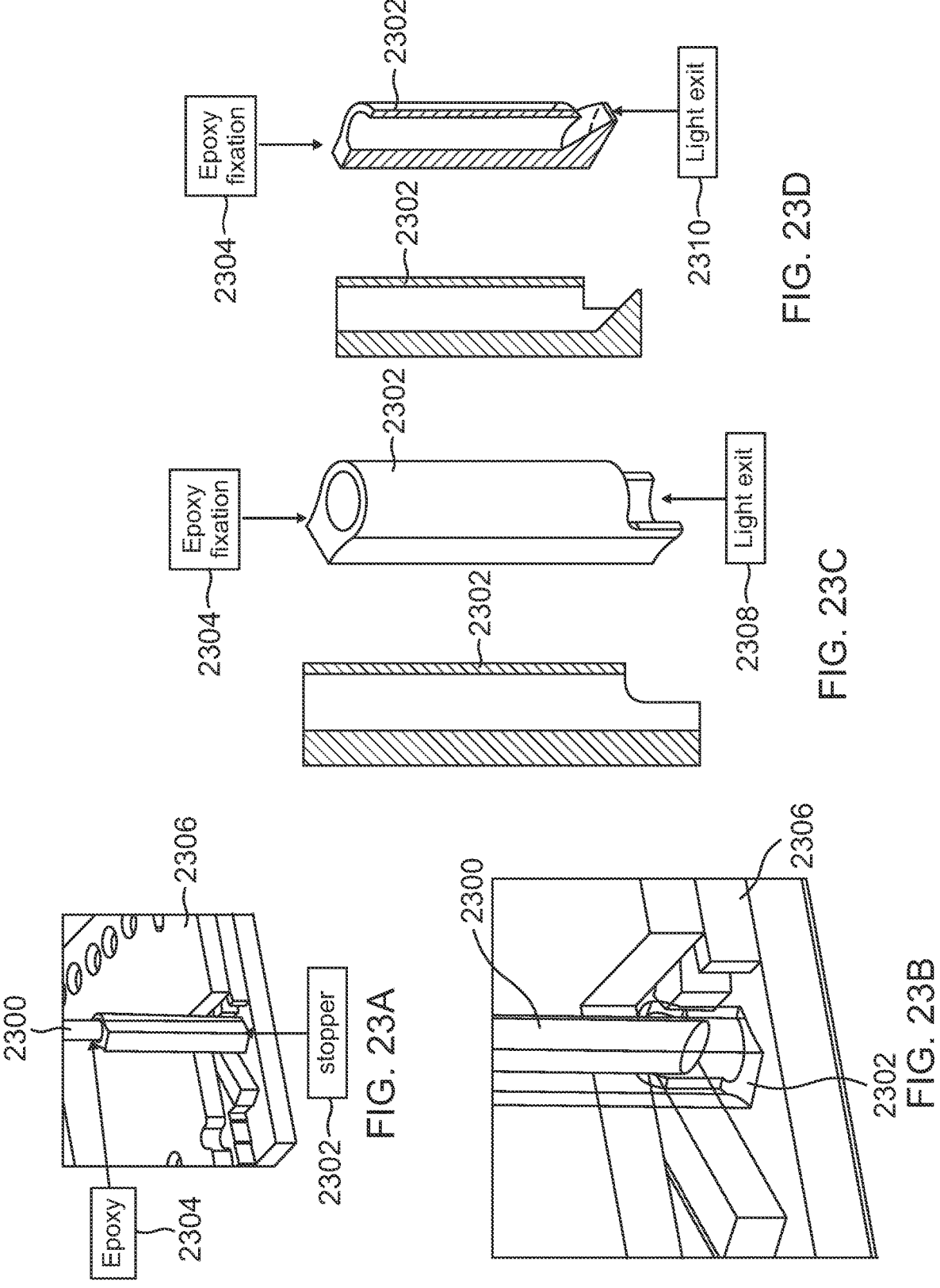
FIGS. 23A-23D are diagrams illustrating an example of a fiber stopper according to some aspects.

FIGS. 23A-23D are diagrams illustrating an example of a fiber stopper according to some aspects. The process of aligning an optical fiber 2300 may include moving the optical fiber in three directions (along the x, y, and z axes), which may lead to a collision between the optical fiber 2300 and an optical MEMS structure 2306 (MEMS die). In order to protect both the MEMS die 2306 and the optical fiber 2300 from damage, a fiber stopper 2302 may be attached to the tip of the optical fiber 2300 using an epoxy 2304 fixed to the stopper 2302. For example, the fiber stopper 2302 may have a length of 3.7 mm, an opening diameter of 0.55 mm, and cross-sectional thickness of 0.1 mm and 0.3 mm on each side of the opening. In some examples, as shown in FIG. 23C, the fiber stopper 2302 may be designed to be open at the bottom and along a bottom side to provide a light exit 2308 at the bottom and bottom side of the fiber stopper 2302, while in other examples, as shown in FIG. 23D, the fiber stopper 2302 may be designed to be closed at the bottom and open along the bottom side to provide light exit 2310 at the bottom side.

Figures 24A, 24B:
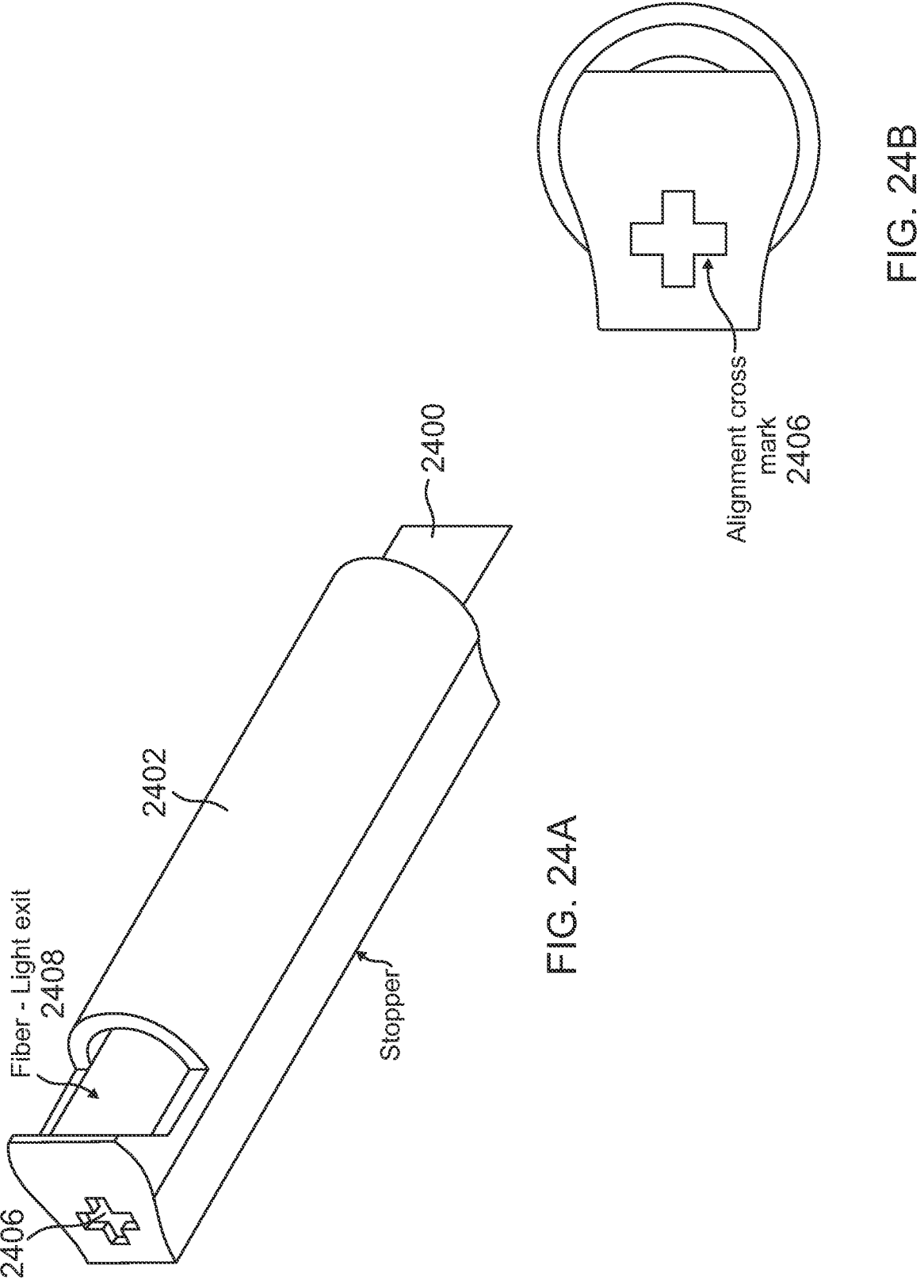
FIGS. 24A and 24B are diagrams illustrating another example of a fiber stopper according to some aspects.

FIGS. 24A and 24B are diagrams illustrating another example of a fiber stopper according to some aspects. The alignment of an optical fiber 2400 in the x-y direction with respect to each MEMS die is crucial to the probing process. Therefore, in the example shown in FIGS. 24A and 24B, an alignment cross mark 2406 may be added at the bottom of a fiber stopper 2404 having a design where the light exit 2408 is on the bottom side of the fiber stopper 2402. The cross mark 2406 may aid the alignment process using a camera installed on the prober device. For example, the fiber tip is typically used for the purpose of alignment; however, the alignment mark 2406 may be easier to locate with respect to the alignment pins on the probe card.

Figure 25:
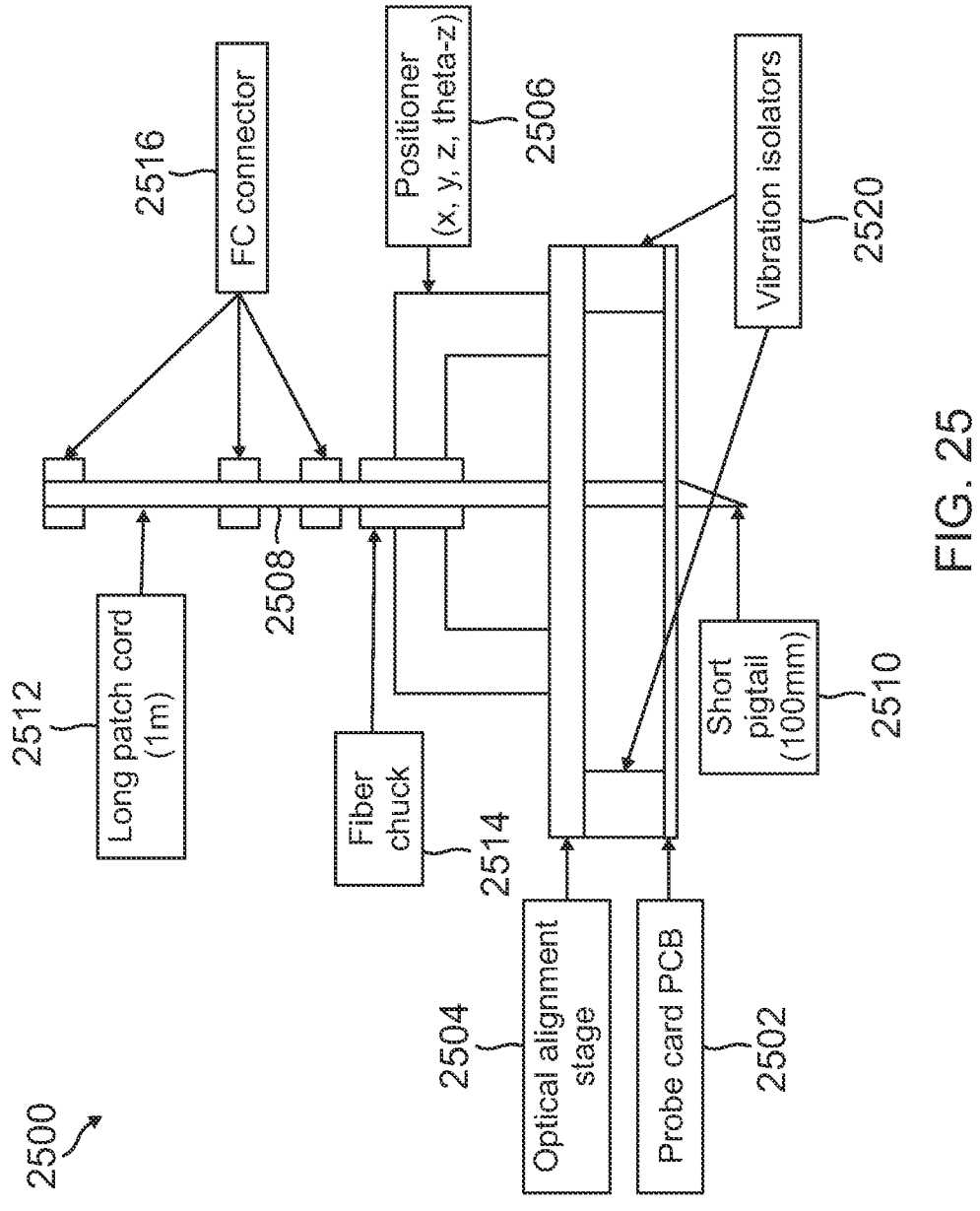
FIG. 25 is a diagram illustrating an example of a probe card platform including vibration isolators according to some aspects.

FIG. 25 is a diagram illustrating an example of a probe card platform including vibration isolators according to some aspects. The probe card platform 2500 includes an electrical probe card 2502 (probe card PCB), an optical alignment stage 2504, an optical positioner 2506 (e.g., a positioner with x, y, z, 0 degrees of freedom), and an optical fiber 2508. The optical fiber 2508 includes a short pigtail fiber 2510 and a detachable long patch cord 2512 (e.g., 1 m fiber). The short pigtail fiber 2510 is mounted on the optical positioner 2506 through a fiber chuck 2514. The probe card platform 2500 further includes FC connectors 2516 coupled to the fiber chuck 2514 and configured to connect the short pigtail fiber 2510 with the detachable long patch cord 2512 and to provide further connections between the long patch cord 2512 and other devices. In the example shown in FIG. 25, the optical alignment stage 2504 is attached to the electrical probe card 2502 and configured to support the optical positioner 2506 above the electrical probe card 2502. In addition, the probe card platform 2500 further includes vibration isolators 2520 coupled between the electrical probe card 2502 and the optical alignment stage 2504 to minimize or eliminate vibrations from being transmitted to the optical fiber 2508. Such vibrations may affect the measurement accuracy, and therefore, minimizing or eliminating the vibrations may improve the testing accuracy.

Figure 26:
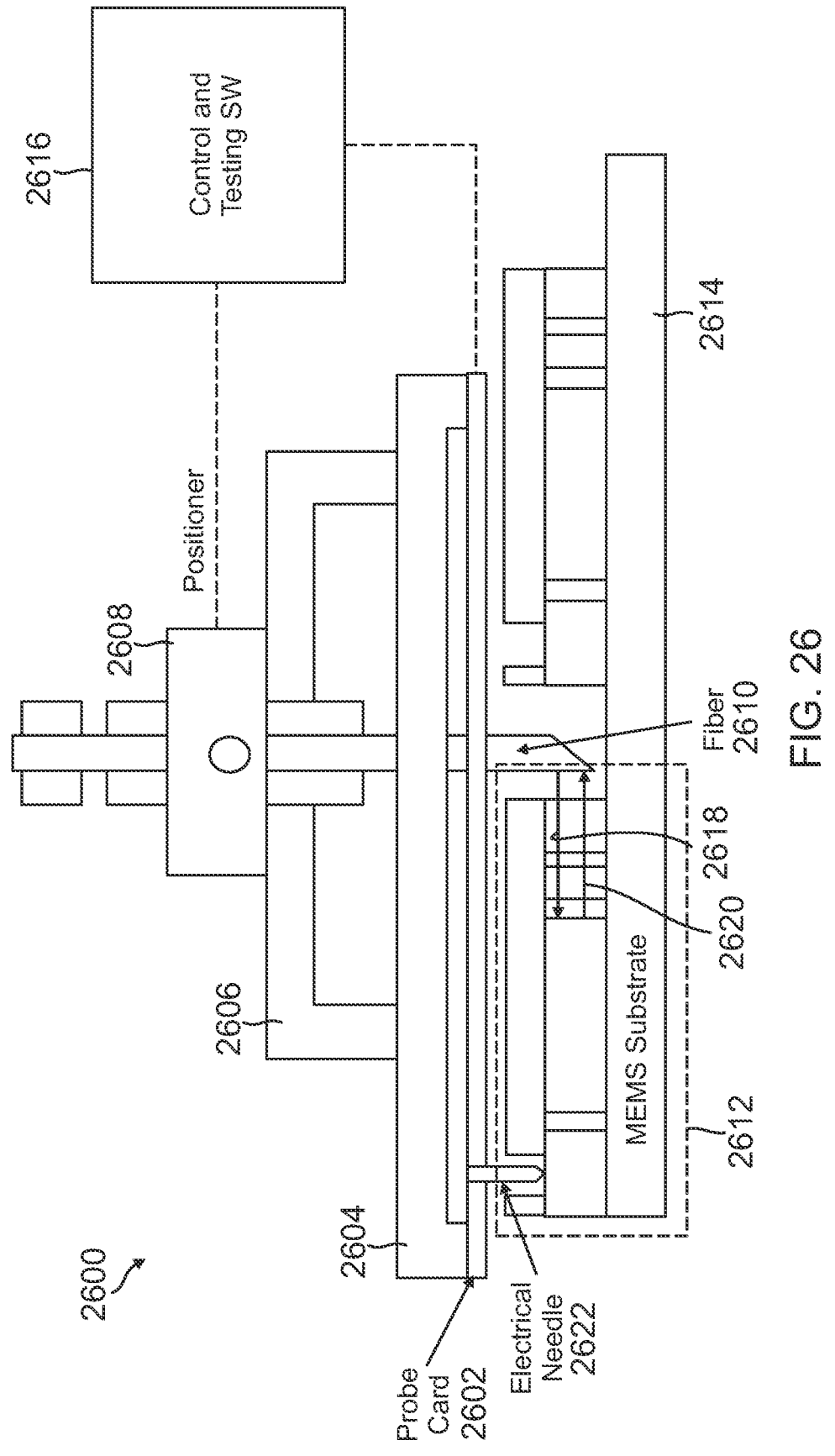
FIG. 26 is a diagram illustrating an example probing of an optical MEMS structure according to some aspects.

FIG. 26 is a diagram illustrating an example probing of an optical MEMS structure according to some aspects. In FIG. 26, a probe card platform 2600 is shown in contact with an optical MEMS structure 2612 for probing/testing of the optical MEMS structure 2612. The probe card platform 2600 includes an electrical probe card 2602 having electrical needles thereon 2622 in contact with electrodes on the optical MEMS structure 2612. The probe card platform 2600 further includes an optical alignment stage 2604, positioner holder 2606 and optical positioner 2608 for aligning an optical fiber 2610 with an optical input of the optical MEMS structure 2612. The optical MEMS structure 2612 is fabricated on a MEMS substrate 2614 (e.g., within the device layer of an SOI wafer). Control and testing software 2616 (e.g., which may correspond to the alignment software 228 and automatic testing software 232 shown in FIG. 2) may control the positioner 2608 to move the optical fiber 2610 into alignment and perform testing of the optical MEMS structure 2612.

In the example shown in FIG. 26, an optical axis of the optical MEMS structure 2612 may be in-plane (e.g., parallel to the MEMS substrate 2614). For example, the optical MEMS structure 2612 may be a Michelson interferometer. Thus, the optical fiber 2610 of the probe card platform 2600 may be configured to receive input light 2618 from a light source (not shown), where the input light 2618 is propagating in an out-of-plane direction (e.g., perpendicular) with respect to the plane of the MEMS substrate 2614. The optical fiber 2610 may further be configured to couple (direct) the input light 2618 into the optical input of the optical MEMS structure such that the input light 2618 propagates in an in-plane direction that is in-plane with respect to the MEMS substrate 2614. In addition, the optical fiber 2610 may be configured to receive output light 2620 from the optical MEMS structure 2612 that is propagating in an in-plane direction with respect to the MEMS substrate 2614 and to direct the output light to a detector (not shown) through the optical fiber 2610 such that the output light 2620 is propagating in an out-of-plane direction with respect to the MEMS substrate 2614.

Figure 27:
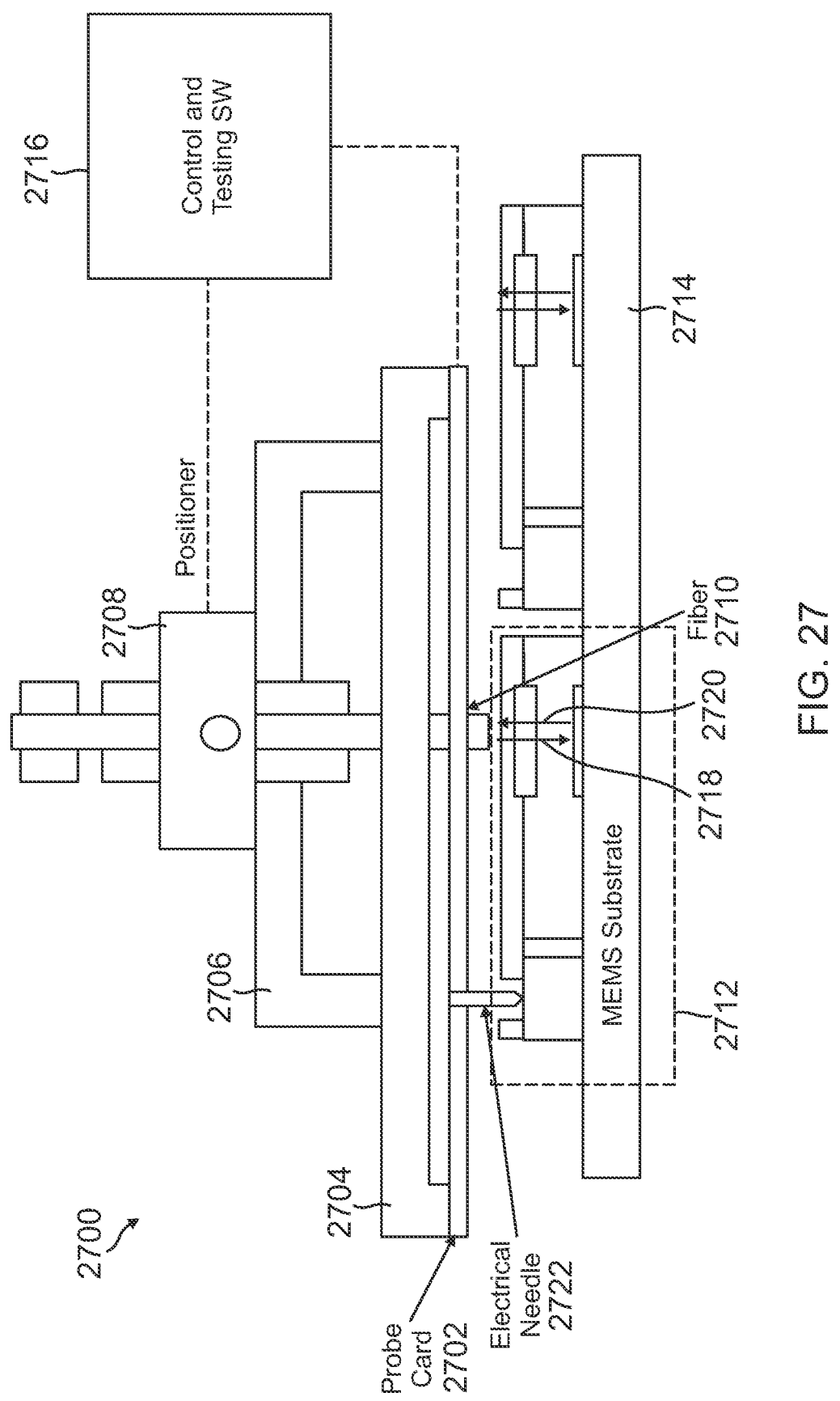
FIG. 27 is a diagram illustrating another example probing of an optical MEMS structure according to some aspects.

FIG. 27 is a diagram illustrating another example probing of an optical MEMS structure according to some aspects. In FIG. 27, a probe card platform 2700 is shown in contact with an optical MEMS structure 2712 for probing/testing of the optical MEMS structure 2712. The probe card platform 2700 includes an electrical probe card 2702 having electrical needles thereon 2722 in contact with electrodes on the optical MEMS structure 2712. The probe card platform 2700 further includes an optical alignment stage 2704, positioner holder 2706 and optical positioner 2708 for aligning an optical fiber 2710 with an optical input of the optical MEMS structure 2712. The optical MEMS structure 2712 is fabricated on a MEMS substrate 2714 (e.g., within the device layer of an SOI wafer). Control and testing software 2716 (e.g., which may correspond to the alignment software 228 and automatic testing software 232 shown in FIG. 2) may control the positioner 2708 to move the optical fiber 2710 into alignment and perform testing of the optical MEMS structure 2712.

In the example shown in FIG. 27, an optical axis of the optical MEMS structure 2712 may be out-of-plane (e.g., perpendicular to the MEMS substrate 2714). For example, the optical MEMS structure 2712 may be a Fabry-Perot tunable filter. Thus, the optical fiber 2710 of the probe card platform 2700 may be configured to receive input light 2718 from a light source (not shown), where the input light 2718 is propagating in an out-of-plane direction (e.g., perpendicular) with respect to the plane of the MEMS substrate 2714. The optical fiber 2710 may further be configured to couple (direct) the input light 2718 into the optical input of the optical MEMS structure such that the input light 2718 propagates in the out-of-plane direction that is out-of-plane with respect to the MEMS substrate 2714. In addition, the optical fiber 2710 may be configured to receive output light 2720 from the optical MEMS structure 2712 that is propagating in the out-of-plane direction with respect to the MEMS substrate 2714 and to direct the output light to a detector (not shown) through the optical fiber 2710 such that the output light 2720 is propagating in the out-of-plane direction with respect to the MEMS substrate 2714.

In some examples, the control and testing software 2616 or 2716 shown in FIG. 26 or 27 may be AI-based control and testing software to provide for generality of the optical head (e.g., optical fiber) with respect to different MEMS structures (e.g., different MEMS device designs and architectures). In addition, AI-based control and testing software may maintain reproducibility between probe card platforms.

Figure 28:
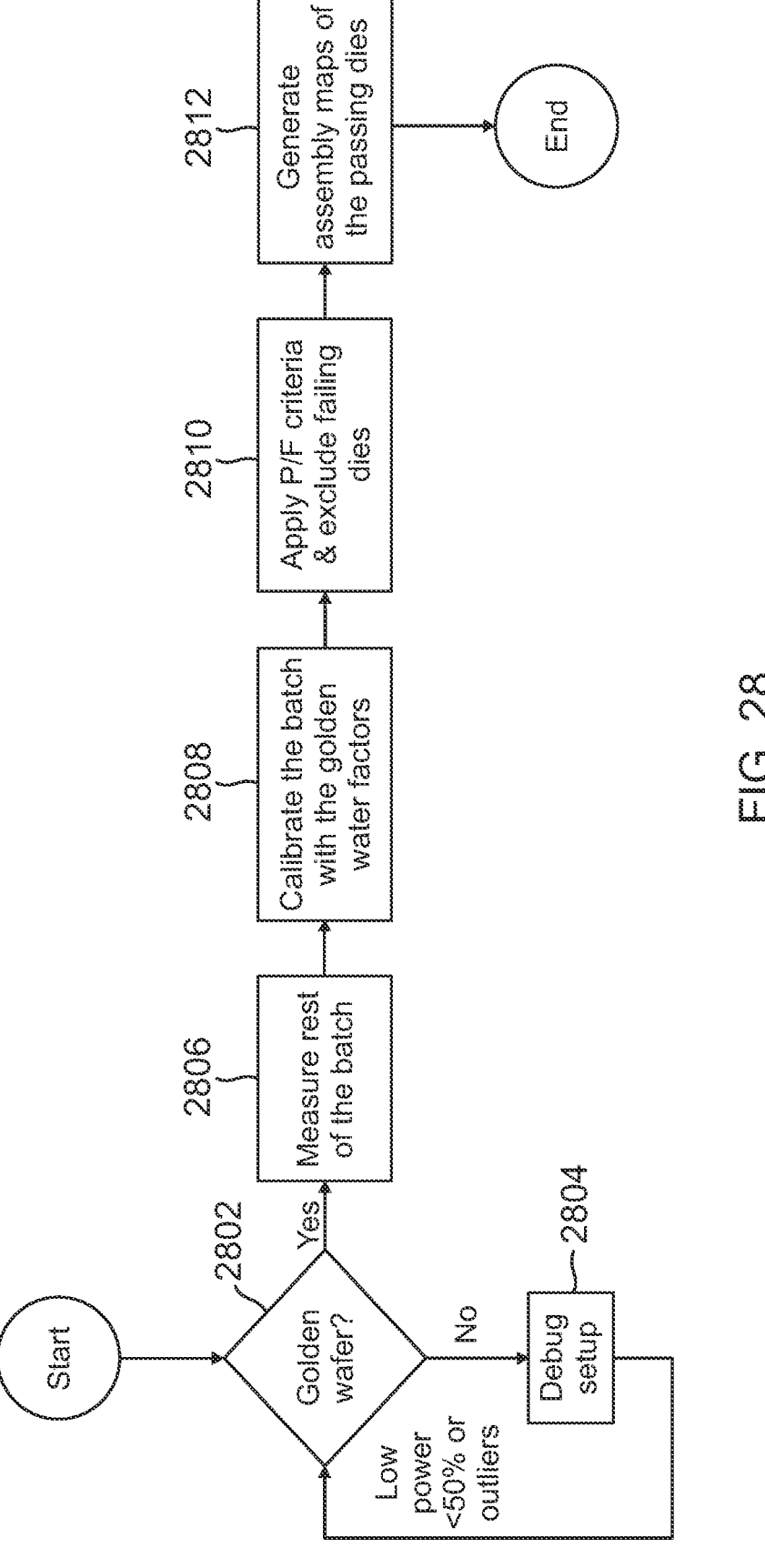
FIG. 28 is a flow chart illustrating an exemplary flow for AI-based generation of an assembly map according to some aspects.

FIG. 28 is a flow chart illustrating an exemplary flow for AI-based generation of an assembly map according to some aspects. At block 2802, a golden wafer from previous batches with a known performance is measured. The results of this measurement are then inspected. If the results are unacceptable (e.g., low power <50% or other outliers) (N branch of block 2802), a debug of the setup is performed at block 2804, and the results are again inspected. If the results are acceptable (e.g., power is greater than 50% and there are no other outliers), the process proceeds to 2806, where the rest of the batch is probed. At block 2808, the batch is calibrated (corrected) with calibration factors generated from the golden wafer measurement. At block 2810, a pass or fail criteria is applied to eliminate faulty dies or low performance dies that will fail after assembly. Finally, at bock 2812, assembly maps for the passing dies are generated.

The aim of calibrating the batch results is to correlate the dies' performance before assembly to the dies' performance after assembly. To enhance this correlation, a mapping is made between the probe data measured by a single port fiber and the assembled device. This mapping may be done through an AI (machine learning) model that takes the raw data from the probe measurement and the corresponding data after assembly. These AI models may be extended to predict whether this die will pass after assembly or not.

Figure 29:
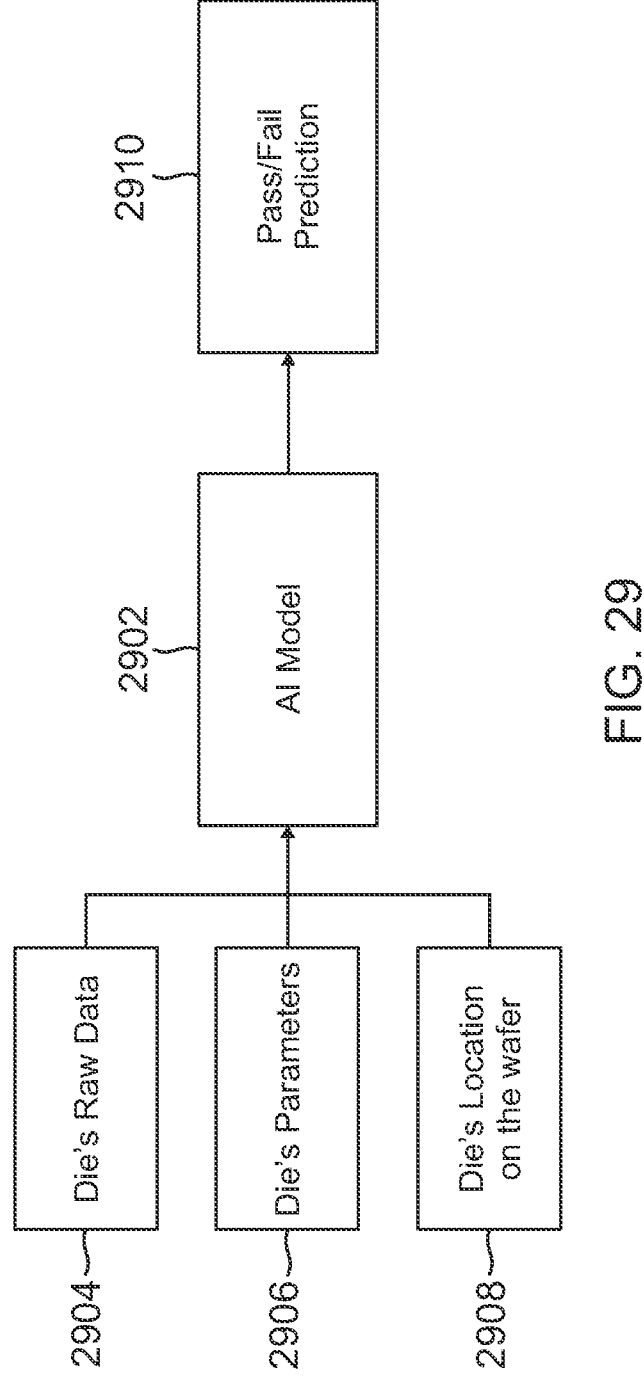
FIG. 29 is a diagram illustrating an example of an AI model for pass/fail after assembly prediction according to some aspects.

FIG. 29 is a diagram illustrating an example of an AI model for pass/fail after assembly prediction according to some aspects. The AI model 2902 takes as inputs the MEMS die's raw data 2904 (e.g., raw optical readings from the die without processing), the die's parameters 2906 extracted from the raw data, and the die's location on the wafer 2908 and outputs the prediction of either pass or fail. In this manner, an AI engine may be configured to discern a pass/fail status of an optical MEMS structure (die) and other MEMS dies on the wafer based on the AI (machine learning) model 2902.

Figure 30:
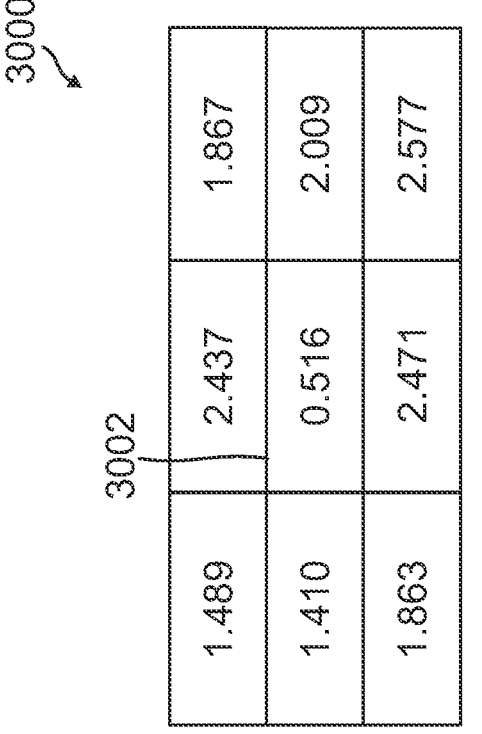
FIG. 30 illustrates exemplary readings during a measurement according to some aspects.

In other examples, an AI post-processing algorithm may be used for detection and correction of fake measurements. For example, as shown in FIG. 30, throughout a measurement (testing) session, multiple readings 3000 may be obtained. One or more of the readings may be fake (e.g., reading 3002) in that the readings 3002 do not reflect the real performance of the tested die at hand. An AI algorithm based on the nearest neighbors' performance can be utilized to detect this issue. Additionally, a correction factor can be estimated to correct the fake reading smoothly and in real-time.

Another feature that can be added to the AI post-processing algorithm is correction of readings by clusters based on the golden wafer measurement. To implement this feature, the AI algorithm may divide the golden wafer measurement into clusters based on pre-defined parameters (e.g., maximum number of clusters, smoothness, etc.). For each cluster, a correction factor can be calculated to correct the measurements of the rest of the wafers within the same probing (testing or measurement) session. By applying correction to the readings, the accuracy of the results may be enhanced, thus improving the performance decision of each die.

Another feature that can be added to the AI post-processing algorithm is temperature drift of the readings. For example, the wafers being tested may be heated by the prober chuck and measurements (readings) may be taken of each of the wafers at different temperatures of the MEMS dies. This allows the heating effect to be ascertained on the MEMS dies. The readings at different temperatures may then be compared to each other and the drift between these measurements may be calculated to aid the AI post-processing algorithm in deciding on passing/failing MEMS chips according to certain criteria.

In other examples of AI post-processing algorithms, the AI engine may be used to enhance the performance of the whole system as well as reduce the time needed for analyzing the data. For example, an AI algorithm can be used to monitor the wafer readings in a real-time manner to detect and report any anomalies in the measurements. For example, if the optical fiber hits any fixture on the sample leading to a drop in the power or misalignment, the algorithm may detect the hit and a message can appear to the operator. Similarly, if a sudden source of noise is introduced into the system causing fluctuations in the measurements, the algorithm may be able to detect the noise increase and report this to the operator.

Figure 31:
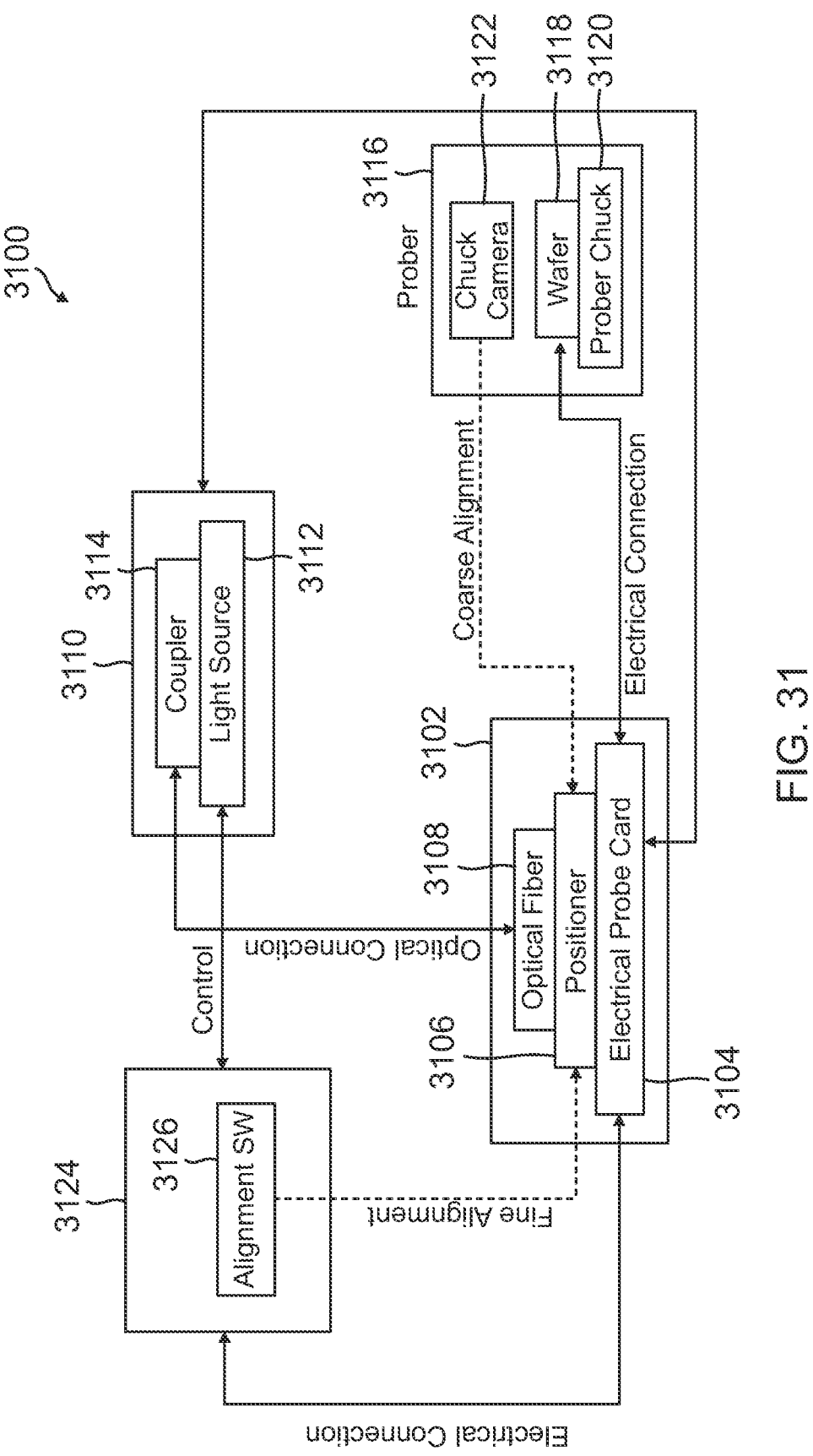
FIG. 31 is a diagram illustrating an example of an apparatus configured to monitor noise levels according to some aspects.

For real-time monitoring of the noise levels, the light source of the optical fiber can be controlled so that frequent dark measurements can be taken. FIG. 31 is a diagram illustrating an example of an apparatus configured to monitor noise levels according to some aspects. The apparatus 3100 includes a probe card platform 3102, an illumination module 3110, a prober device 3116, and a computing device 3124 (e.g., a personal computer (PC) or other suitable computing device). The prober device 3116 includes a prober (wafer) chuck 3120 configured to fix a wafer 3118 during testing (probing) thereof and an optional chuck camera 3122.

The probe card platform 3102 includes an electrical probe card 3104, an optical head 3108 (e.g., an optical fiber), and an optical positioner 3106. In some examples, the probe card platform 3102 may further include a camera (not shown). The electrical probe card 3104 includes a plurality of electrical needles (probes) for facilitating an electrical connection with an optical MEMS structure on a die on the wafer 3118 during testing thereof. In addition, the electrical probe card 204 may further include a plurality of alignment needles (probes) used to align the electrical probe card 3104 with corresponding alignment marks/fiducials on the optical MEMS structure under test. The electrical probe card 3104 may further include control and detection electronics, including, for example, a photodetector configured to receive output light from the optical MEMS structure under test. The optical positioner 3106 may be configured to align the optical head 3108 with at least one of the plurality of alignment needles or an optical input of an optical MEMS structure (e.g., die) on the wafer 3118. In some examples, the optical positioner 208 may be configured with x, y, z, and theta-z ($\theta$) degrees of freedom. The optical positioner 3106 may be configured to be manually adjusted for manual alignment of the optical head 3108 with the optical MEMS structure or may be automatically adjusted for automatic alignment of the optical head 3108 with the optical MEMS structure.

The illumination module 3110 may include, for example, a light source 3112 and an optical coupler 3114. The light source 3112 may include a broadband light source or narrow-band light source. In an example, input light from the light source 3112 may be coupled via the optical coupler 3114 to the optical head 3108. The input light may then be coupled from the optical head 3108 to the optical MEMS structure under test. In some examples, output light from the optical MEMS structure under test may further be directed to a photodetector on the electrical probe card 3104 via the optical head (e.g., an optical fiber) and the optical coupler 3114.

The computing device 3124 may correspond to a personal computer, server, handheld device (e.g., cell phone or tablet), cloud-based device, or any other suitable computing device. The computing device 226 may include, for example, alignment software 3126 that may be executed by a processor (not shown) to align the electrical probe card 204 to the wafer 3118 and to further align the optical head 3108.

In the example shown in FIG. 31, the light source 3112 may be synchronized with the alignment software 3126 to reduce or eliminate dark measurements from the final testing results. In some examples, dark measurements may be used to determine the noise level throughout the measurement (testing) session. An abnormal change in the noise level may be detected by the computing device 3124, which may then be configured to discontinue the measurements and report the issue (e.g., via an operator's terminal).

Figure 32:
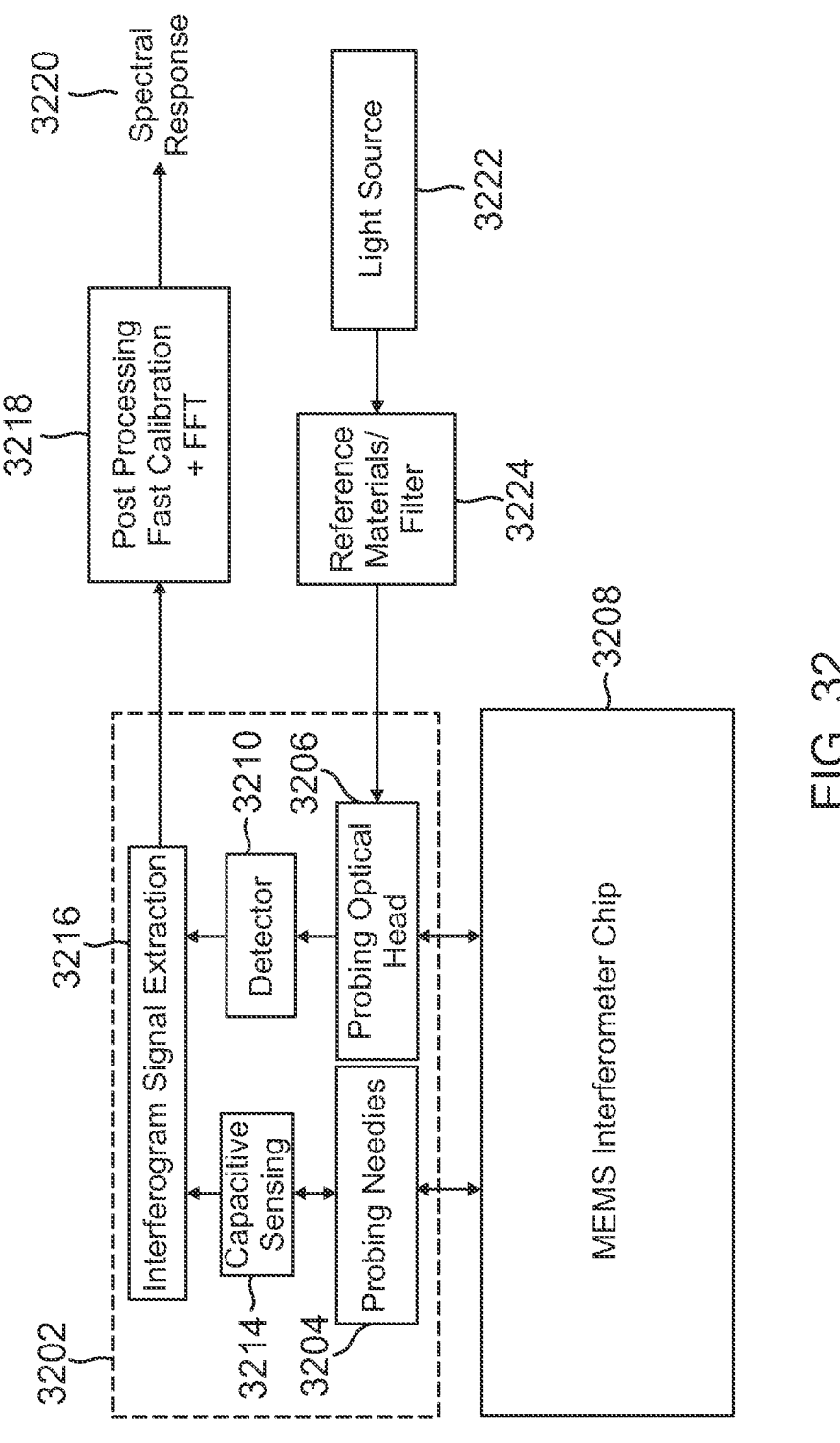
FIG. 32 is a diagram illustrating an example of calibration of an optical MEMS structure under test according to some aspects.

FIG. 32 is a diagram illustrating an example of calibration of an optical MEMS structure under test according to some aspects. In the example shown in FIG. 32, an optical MEMS interferometer chip 3208 may be fast calibrated to measure its spectral response 3220. A probe card platform 3202 includes an electronics capacitive sensing block 3214 that interfaces with probing needles 3204 of an electronic probe card (not specifically shown, for simplicity) and interferogram signal extraction circuitry (e.g., that may be coupled to a photodetector on the electronic probe card). The measured interference signal extracted by the interferogram signal extraction circuitry 3216 may be synchronized with a corresponding capacitance signal produced by the capacitive sensing block 3214 that represents the optical path difference caused by the moving mirror displacement of the MEMS interferometer 3208. The synchronization may be performed by a post processing fast calibration block 3218 (e.g., which may correspond to software that may be executed on a computing device coupled to the probe card platform). For example, an interferogram signal corresponding to the incident light on the interferometer and passing through it, may be extracted by averaging of multiple interference signal cycles. The optical path difference axis may initially be extracted by the post processing fast calibration block 3218 based on a pre-known calibrated relation between the capacitance signal vs the optical path difference signal.

For a more accurate relation, the post processing fast calibration block 3218 may apply different smart fast calibration steps. For example, the interferogram signal may first be transformed into a power spectral density signal by Fast Fourier Transform FFT (FFT). By using a well-known certified reference material 3224 or an optical filter in the light path from a wide-band light source 3222, the post processing fast calibration block 3218 may correct residual wavelength errors across the spectral range. In another example, optical fiber spectral absorption features may be used for wavelength correction. An optical path difference vector can also be accurately measured through detection of known interferogram features known by design, such as multiple interferogram bursts across the moving mirror travel range. In some examples, fast calibration of different MEMS chips can be stored in a database (not shown) on the cloud for example, to be used on the next level of product assembly saving the needed time for calibration of unit by unit on the production line.

Figures 33A, 33B, 33C:
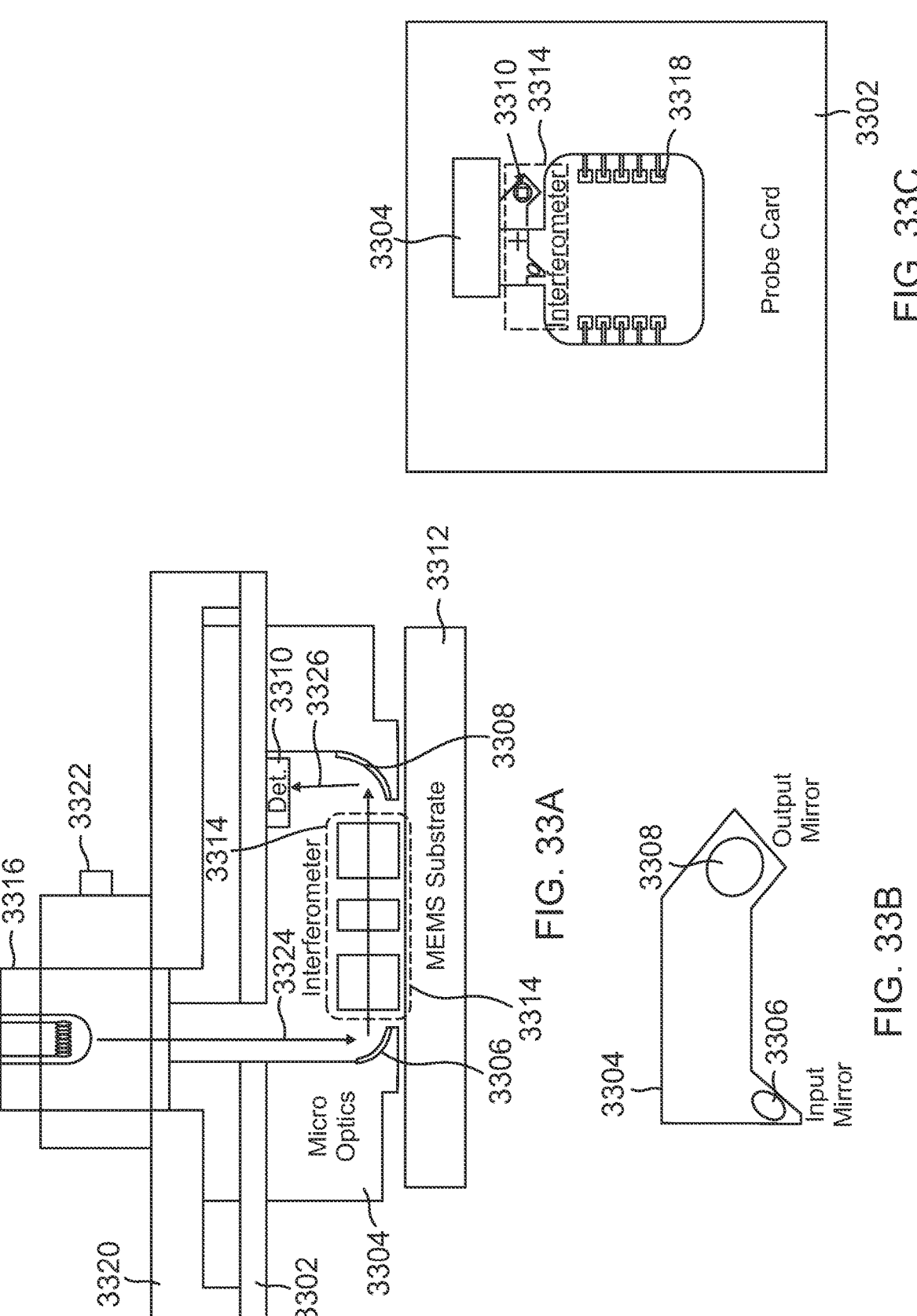
FIGS. 33A-33C are diagrams illustrating a probe card platform configured for wafer-level testing of optical micro-electro-mechanical systems (MEMS) structures using free-space optics according to some aspects.

FIGS. 33A-33C are diagrams illustrating a probe card platform configured for wafer-level testing of optical micro-electro-mechanical systems (MEMS) structures using free-space optics according to some aspects. The probe card platform 3300 includes an electrical probe card 3302 (e.g., a PCB), an optical head including a free-space micro-optics component 3304 and a light source 3316, an optional optical alignment stage 3320 and an optional optical positioner 3322. Other components, such as a camera (not shown), may also be included on the probe card platform 3300. The electrical probe card 3302 includes a plurality of electrical needles (probes) for facilitating an electrical connection with an optical MEMS structure 3314 (e.g., a MEMS interferometer) on a die (e.g., MEMS substrate 3312) during testing thereof. In addition, the electrical probe card 3302 may further include a plurality of alignment needles (probes) 3320 used to align the electrical probe card 3302 with corresponding alignment marks/fiducials on the optical MEMS structure 3314 under test. The electrical probe card 3302 may further include control and detection electronics, including, for example, a photodetector 3310 configured to receive output light from the optical MEMS structure under test.

The micro-optics component 3304 may include, for example, two curved mirrors (e.g., an input curved mirror 3306 and an output curved mirror 3308). The input curved mirror 3306 may be configured to receive input light 3324 propagating in an out-of-plane direction with respect to the MEMS substrate 3312 of the optical MEMS structure 3314 and to redirect the input light 3324 to propagate in an in-plane direction with respect to the substrate 3312 towards the optical MEMS structure 3314. The output curved mirror 3308 may be configured to receive output light 3326 from the MEMS structure 3314 propagating in the in-plane direction and to redirect the output light 3326 to propagate in the out-of-plane direction towards the detector 3310 on the electrical probe card 3302.

The optical alignment stage 3320 may be attached to the electrical probe card 3302. In addition, the optical positioner 3322 may be attached to the optical alignment stage 3320, such that the optical alignment stage 3320 supports the optical positioner 3322 above the electrical probe card 3302. The optical positioner 3322 may be configured to align the optical head (e.g., light source 3316 and micro-optics 3304) with at least one of the plurality of alignment needles or an optical input of an optical MEMS structure 3314 (for example, using a camera on the probe card platform 3300 for fine alignment/adjustment). The optical positioner 3322 may be configured to be manually adjusted for manual alignment of the optical head with the optical MEMS structure or may be automatically adjusted for automatic alignment of the optical head with the optical MEMS structure. In some examples, the micro-optics component 3304 can be coarsely aligned to the MEMS structure 3314 using a prober backside camera (not shown), for example, using a backside cross-mark fiducial (not shown). In some examples, the micro-optics component 3304 may also be initially aligned during first assembly using an external backside camera using reference alignment needles. In some examples, the optical alignment stage 3320 and optical positioner 3322 are not included. In this example, alignment of the optical head may be coarsely performed and screws may be used for attachment of the micro-optics component 3304 to the electrical probe card 3302.

Figure 34:
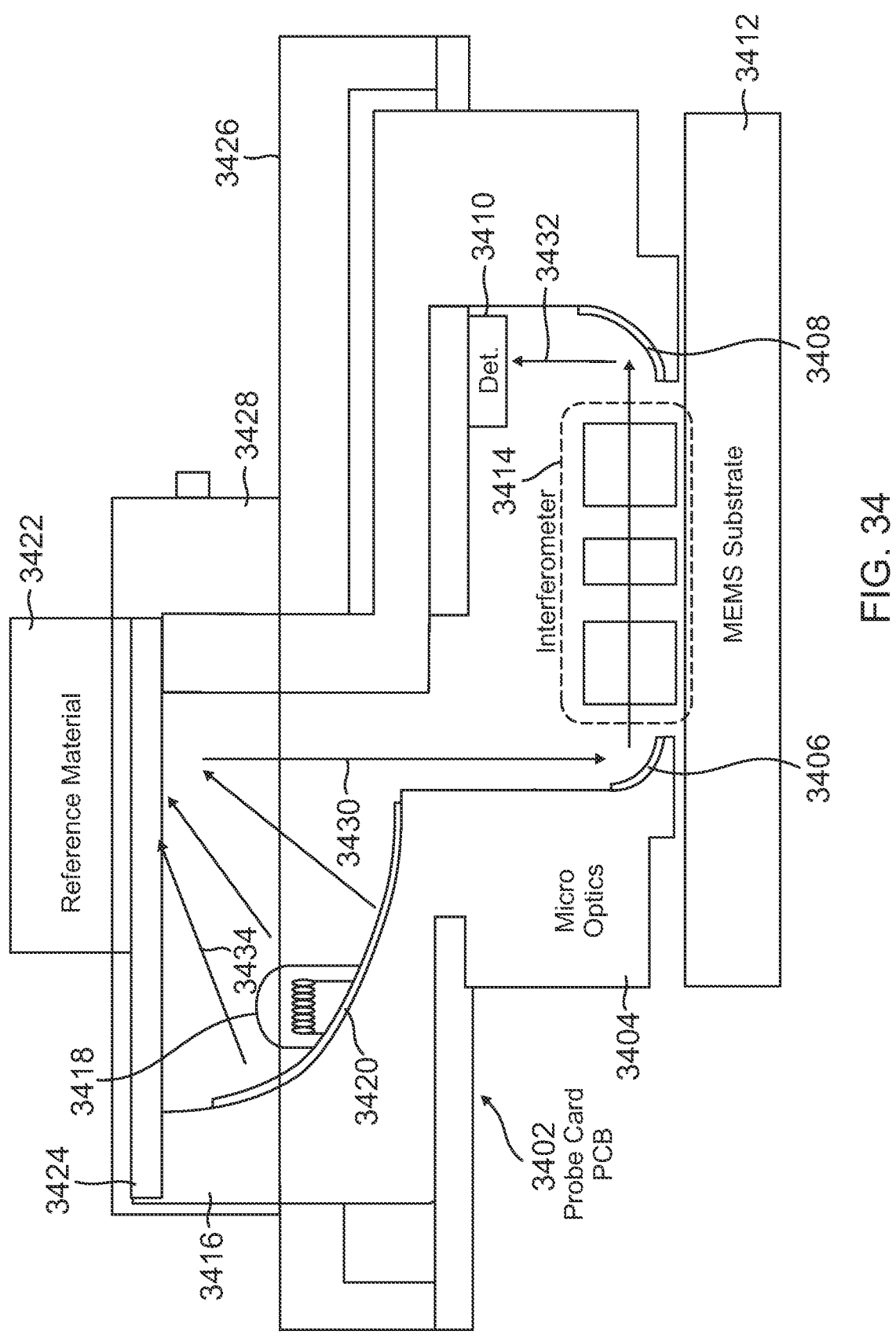
FIG. 34 is a diagram illustrating another probe card platform configured for wafer-level testing of optical micro-electro-mechanical systems (MEMS) structures using free-space optics according to some aspects.

FIG. 34 is a diagram illustrating another probe card platform configured for wafer-level testing of optical micro-electro-mechanical systems (MEMS) structures using free-space optics according to some aspects. The probe card platform 3400 includes an electrical probe card 3402 (e.g., a PCB), an optical head including a light source head 3416 having a light source 3418 therein and a free-space micro-optics component 3404, an optional optical alignment stage 3426 and an optional optical positioner 3428. Other components, such as a camera (not shown), may also be included on the probe card platform 3400. The electrical probe card 3402 includes a plurality of electrical needles (probes) for facilitating an electrical connection with an optical MEMS structure 3414 (e.g., a MEMS interferometer) on a die (e.g., MEMS substrate 3412) during testing thereof. In addition, the electrical probe card 3402 may further include a plurality of alignment needles (probes) used to align the electrical probe card 3402 with corresponding alignment marks/fiducials on the optical MEMS structure 3414 under test. The electrical probe card 3402 may further include control and detection electronics, including, for example, a photodetector 3410 configured to receive output light from the optical MEMS structure under test.

The micro-optics component 3404 may include, for example, two curved mirrors (e.g., an input curved mirror 3406 and an output curved mirror 3408). The input curved mirror 3406 may be configured to receive input light 3430 propagating in an out-of-plane direction with respect to the MEMS substrate 3412 of the optical MEMS structure 3414 and to redirect the input light 3430 to propagate in an in-plane direction with respect to the substrate 3412 towards the optical MEMS structure 3414. The output curved mirror 3408 may be configured to receive output light 3432 from the MEMS structure 3414 propagating in the in-plane direction and to redirect the output light 3432 to propagate in the out-of-plane direction towards the detector 3410 on the electrical probe card 3402. The configuration shown in FIG. 34 is a two-port transmission configuration through the MEMS interferometer 3414.

The light source head 3416 may further include a curved reflector 3420 surrounding the light source 3418 configured to produce an input beam 3434. The curved reflector 3420 may be configured to focus the input beam 3434 onto a reference diffuse reflection material 3422 (e.g., PTFE, ceramic, Polystyrene, rare earth oxide powder, skin phantom surrogate, etc.) through a window 3424 (e.g., a glass window) on the light source head 3416. Reflected light from the reference diffuse reflection material 3422 forms the input light 3430 directed towards the input curved mirror 3406.

The optical alignment stage 3426 may be attached to the electrical probe card 3402. In addition, the optical positioner 3428 may be attached to the optical alignment stage 3426, such that the optical alignment stage 3426 supports the optical positioner 3428 above the electrical probe card 3402. The optical positioner 3428 may be configured to align the optical head (e.g., light source 3416 and micro-optics 3404) with at least one of the plurality of alignment needles or an optical input of an optical MEMS structure 3414 (for example, using a camera on the probe card platform 3400 for fine alignment/adjustment). The optical positioner 3428 may be configured to be manually adjusted for manual alignment of the optical head with the optical MEMS structure or may be automatically adjusted for automatic alignment of the optical head with the optical MEMS structure. In some examples, the micro-optics component 3404 can be coarsely aligned to the MEMS structure 3414 using a prober backside camera (not shown), for example, using a backside cross-mark fiducial (not shown). In some examples, the micro-optics component 3404 may also be initially aligned during first assembly using an external backside camera using reference alignment needles. In some examples, the optical alignment stage 3426 and optical positioner 3428 are not included. In this example, alignment of the optical head may be coarsely performed and screws may be used for attachment of the micro-optics component 3404 to the electrical probe card 3402.

Figure 35:
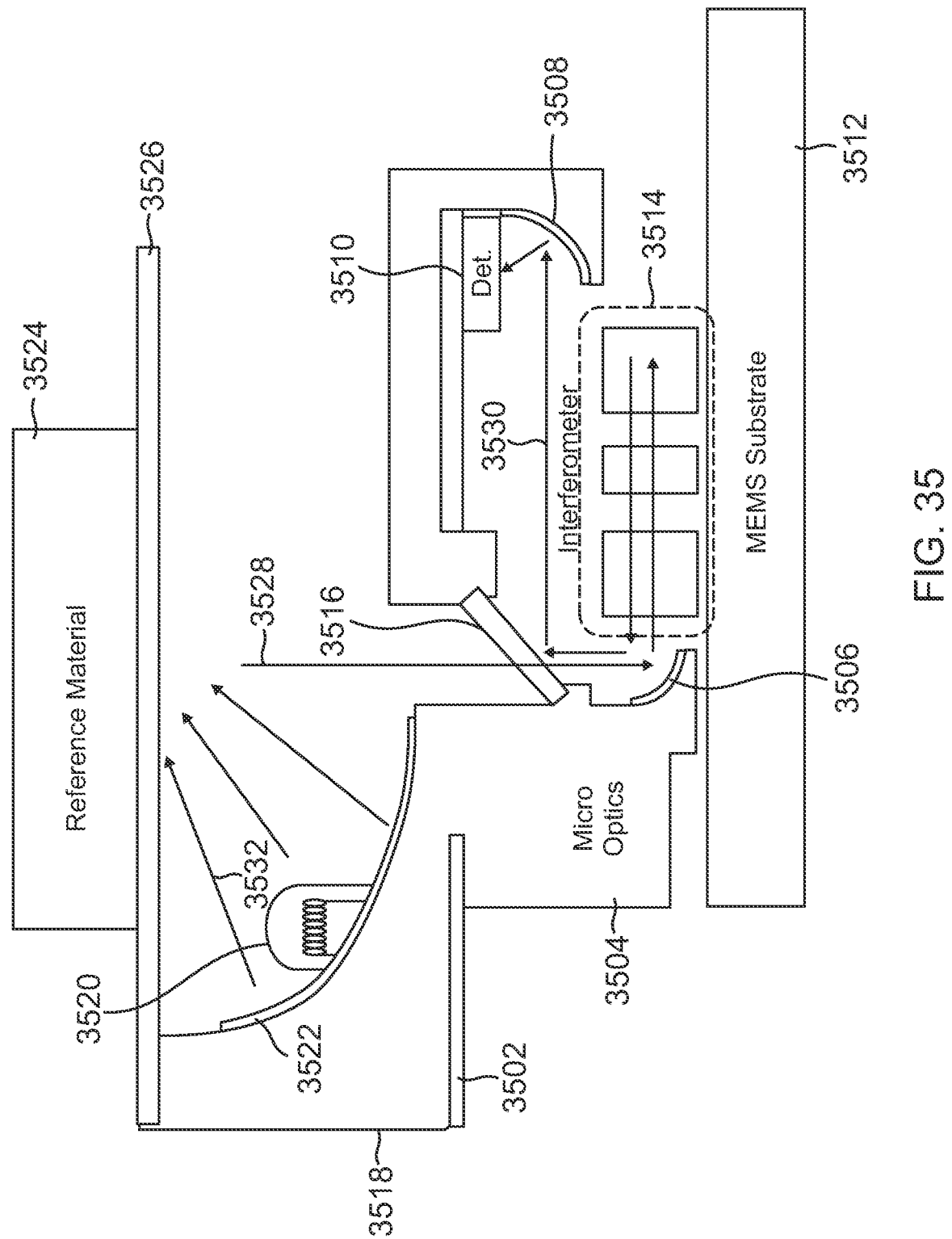
FIG. 35 is a diagram illustrating another probe card platform configured for wafer-level testing of optical micro-electro-mechanical systems (MEMS) structures using free-space optics according to some aspects.

FIG. 35 is a diagram illustrating another probe card platform configured for wafer-level testing of optical micro-electro-mechanical systems (MEMS) structures using free-space optics according to some aspects. The probe card platform 3500 includes an electrical probe card 3502 (e.g., a PCB), an optical head including a light source head 3518 having a light source 3520 therein and a free-space micro-optics component 3504. Other components, such as a camera (not shown), optical alignment stage (not shown), and optical positioner (not shown), may also be included on the probe card platform 3500. The electrical probe card 3502 includes a plurality of electrical needles (probes) for facilitating an electrical connection with an optical MEMS structure 3514 (e.g., a MEMS interferometer) on a die (e.g., MEMS substrate 3512) during testing thereof. In addition, the electrical probe card 3502 may further include a plurality of alignment needles (probes) used to align the electrical probe card 3502 with corresponding alignment marks/fiducials on the optical MEMS structure 3514 under test. The electrical probe card 3502 may further include control and detection electronics, including, for example, a photodetector 3510 configured to receive output light from the optical MEMS structure under test.

The micro-optics component 3504 may include, for example, two curved mirrors (e.g., an input curved mirror 3506 and an output curved mirror 3508) and a beam splitter 3516. The input curved mirror 3506 may be configured to receive input light 3528 via the beam splitter 3516 propagating in an out-of-plane direction with respect to the MEMS substrate 3512 of the optical MEMS structure 3514 and to redirect the input light 3528 to propagate in an in-plane direction with respect to the substrate 3512 towards the optical MEMS structure 3514. Output light 3530 from the optical MEMS structure 3514 corresponds to an interference signal produced by the optical MEMS structure 3514 based on the input light 3528. The input mirror 3506 may further be configured to receive the interference signal 3530 from the optical MEMS structure 3514 and to redirect (reflect) the interference signal towards the beam splitter 3516. The beam splitter 3516 is further configured to direct the interference signal 3530 towards the output curved mirror 3508. The output curved mirror 3408 may be configured to receive the interference signal 3530 propagating in the in-plane direction and to redirect the interference signal 3530 to propagate in the out-of-plane direction towards the detector 3510 on the electrical probe card 3502. The configuration shown in FIG. 35 is a one-port reflection from the MEMS interferometer 3514 using the beam splitter 3516 integrated with the micro-optics component 3504 to direct the reflected interference signal 3530 to the photodetector 3510 on the electrical probe card 3502.

The light source head 3518 may further include a curved reflector 3522 surrounding the light source 3520 configured to produce an input beam 3532. The curved reflector 3522 may be configured to focus the input beam 3532 onto a reference diffuse reflection material 3524 through a window 3526 (e.g., a glass window) on the light source head 3518. Reflected light from the reference diffuse reflection material 3524 forms the input light 3528 directed towards the input curved mirror 3506 via the beam splitter 3516.

Figure 36:
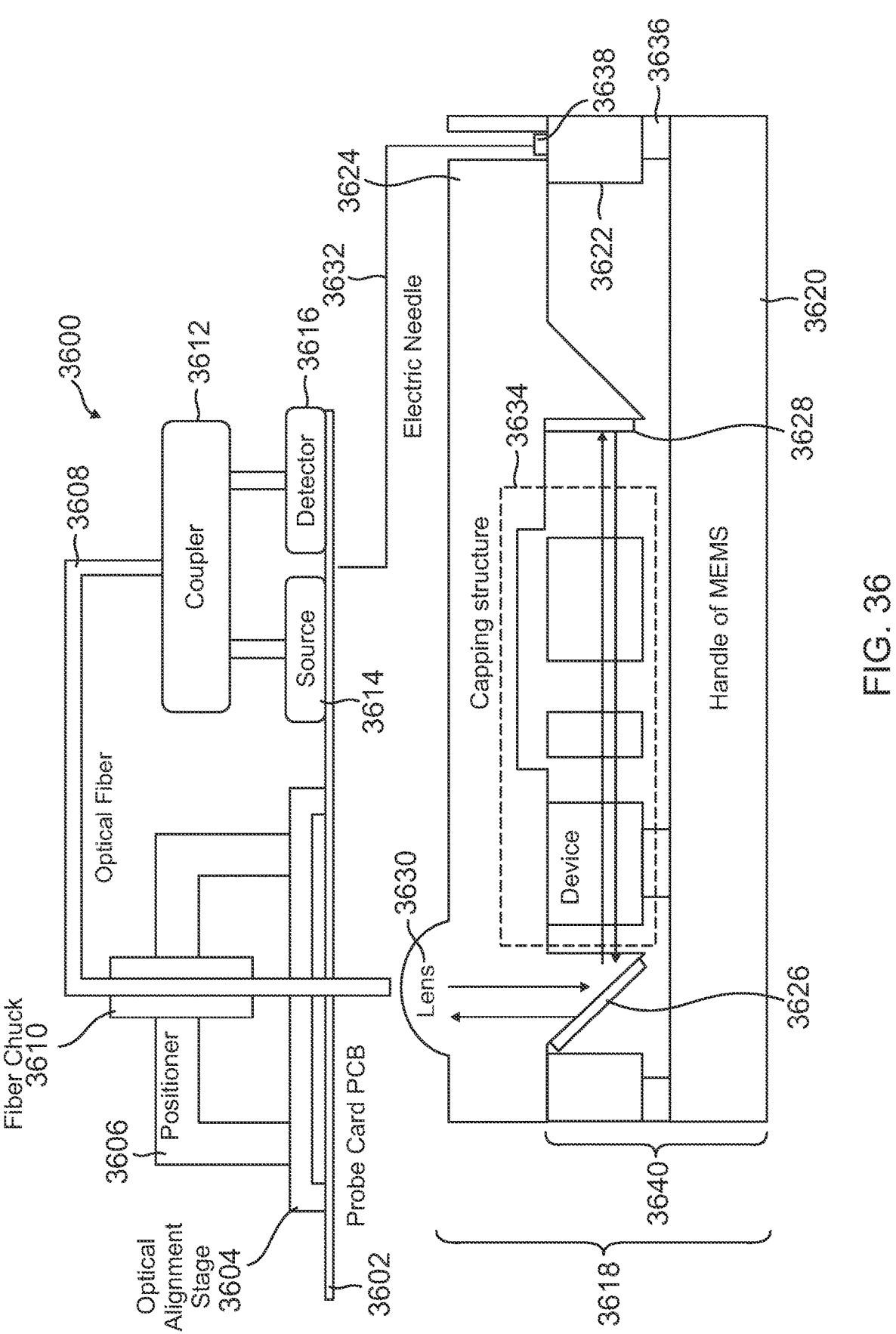
FIG. 36 is a diagram illustrating an example of another apparatus configured for wafer-level testing of optical MEMS structures according to some aspects of the disclosure.

FIG. 36 is a diagram illustrating an example of another apparatus configured for wafer-level testing of optical MEMS structures according to some aspects of the disclosure. The apparatus 3600 includes at least an electrical probe card (e.g., probe card printed circuit board (PCB)) 3602, an optical alignment stage 3604, an optical positioner 3606, and an optical fiber 3608. The probe card PCB 3602 includes the alignment needles/probes and the electrical needles/probes, as described above. For example, the probe card PCB 3602 may include electrical needles 3632 connected to MEMS electrodes 3638 on a MEMS die 3618.

The optical alignment stage 3604 is attached to the electrical probe card 3602 and is configured to support the opto-mechanical components of the optical positioner 3606 above the electrical probe card 3602 and to connect the optical positioner 3606 to the probe card PCB 3602. The optical positioner 3606 is configured to hold the optical fiber 3608 and enable coarse/fine adjustment of the fiber position with respect to an optical MEMS structure 3634 under test. The apparatus 3600 further includes a fiber chuck 3610 acting as a mechanical interface for the optical fiber 3608. The fiber chuck 3610 is configured to fix the optical fiber 3608 rigidly in place, connect the optical fiber 3608 to the optical positioner 3606, and to protect the optical fiber 3608 from damage. The optical fiber 3608 (e.g., a long patch cord of a two-part optical fiber) may be coupled to a light source 3614 and a detector 3616 on the electrical probe card 3602 via an optical coupler 3612.

The optical MEMS structure 3634 may be fabricated on a substrate 3640 (e.g., SOI wafer including a handle layer 3620, a device layer 3622, and a dielectric layer 3636 between the handle layer 3620 and the device layer 3622) of the die 3618. For example, the optical MEMS structure 3634 may be fabricated in the device layer 3622 of the substrate 3640. A capping structure 3624 may be positioned on the device layer 3622 and used to direct the light from the optical fiber 3608 to the optical MEMS structure 3634. For example, the capping structure 3624 may include a first reflector 3626 (e.g., a 45 degree inclined mirror) configured to receive input light via a lens 3630 from the light source 3614. The input light may be directed to the first reflector 3626 via the optical coupler 3612 and optical fiber 3608. The input light may be propagating in an out-of-plane direction with respect to the substrate 3640 of the optical MEMS structure 3634. The first reflector 3626 may be configured to redirect the input light to propagate in an in-plane direction with respect to the substrate 3640 towards the optical MEMS structure 3634. The capping structure 3624 may further include a second reflector 3628 (e.g., a vertical mirror) configured to receive output light from the optical MEMS structure 3634 and to reflect the output light back towards the first reflector 3626 for redirection of the output light to propagate in an out-of-plane direction towards the optical fiber 3608. The optical fiber 3608 may provide the output light to the detector 3616 via the optical coupler 3612.

Figure 37:
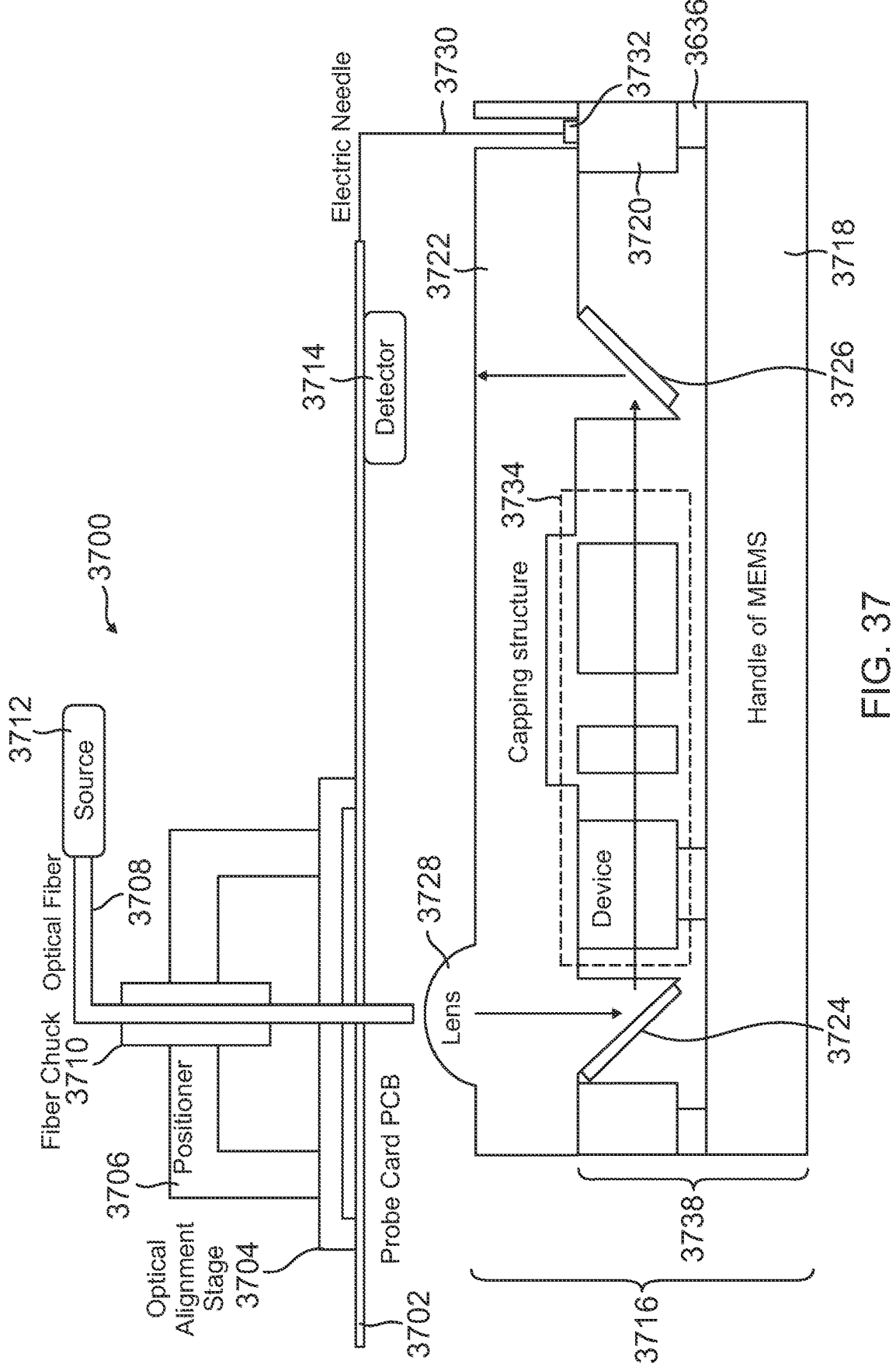
FIG. 37 is a diagram illustrating an example of another apparatus configured for wafer-level testing of optical MEMS structures according to some aspects of the disclosure.

FIG. 37 is a diagram illustrating an example of another apparatus configured for wafer-level testing of optical MEMS structures according to some aspects of the disclosure. The apparatus 3700 includes at least an electrical probe card (e.g., probe card printed circuit board (PCB)) 3702, an optical alignment stage 3704, an optical positioner 3706, and an optical fiber 3708. The probe card PCB 3702 includes the alignment needles/probes and the electrical needles/probes, as described above. For example, the probe card PCB 3702 may include electrical needles 3730 connected to MEMS electrodes 3732 on a MEMS die 3716.

The optical alignment stage 3704 is attached to the electrical probe card 3702 and is configured to support the opto-mechanical components of the optical positioner 3706 above the electrical probe card 3702 and to connect the optical positioner 3706 to the probe card PCB 3702. The optical positioner 3706 is configured to hold the optical fiber 3708 and enable coarse/fine adjustment of the fiber position with respect to an optical MEMS structure 3734 under test. The apparatus 3700 further includes a fiber chuck 3710 acting as a mechanical interface for the optical fiber 3708. The fiber chuck 3710 is configured to fix the optical fiber 3708 rigidly in place, connect the optical fiber 3708 to the optical positioner 3706, and to protect the optical fiber 3708 from damage. The optical fiber 3708 (e.g., a long patch cord of a two-part optical fiber) may be coupled to a light source 3712. In addition, the electrical probe card 3702 may include a backside photodetector 3714.

The optical MEMS structure 3734 may be fabricated on a substrate 3738 (e.g., SOI wafer including a handle layer 3718, a device layer 3720, and a dielectric layer 3736 between the handle layer 3718 and the device layer 3720) of the die 3716. For example, the optical MEMS structure 3734 may be fabricated in the device layer 3720 of the substrate 3738. A capping structure 3722 may be positioned on the device layer 3720 and used to direct the light from the optical fiber 3708 to the optical MEMS structure 3734. For example, the capping structure 3722 may include a first reflector 3724 (e.g., a 45 degree inclined mirror) configured to receive input light via a lens 3728 from the light source 3712. The input light may be directed to the first reflector 3724 via the optical fiber 3708. The input light may be propagating in an out-of-plane direction with respect to the substrate 3738 of the optical MEMS structure 3734. The first reflector 3724 may be configured to redirect the input light to propagate in an in-plane direction with respect to the substrate 3738 towards the optical MEMS structure 3734. The capping structure 3722 may further include a second reflector 3726 (e.g., a 45 degree inclined mirror) configured to receive output light from the optical MEMS structure 3734 and to reflect the output light to propagate in an out-of-plane direction towards the detector 3714 on the electrical probe card 3702.

Figure 38:
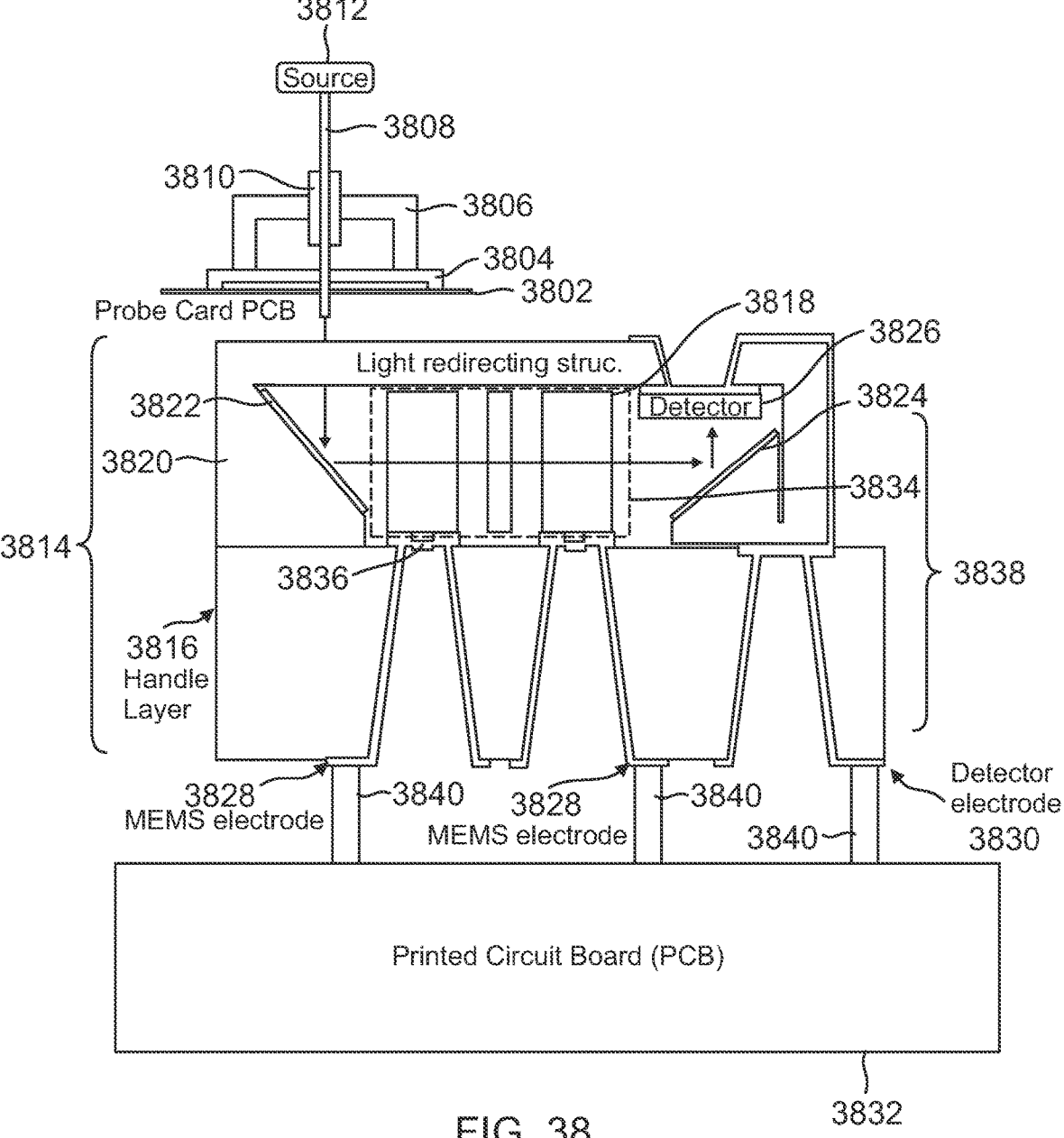
FIG. 38 is a diagram illustrating an example of another apparatus configured for wafer-level testing of optical MEMS structures according to some aspects of the disclosure.

FIG. 38 is a diagram illustrating an example of another apparatus configured for wafer-level testing of optical MEMS structures according to some aspects of the disclosure. The apparatus 3800 includes at least an electrical probe card (e.g., probe card printed circuit board (PCB)) 3802, an optical alignment stage 3804, an optical positioner 3806, and an optical fiber 3808. The probe card PCB 3802 includes the alignment needles/probes, as described above.

The optical alignment stage 3804 is attached to the electrical probe card 3802 and is configured to support the opto-mechanical components of the optical positioner 3806 above the electrical probe card 3802 and to connect the optical positioner 3806 to the probe card PCB 3802. The optical positioner 3806 is configured to hold the optical fiber 3808 and enable coarse/fine adjustment of the fiber position with respect to an optical MEMS structure 3834 of an optical MEMS die 3814 under test. The apparatus 3800 further includes a fiber chuck 3810 acting as a mechanical interface for the optical fiber 3808. The fiber chuck 3810 is configured to fix the optical fiber 3808 rigidly in place, connect the optical fiber 3808 to the optical positioner 3806, and to protect the optical fiber 3808 from damage. The optical fiber 3808 (e.g., a long patch cord of a two-part optical fiber) may be coupled to a light source 3812.

The optical MEMS structure 3834 may be fabricated on a substrate 3838 (e.g., SOI wafer including a handle layer 3816, a device layer 3818, and a dielectric layer 3836 between the handle layer 3816 and the device layer 3818) of the die 3814. For example, the optical MEMS structure 3834 may be fabricated in the device layer 3818 of the substrate 3838. A capping structure (light redirecting structure) 3820 may be positioned on the device layer 3818 and used to direct the light from the optical fiber 3808 to the optical MEMS structure 3834. For example, the capping structure 3820 may include a first reflector 3822 (e.g., a 45 degree inclined mirror) configured to receive input light from the light source 3812. The input light may be directed to the first reflector 3822 via the optical fiber 3808. The input light may be propagating in an out-of-plane direction with respect to the substrate 3838 of the optical MEMS structure 3834. The first reflector 3822 may be configured to redirect the input light to propagate in an in-plane direction with respect to the substrate 3838 towards the optical MEMS structure 3834. The capping structure 3820 may further include a second reflector 3824 (e.g., a 45 degree inclined mirror) configured to receive output light from the optical MEMS structure 3834 and to reflect the output light to propagate in an out-of-plane direction towards a detector 3826 on the capping structure 3820.

A PCB 3832 may be attached to the backside of the substrate 3838 to provide electrical connections between the PCB 3832 and both MEMS electrodes 3828 and detector electrodes 3830 from the bottom of the handle layer 3816. For example, the PCB 3832 may include pins 3840 connected to the electrodes 3828 and 3830 underneath the handle layer 3816. The PCB 3832 may be coupled, for example, to a computing device executing prober (testing) software.

Figure 39:
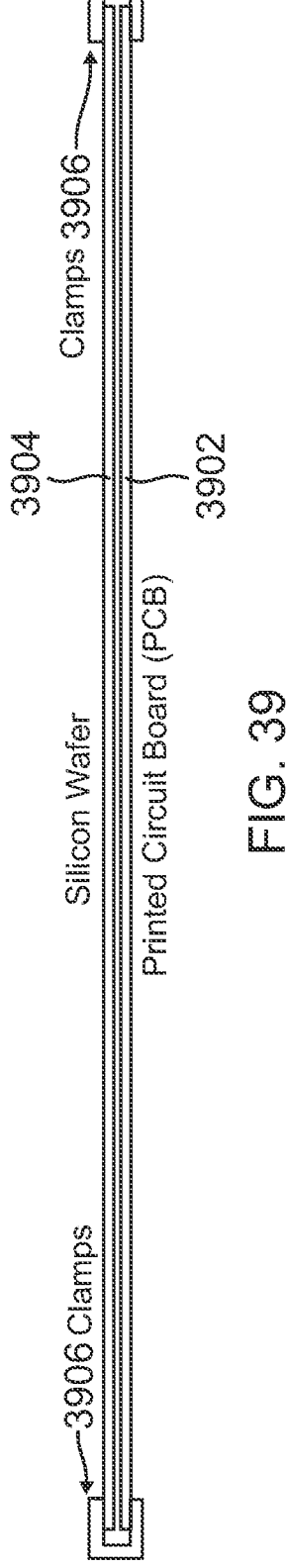
FIG. 39 is a diagram illustrating an example configuration of the PCB and MEMS die shown in FIG. 38 according to some aspects.

FIG. 39 is a diagram illustrating an example configuration of the PCB and MEMS die shown in FIG. 38 according to some aspects. In the example shown in FIG. 39, a MEMS die (silicon wafer) 3904, which may correspond to the MEMS die 3814 shown in FIG. 38, may be aligned and clamped to a PCB 3902, which may correspond to the PCB 3832 of FIG. 38, using clamps 3906.

Figure 40:
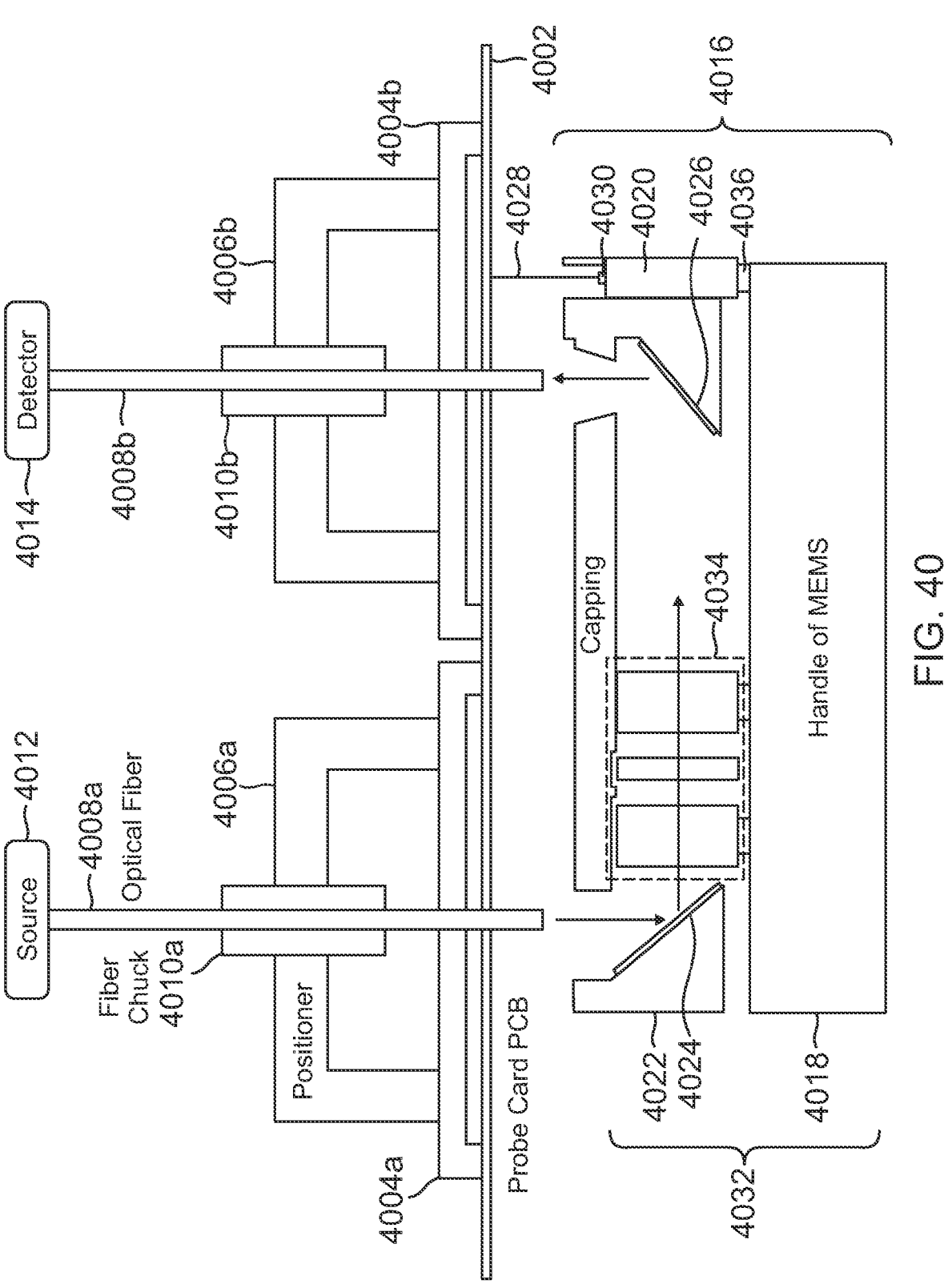
FIG. 40 is a diagram illustrating an example of another apparatus configured for wafer-level testing of optical MEMS structures according to some aspects of the disclosure.

FIG. 40 is a diagram illustrating an example of another apparatus configured for wafer-level testing of optical MEMS structures according to some aspects of the disclosure. The apparatus 4000 includes an electrical probe card (e.g., probe card printed circuit board (PCB)) 4002 and a two-fiber optical structure including optical alignment stages 4004a and 4004b, an optical positioners 4006a and 4006b, and optical fibers 4008a and 4008b. The probe card PCB 4002 includes the alignment needles/probes and the electrical needles/probes, as described above. For example, the probe card PCB 4002 may include electrical needles 4028 connected to MEMS electrodes 4030 on a MEMS die 4016.

The optical alignment stages 4004a and 4004b are attached to the electrical probe card 4002 and is configured to support the opto-mechanical components of the optical positioners 4006a and 4006b above the electrical probe card 4002 and to connect the optical positioners 4006a and 4006b to the probe card PCB 4002. The optical positioners 4006a and 4006b are configured to hold the respective optical fibers 4008a and 4008b and enable coarse/fine adjustment of the fiber positions with respect to an optical MEMS structure 4034 under test. The apparatus 4000 further includes fiber chucks 4010a and 4010b acting as mechanical interfaces for the respective optical fibers 4008a and 4008b. The optical fiber 4008a (e.g., a long patch cord of a two-part optical fiber) may be coupled to a light source 4012. In addition, the optical fiber 4008b (e.g., a long patch cord of a two-part optical fiber) may be coupled to a detector 4014.

The optical MEMS structure 4034 may be fabricated on a substrate 4032 (e.g., SOI wafer including a handle layer 4018, a device layer 4020, and a dielectric layer 4036 between the handle layer 4018 and the device layer 4020) of the die 4016. For example, the optical MEMS structure 4034 may be fabricated in the device layer 4020 of the substrate 4038. A capping structure 4022 may be positioned on the device layer 4020 and used to direct the light from the optical fiber 4008a to the optical MEMS structure 4034. For example, the capping structure 4022 may include a first reflector 4024 (e.g., a 45 degree inclined mirror) configured to receive input light from the light source 4012. The input light may be directed to the first reflector 4024 via the optical fiber 4008*a*. The input light may be propagating in an out-of-plane direction with respect to the substrate 4032 of the optical MEMS structure 4034. The first reflector 4024 may be configured to redirect the input light to propagate in an in-plane direction with respect to the substrate 4032 towards the optical MEMS structure 4034. The capping structure 4022 may further include a second reflector 4026 (e.g., a 45 degree inclined mirror) configured to receive output light from the optical MEMS structure 4034 and to reflect the output light to propagate in an out-of-plane direction towards the detector 4014 via optical fiber 4008*b*.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-40 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-40 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. An apparatus, comprising:
   an electrical probe card comprising a plurality of alignment needles configured to align the electrical probe card with an optical micro-electro-mechanical systems (MEMS) structure on a wafer during testing of the optical MEMS structure, the electrical probe card further comprising a plurality of electrical needles configured to test the optical MEMS structure;
   an optical head configured to direct input light towards the optical MEMS structure through the electrical probe card;
   an optical positioner attached to the electrical probe card and configured to align the optical head with an optical input of the optical MEMS structure;
   an optical alignment stage attached to the electrical probe card, the optical alignment stage comprising a positioner holder attached to the optical positioner configured to support the optical positioner above the electrical probe card;
   a camera configured to obtain at least one image indicating a current alignment of the optical head with the plurality of alignment needles or the optical input of the optical MEMS structure; and
   a processor configured to process the at least one image and generate alignment assistance data to assist in alignment of the optical head using the optical positioner.

2. The apparatus of claim 1, further comprising:
   an optical coupler configured to couple the input light from a light source to the optical head.

3. The apparatus of claim 2, wherein the electrical probe card further comprises a detector, and wherein the optical coupler is further configured to couple output light from the optical MEMS structure and received via the optical head to the detector.

4. The apparatus of claim 1, wherein the processor is further configured to receive a measured signal based on output light produced by interaction of the input light with the optical MEMS structure and to process the measured signal and the at least one image to produce the alignment assistance data.

5. The apparatus of claim 1, wherein the optical positioner is moveable along at least four axes.

6. The apparatus of claim 1, wherein the processor is further configured to receive a measured signal based on output light produced by interaction of the input light with the optical MEMS structure and to process the measured signal to calibrate the optical MEMS structure.

7. The apparatus of claim 1, further comprising:

an artificial intelligence engine configured to discern a pass/fail status of the optical MEMS structure and other optical MEMS structures on the wafer based on a machine learning model.

8. The apparatus of claim 1, wherein the camera is mounted on the optical alignment stage, the camera configured to enable fine alignment of the optical head with the optical input of the optical MEMS structure.

9. The apparatus of claim 1, further comprising:

a prober device comprising a wafer chuck configured to fix the wafer during testing thereof, the electrical probe card being attached to the prober device.

10. The apparatus of claim 9, wherein the prober device further comprises the camera, the camera configured to enable coarse alignment of the optical head with the plurality of alignment needles.

11. The apparatus of claim 9, wherein the processor is further configured to control the electrical probe card and the prober device to automate testing of the optical MEMS structure.

12. The apparatus of claim 1, wherein the optical head comprises an optical fiber.

13. The apparatus of claim 12, wherein the optical fiber comprises a short pigtail fiber mounted on the optical positioner and configured to direct the input light to the optical MEMS structure, the optical fiber further comprising a detachable long patch cord configured to direct the input light from an external light source to the short pigtail fiber.

14. The apparatus of claim 13, further comprising:

a fiber chuck configured to mount the short pigtail fiber on the optical positioner; and a fiber-optic connector coupled to the fiber chuck and configured to connect the short pigtail fiber with the detachable long patch cord.

15. The apparatus of claim 14, wherein the short pigtail fiber comprises a fiber tip that is cleaved at an angle, a cleaved side of the fiber tip being gold-coated.

16. The apparatus of claim 14, further comprising:

a plastic cover assembled with the short pigtail fiber and configured to protect the short pigtail fiber during insertion in the fiber chuck; and a mating sleeve assembled with the fiber chuck and configured to couple the short pigtail fiber with the detachable long patch cord, wherein the fiber chuck comprises one of:

an opening on first end thereof and an end cap on a second end thereof opposite the first end and is configured to facilitate insertion of the short pigtail fiber from the first end through the second end and to secure the short pigtail fiber via rotation of the end cap, or an opening along a side thereof configured to receive the short pigtail fiber, the fiber chuck further comprising a spring configured to secure the short pigtail fiber.

17. The apparatus of claim 12, further comprising:

a positioner controller coupled to the processor to receive the alignment assistance data and configured to control the optical positioner to move the optical fiber for alignment of the optical fiber with the optical input of the optical MEMS structure.

18. The apparatus of claim 17, further comprising:

one or more proximity sensors attached to the optical fiber and configured to detect a proximity of the optical fiber to walls of the optical MEMS structure and to transmit an alarm to the processor in response to the proximity being less than a distance, wherein the positioner controller is configured to return the optical fiber to a default fiber position in response to receiving the alarm.

19. The apparatus of claim 12, wherein the optical positioner is configured to align the optical fiber with the optical input of the optical MEMS structure based on respective distances between the optical fiber and the plurality of alignment needles aligned with respective alignment marks on the optical MEMS structure, and wherein the processor is configured to calculate the respective distances based on the at least one image.

20. The apparatus of claim 12, wherein the optical fiber comprises a cleaved fiber tip producing a light arc and the processor is configured to detect an angle of orientation of the optical fiber with respect to the plurality of alignment needles based on the at least one image of the light arc, the optical positioner being configured to adjust a rotation angle of the optical fiber to a target rotation angle based on the detected angle of orientation.

21. The apparatus of claim 12, wherein the at least one image captured by the camera comprises a backside image of the electrical probe card and the processor is further configured to generate the alignment assistance data based on the backside image to assist the optical positioner in positioning the optical fiber at a target position with respect to the plurality of alignment needles.

22. The apparatus of claim 12, wherein the optical positioner is configured to align the optical fiber with the optical input of the optical MEMS structure based on respective distances between the optical fiber and dummy lines on the optical MEMS structure, and wherein the processor is configured to calculate the respective distances based on the at least one image.

23. The apparatus of claim 12, wherein the optical fiber comprises a fiber stopper attached to a tip of the optical fiber, the fiber stopper comprising an alignment cross mark.

24. The apparatus of claim 12, further comprising:

at least one vibration isolator coupled between the optical alignment stage and the electrical probe card.

25. The apparatus of claim 1, wherein the optical head is configured to couple the input light to the optical MEMS structure for propagation within the optical MEMS structure in an in-plane direction that is in-plane with a substrate of the optical MEMS structure or for propagation in an out-of-plane direction that is out-of-plane with the substrate of the optical MEMS structure.

26. The apparatus of claim 1, wherein the optical head comprises free-space micro-optics.

27. The apparatus of claim 26, wherein the free-space micro-optics comprises:

an input curved mirror configured to receive the input light propagating in an out-of-plane direction with respect to a substrate of the optical MEMS structure and to redirect the input light to propagate in an in-plane direction with respect to the substrate towards the optical MEMS structure; and an output curved mirror configured to receive output light from the optical MEMS structure propagating in the in-plane direction and to redirect the output light to propagate in the out-of-plane direction towards a detector.

28. The apparatus of claim 27, wherein the optical head further comprises:

a light source head comprising a light source, and a curved reflector surrounding the light source configured to produce an input beam, the curved reflector being configured to focus the input beam onto a reference diffuse reflection material, and wherein reflected light from the reference diffuse reflection material forming the input light directed towards the input curved mirror.

29. The apparatus of claim 27, wherein the output light corresponds to an interference signal produced by the optical MEMS structure based on the input light, the input curved mirror is further configured to receive the interference signal from the optical MEMS structure, and the free-space micro-optics further comprise:

a beam splitter configured to receive the input light and direct the input light towards the input curved mirror, the beam splitter further configured to receive the interference signal reflected from the input curved mirror and to direct the interference signal towards the output curved mirror.

30. The apparatus of claim 1, further comprising:

a capping structure comprising:

a first reflector configured to receive the input light propagating in an out-of-plane direction with respect to a substrate of the optical MEMS structure and to redirect the input light to propagate in an in-plane direction with respect to the substrate towards the optical MEMS structure;

a second reflector configured to receive output light from the optical MEMS structure and to reflect the output light towards a detector.

31. The apparatus of claim 30, wherein the second reflector is configured to redirect the output light back towards the first reflector, the first reflector redirecting the output light to propagate in the out-of-plane direction towards the detector.

32. The apparatus of claim 31, wherein the optical head comprises an optical fiber and further comprising:

an optical coupler configured to direct the input light through the optical fiber towards the first reflector and further configured to receive the output light from the optical fiber and to direct the output light towards the detector on the electrical probe card.

33. The apparatus of claim 30, wherein the optical head comprises a first optical fiber configured to direct the input light towards the first reflector and a second optical fiber configured to direct the output light towards the detector.

34. The apparatus of claim 30, wherein the second reflector is configured to redirect the output light to propagate in the out-of-plane direction towards the detector on the electrical probe card.

35. The apparatus of claim 30, wherein the second reflector is configured to redirect the output light to propagate in the out-of-plane direction towards the detector on the capping structure, and wherein the electrical probe card is clamped to the wafer on a backside thereof.

* * * * *